(12) United States Patent
Hwang et al.

(10) Patent No.: US 12,230,525 B2
(45) Date of Patent: Feb. 18, 2025

(54) MICRO-SEMICONDUCTOR CHIP WETTING ALIGNMENT APPARATUS

(71) Applicant: SAMSUNG ELECTRONICS CO., LTD., Suwon-si (KR)

(72) Inventors: Kyungwook Hwang, Seoul (KR); Hyunjoon Kim, Seoul (KR); Joonyong Park, Suwon-si (KR); Seogwoo Hong, Yongin-si (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 564 days.

(21) Appl. No.: 17/383,012

(22) Filed: Jul. 22, 2021

(65) Prior Publication Data

US 2022/0189810 A1    Jun. 16, 2022

Related U.S. Application Data

(60) Provisional application No. 63/124,425, filed on Dec. 11, 2020.

(30) Foreign Application Priority Data

Feb. 10, 2021    (KR) .......................... 10-2021-0019353

(51) Int. Cl.
*H01L 21/68* (2006.01)
*H01L 21/683* (2006.01)
(Continued)

(52) U.S. Cl.
CPC ........ *H01L 21/681* (2013.01); *H01L 21/6835* (2013.01); *H01L 25/0753* (2013.01); *H01L 33/005* (2013.01)

(58) Field of Classification Search
CPC ........ H01L 21/67–21/67011; H01L 21/67144; H01L 21/6715; H01L 21/67242;
(Continued)

(56) References Cited

U.S. PATENT DOCUMENTS 7,730,610 B2 *   6/2010   Nakagawa .............. H01L 24/95
                                                          29/831
10,276,754 B2 *   4/2019   Sasaki ................... H01L 33/486
(Continued)

FOREIGN PATENT DOCUMENTS

KR    10-2015-0106343 A    9/2015
KR       101620469 B1       5/2016
(Continued)

OTHER PUBLICATIONS

Communication issued Jan. 18, 2022 by the European Patent Office in European Patent Application No. 21183999.8.
(Continued)

*Primary Examiner* — Steven M Christopher
*Assistant Examiner* — Tyler J Wiegand
(74) *Attorney, Agent, or Firm* — Sughrue Mion, PLLC

(57) ABSTRACT

A micro-semiconductor chip wet alignment apparatus is provided. The micro-semiconductor chip wet alignment apparatus includes a semiconductor chip wet supply module configured to supply the plurality of micro-semiconductor chips and a liquid onto the transfer substrate so that the plurality of micro-semiconductor chips are flowable on the transfer substrate; and a chip alignment module including an absorber capable of relative movement along a surface of the transfer substrate and configured to absorb the liquid so that the plurality of micro-semiconductor chips are aligned in the plurality of grooves.

27 Claims, 47 Drawing Sheets

(51) Int. Cl.
    *H01L 25/075*      (2006.01)
    *H01L 33/00*      (2010.01)

(58) Field of Classification Search
    CPC . H01L 21/67259–67265; H01L 21/673; H01L 21/67333; H01L 21/67–68792; H01L 21/68–681; H01L 21/6835; H01L 21/68778; H01L 25/075–0753; H01L 25/10–13; H01L 25/167; H01L 24/95; H01L 2224/95101; H01L 2224/95123; H01L 2224/95143; H01L 2224/95136
    See application file for complete search history.

(56) References Cited

U.S. PATENT DOCUMENTS

| | | | |
|---|---|---|---|
| 10,418,527 B2 | 9/2019 | Sasaki et al. | |
| 2005/0164485 A1* | 7/2005 | Onozawa | H01L 24/95 |
| | | | 257/E21.705 |
| 2006/0249873 A1 | 11/2006 | Smith et al. | |
| 2006/0269689 A1* | 11/2006 | Craig | H05K 13/027 |
| | | | 257/E21.705 |
| 2007/0215273 A1 | 9/2007 | Jacobs | |
| 2009/0015263 A1 | 1/2009 | Nakajima | |
| 2010/0075463 A1 | 3/2010 | Smith et al. | |
| 2015/0262971 A1 | 9/2015 | Sekiya | |
| 2017/0062393 A1 | 3/2017 | Kim | |
| 2019/0172968 A1* | 6/2019 | Yuen | H01L 33/0095 |
| 2019/0296184 A1 | 9/2019 | Ahmed et al. | |
| 2019/0371647 A1 | 12/2019 | Ahn et al. | |
| 2020/0118931 A1 | 4/2020 | Garner et al. | |
| 2020/0184859 A1 | 6/2020 | Park et al. | |
| 2020/0194323 A1* | 6/2020 | Bellman | C03C 17/02 |
| 2020/0279835 A1* | 9/2020 | Sasaki | H01L 33/0095 |
| 2021/0057607 A1* | 2/2021 | Lin | H01L 33/145 |
| 2022/0223754 A1* | 7/2022 | Ahn | H01L 33/38 |
| 2022/0336423 A1* | 10/2022 | Kim | H01L 24/81 |
| 2023/0163007 A1* | 5/2023 | Yang | H01L 21/67144 |
| | | | 257/79 |

FOREIGN PATENT DOCUMENTS

| | | |
|---|---|---|
| KR | 1020170026957 A | 3/2017 |
| KR | 10-2020-0021970 A1 | 3/2020 |

OTHER PUBLICATIONS

Communication issued Nov. 27, 2024 by the Korean Intellectual Property Office in Korean Patent Application No. 10-2021-0019353.

* cited by examiner

1

MICRO-SEMICONDUCTOR CHIP WETTING ALIGNMENT APPARATUS

CROSS-REFERENCE TO RELATED APPLICATIONS

This application is based on and claims the benefit of U.S. Provisional Application No. 63/124,425, filed on Dec. 11, 2020, in the United States Patent and Trademark Office, and is based on and claims priority under 35 U.S.C. § 119 to Korean Patent Application No. 10-2021-0019353, filed on Feb. 10, 2021, in the Korean Intellectual Property Office, the disclosures of which are incorporated herein by reference in their entirety.

BACKGROUND

1. Field

The disclosure relates to a micro-semiconductor chip wet alignment apparatus.

2. Description of the Related Art

Micro-semiconductor chips, for example, for light-emitting diodes (LEDs), have benefits of low power consumption and environment-friendly characteristics. Owing to such benefits, industrial demand for micro-semiconductor chips has increased recently. Moreover, LEDs are applied not only to illumination devices or liquid crystal display (LCD) backlight units, but also to display apparatuses. That is, display apparatuses using a micro-LED chip have been developed. When manufacturing a display apparatus using a micro-LED chip, it is necessary to transfer a micro-LED onto a substrate. A pick and place method is frequently used as a method of transferring a micro-LED. However, a yield rate of the pick and place method decreases when the size of the micro-LED decreases and the size of a display increases.

SUMMARY

Provided is an apparatus for aligning a micro-semiconductor chip in a wet method.

Additional aspects will be set forth in part in the description which follows and, in part, will be apparent from the description, or may be learned by practice of the example embodiments of the disclosure.

According to an aspect of the disclosure, there is provided a micro-semiconductor chip wet alignment apparatus comprising: a semiconductor chip wet supply module configured to supply a plurality of micro-semiconductor chips and a liquid onto a transfer substrate so that the plurality of micro-semiconductor chips are movable along with the liquid on the transfer substrate; and a chip alignment module comprising an absorber configured to be moved along a surface of the transfer substrate and absorb the liquid so that the plurality of micro-semiconductor chips are aligned in a plurality of grooves of the transfer substrate.

The liquid supplied onto the transfer substrate by the semiconductor chip wet supply module may have a convex upper surface.

A first height of the liquid at an edge of the transfer substrate may be lower than a second height of the liquid at a center of the transfer substrate.

The absorber may be further configured to contact the transfer substrate as the absorber moves along the surface of the transfer substrate to pass through the plurality of grooves.

As the absorber moves along the surface of the transfer substrate, a first amount of the liquid present in a first region of the transfer substrate through which the absorber has passed and a second amount of the liquid present in a second region of the transfer substrate before the absorber passes through may be different.

The semiconductor chip wet supply module may further comprise: a liquid supply module configured to supply the liquid; and a chip supply module configured to supply the plurality of micro-semiconductor chips.

The chip supply module may be configured to supply a suspension comprising the plurality of micro-semiconductor chips and the liquid.

The liquid supplied by the liquid supply module and the liquid supplied by the chip supply module may be a same material.

The chip supply module may be further configured to cause the suspension to flow so that the plurality of micro-semiconductor chips are dispersed from the suspension.

The micro-semiconductor chip wet alignment apparatus may further comprise: an inspection module configured to inspect a state of the transfer substrate.

The micro-semiconductor chip wet alignment apparatus may further comprise: a controller configured to control operations of the semiconductor chip wet supply module and the chip alignment module based on a result of the inspection by the inspection module.

The micro-semiconductor chip wet alignment apparatus may further comprise: a cleaning module configured to remove a dummy micro-semiconductor chip remaining on the surface of the transfer substrate.

The cleaning module may comprise a second liquid supply module configured to supply another liquid onto the transfer substrate, and a pressurization module configured to contact and press the transfer substrate and move along the surface of the transfer substrate.

A first pressure applied by the pressurization module to the transfer substrate may be greater than a second pressure applied by the absorber to the transfer substrate.

The micro-semiconductor chip wet alignment apparatus may further comprise: a recovery module configured to recover one or more of the plurality of micro-semiconductor chips separated from the transfer substrate.

The micro-semiconductor chip wet alignment apparatus may further comprise: an antistatic module configured to supply ions onto the transfer substrate to reduce static electricity.

The chip alignment module may comprise a plurality of absorbers arranged along a movement direction of the absorber and the transfer substrate.

The semiconductor chip wet supply module may comprise a plurality of semiconductor chip wet supply modules, wherein the chip alignment module may comprise a plurality of chip alignment modules, and wherein the plurality of semiconductor chip wet supply modules and the plurality of chip alignment modules may be configured to divide the transfer substrate into a plurality of regions and supply and align the plurality of micro-semiconductor chips.

The plurality of micro-semiconductor chips aligned in the plurality of grooves of the transfer substrate are transferred onto a substrate may be different from the transfer substrate.

Each of the transfer substrate and the substrate may comprise an alignment mark for aligning the transfer substrate and the substrate.

According to another aspect of the disclosure, there is provided a micro-semiconductor chip wet alignment method comprising: supplying a plurality of micro-semiconductor chips and a liquid onto a transfer substrate so that the plurality of micro-semiconductor chips are movable along with the liquid on the transfer substrate; and moving an absorber along a surface of the transfer substrate, the absorber configured to absorb the liquid so that the plurality of micro-semiconductor chips are aligned in a plurality of grooves of the transfer substrate.

According to an aspect of the disclosure, there is provided a micro-semiconductor chip alignment apparatus comprising: a controller; and an aligner including a supporting plate and an absorber coupled to the supporting plate, wherein the controller is configured to control the aligner to move the absorber along a surface of a transfer substrate provided with a plurality of micro-semiconductor chips and a liquid, and wherein the absorber is configured to absorb the liquid and align the plurality of micro-semiconductor chips into a plurality of grooves in the transfer substrate.

The absorber may have a mesh type structure capable of absorbing the liquid.

The absorber may have a plurality of mesh holes, each of the plurality of mesh holes having a size smaller than a size of each of the plurality of micro-semiconductor chips.

The absorber may be further configured to, while contacting the surface of the transfer substrate, turn over a micro-semiconductor chip in a groove so that a first surface of the micro-semiconductor chip having liquid repellency is in an upward-facing posture.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
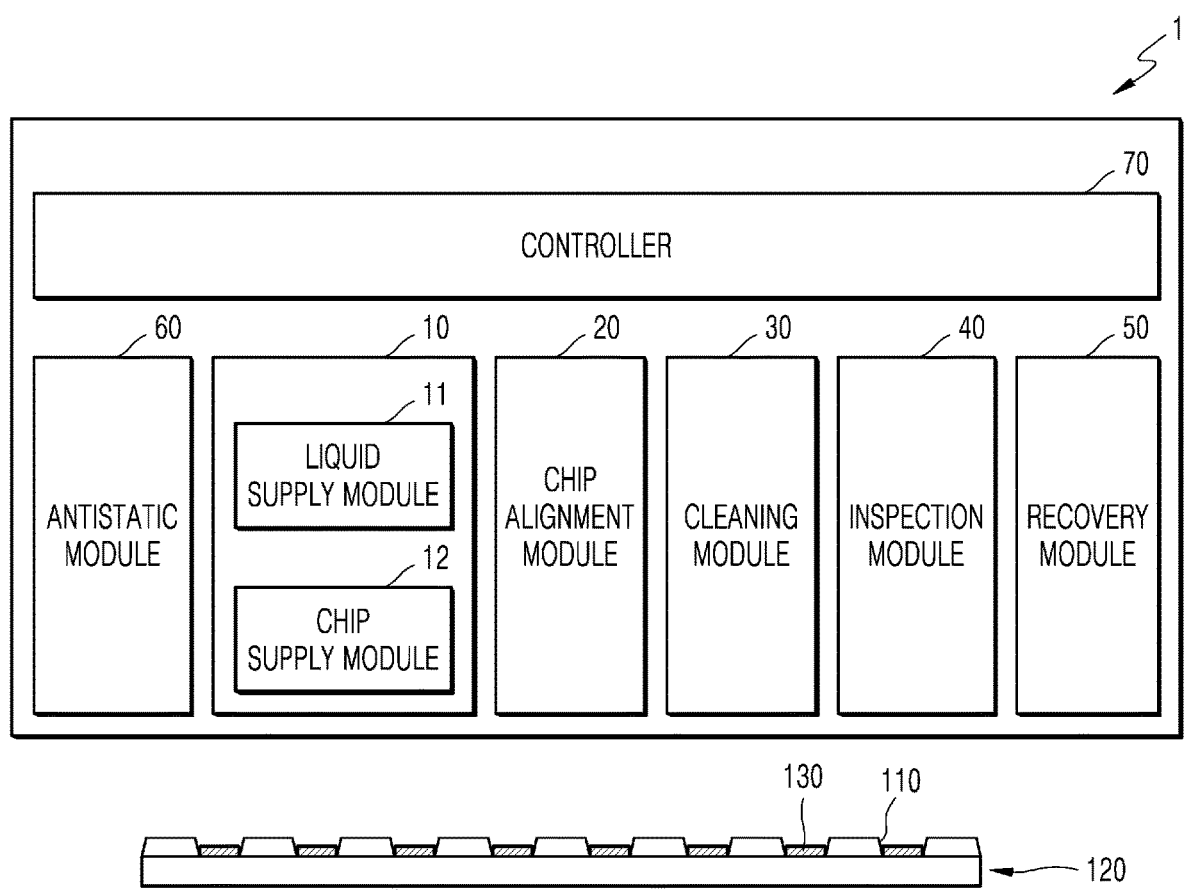
FIG. 1 is a block diagram schematically showing a micro-semiconductor chip wet alignment apparatus according to an example embodiment.

Reference will now be made in detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a micro-semiconductor chip wet alignment apparatus according to various example embodiments, will be described in detail with reference to the accompanying drawings. In the drawings, the same reference numerals denote the same elements and sizes of elements may be exaggerated for clarity and convenience of explanation. The terms "first," "second," etc. are used only for the purpose of distinguishing one component from another component and should not be otherwise interpreted in a limited sense. The terms are used only for the purpose of distinguishing one component from another component.

As used herein, the singular terms "a" and "an" are intended to include the plural forms as well, unless the context clearly indicates otherwise. It will be further understood that when a part "includes" or "comprises" an element, unless otherwise defined, the part may further include other elements, not excluding the other elements. A size of each element in the drawings may be exaggerated for clarity and convenience of explanation. Also, when a certain material layer is described as being on a substrate or another layer, the material layer may be on the substrate or the other layer by directly contacting the same, or a third layer may be arranged between the material layer, and the substrate or the other layer. Also, materials described to be included in each layer are examples, and materials other than the materials may also be used.

Also, the terms such as " . . . unit," "module," or the like used in the specification indicate a unit, which processes a function or a motion, and the unit may be implemented by hardware or software, or by a combination of hardware and software.

Particular executions described in the example embodiments are examples and do not limit the technical scope by any means. For the sake of brevity, conventional electronics, control systems, software development and other functional aspects may not be described. Furthermore, the connections or connectors shown in the various figures presented are intended to represent exemplary functional relationships and/or physical or logical couplings between the various elements. It should be noted that many alternative or additional functional relationships, physical connections or logical connections may be present in a practical device.

The term "the" and other equivalent determiners may correspond to a singular referent or a plural referent. As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Unless orders of operations included in a method are specifically described or there are contrary descriptions, the operations may be performed according to appropriate orders. The use of all example terms (e.g., etc.) are merely for describing the disclosure in detail and the disclosure is not limited to the examples and the example terms, unless they are not defined in the scope of the claims.

Figure 5:
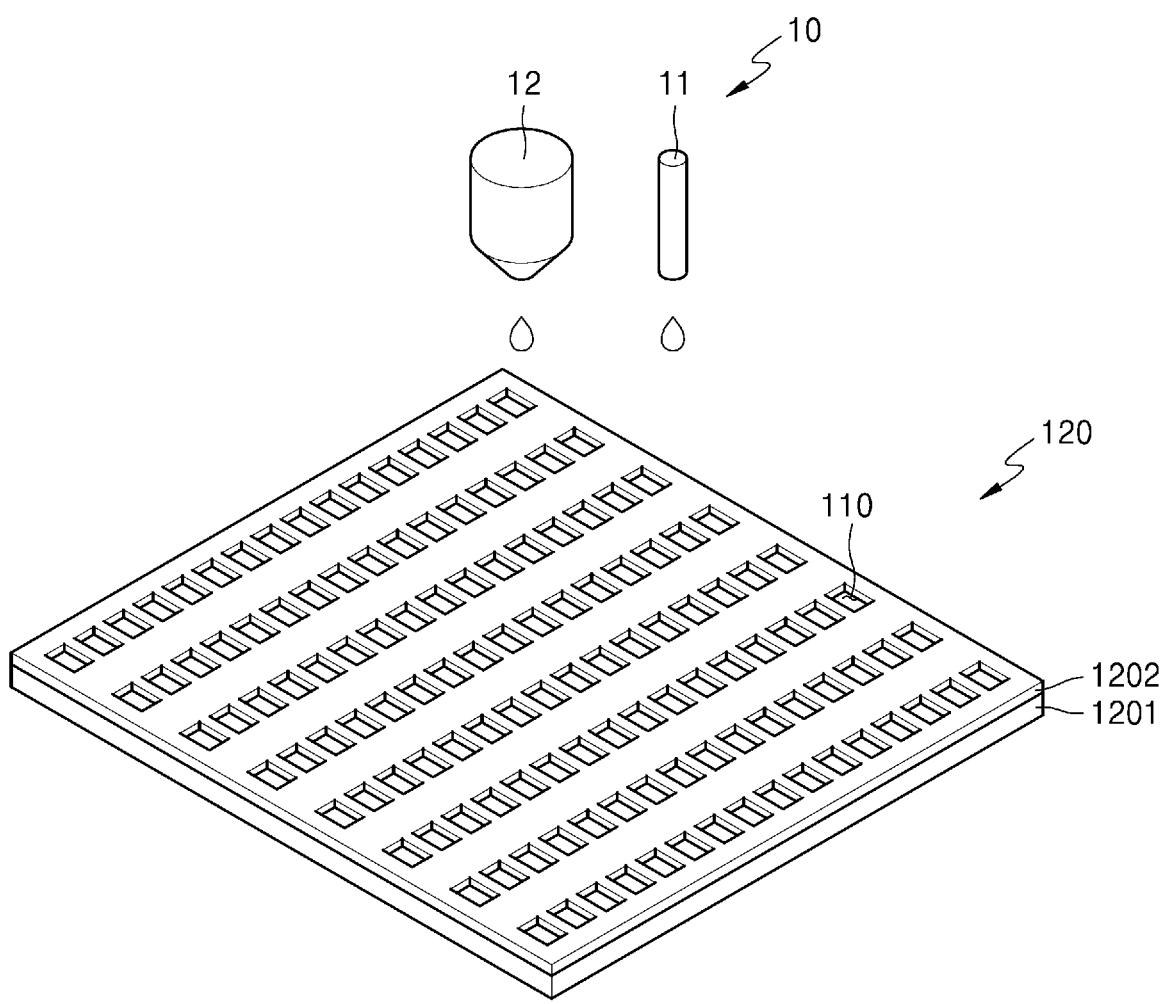
FIG. 5 is a diagram illustrating a configuration and an operation of a micro-semiconductor chip wet alignment apparatus according to an example embodiment.

FIG. 1 is a block diagram schematically showing a micro-semiconductor chip wet alignment apparatus 1 according to an example embodiment, FIGS. 2, 3A, 3B and 4 are diagrams illustrating a transfer substrate 120 according to an example embodiment, and FIG. 5 is a diagram illustrating a configuration and an operation of the micro-semiconductor chip wet alignment apparatus 1 according to an example embodiment.

Referring to FIG. 1, the micro-semiconductor chip wet alignment apparatus 1 according to an example embodiment includes a semiconductor chip wet supply module 10 and a chip alignment module 20. in which a plurality of micro-semiconductor chips 130 are aligned in a plurality of grooves 110 of the transfer substrate 12. According to the example embodiment, the micro-semiconductor chip wet alignment apparatus 1 may align a plurality of micro-semiconductor chips 130 in a plurality of grooves 110 of a transfer substrate 120. The micro-semiconductor chip wet alignment apparatus 1 includes a controller 70 that controls operations of the semiconductor chip wet supply module 10 and the chip alignment module 20. Moreover, the micro-semiconductor chip wet alignment apparatus 1 according to an example embodiment may further include cleaning module 30, inspection module 40, recovery module 50, and antistatic module 60 and the controller 70 may be configured to control operations of the cleaning module 30, inspection module 40, recovery module 50, and antistatic module 60.

Figure 2:
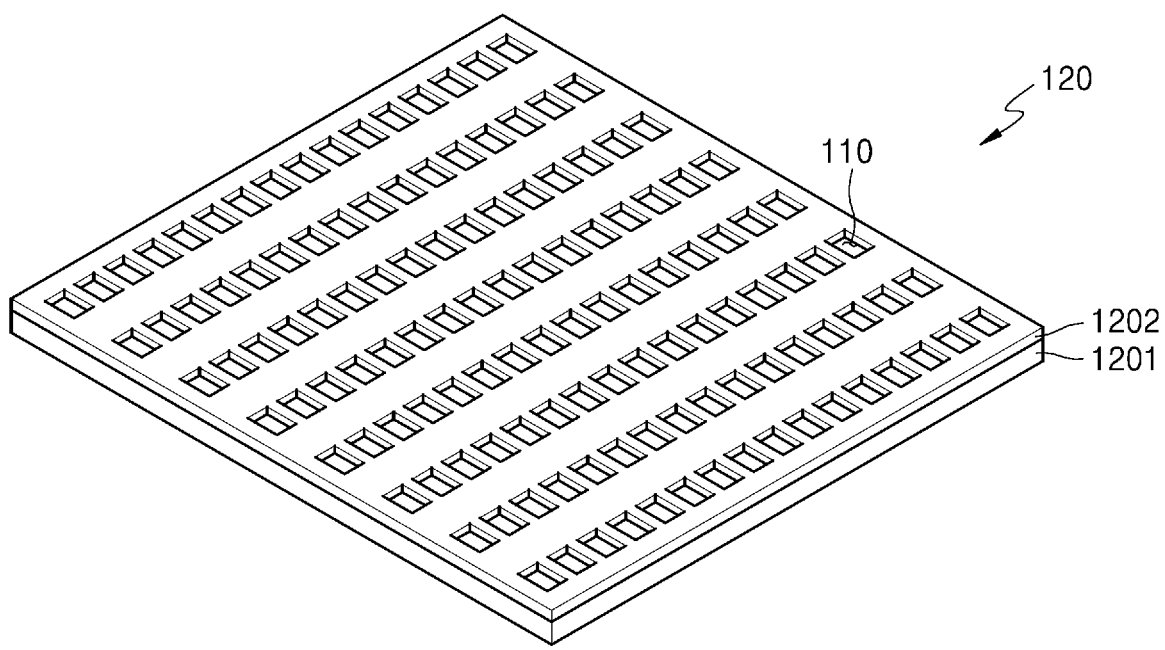
FIGS. 2, 3A, 3B and 4 are diagrams illustrating a transfer substrate according to an example embodiment.
Figure 3A:
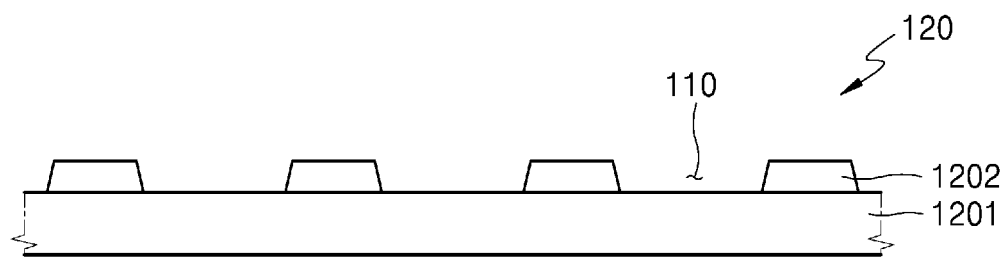
Figure 3B:
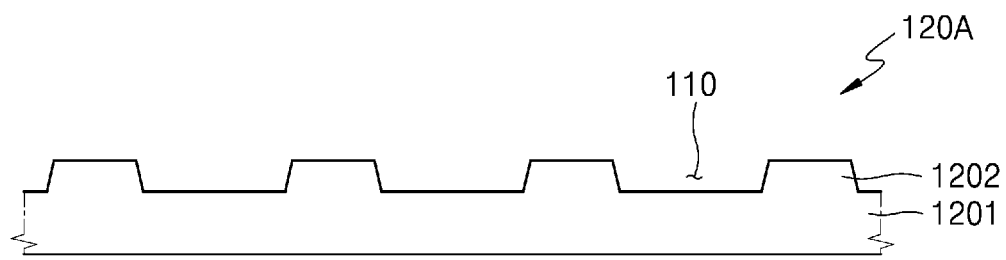
Figure 4:
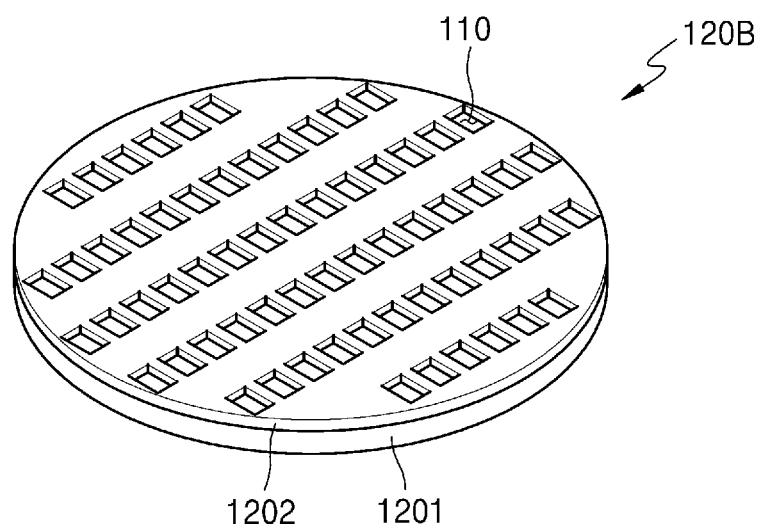

Referring to FIGS. 2 and 3A, the transfer substrate 120 includes the plurality of grooves 110 into which at least some of the plurality of micro-semiconductor chips 130 may be inserted.

Each of the plurality of grooves 110 may have a size in which at least some of the plurality of micro-semiconductor chips 130 are insertable. That is, each of the plurality of grooves 110 may have a size capable of receiving at least some of the plurality of micro-semiconductor chips 130. For example, the size of the groove 110 may have a size of a micro unit. For example, the size of the groove 110 may be less than 1000 um, for example, equal to or less than 500 um, equal to or less than 200 um, or equal to or less than 100 um. The size of the groove 110 may be larger than the size of the micro-semiconductor chip 130.

Spaces between the plurality of grooves 110 may correspond to spaces between the micro-semiconductor chips 130 inserted into the grooves 110. For example, when the micro-semiconductor chip 130 is a light emitting device, spaces between the plurality of grooves 110 may correspond to pixel spaces of a display apparatus used in the final product. However, spaces between the plurality of grooves 110 are not limited thereto, and may be variously modified as necessary.

The transfer substrate 120 may include a plurality of layers. For example, the transfer substrate 120 may include a base substrate 1201 and a guide mold 1202.

Materials of the base substrate 1201 and the guide mold 1202 may be different according to an example embodiment, but may be the same according to another example embodiment. However, the configuration of the transfer substrate 120 is not limited to the plurality of layers, and as such, according to an example embodiment shown in FIG. 3B, a transfer substrate 120A may be a single layer. However, the transfer substrate 120A may still have a base region 1201 and the guide mold region 1202. In addition, a planar shape of the transfer substrate 120 may be a quadrangle as shown in FIG. 2, but is not limited thereto. For example, according to an example embodiment shown in FIG. 4, the planar shape of a transfer substrate 120B may be circular.

Figure 6:
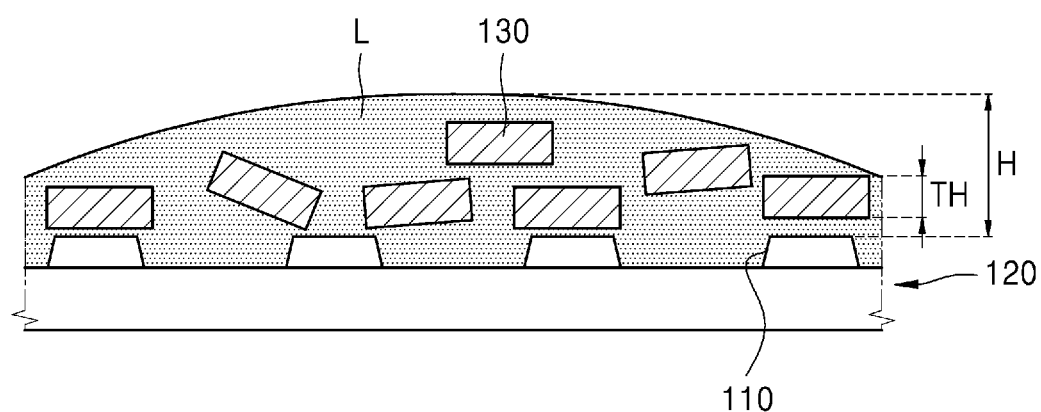
FIG. 6 is a diagram illustrating a state in which a liquid and a micro semiconductor chip are supplied onto a transfer substrate by a semiconductor chip wet supply module according to an example embodiment.

Referring to FIGS. 5 and 6, the semiconductor chip wet supply module 10 supplies the micro-semiconductor chip 130 and a liquid L onto the transfer substrate 120.

Referring to FIG. 5, a chip supply module 12 may supply the plurality of micro-semiconductor chips 130 onto the transfer substrate 120 and a liquid supply module 11 may supply liquid L onto the transfer substrate 120 according to an example embodiment. The liquid L supplied onto the transfer substrate 120 forms a thin film on the transfer substrate 120, and at least some of the plurality of micro-semiconductor chips 130 may be immersed in the liquid L.

As shown in FIG. 6, because the plurality of micro-semiconductor chips 130 are immersed in the liquid L, the plurality of micro-semiconductor chips 130 may be in a flowable state on the transfer substrate 120. At this time, the liquid L supplied onto the transfer substrate 120 may be formed thinly on the transfer substrate 120 to prevent or minimize an unintended flow of the plurality of micro-semiconductor chips 130 by the chip alignment module 20 to be described later while allowing the plurality of micro-semiconductor chips 130 to flow.

As an example, the liquid L may be maintained on the transfer substrate 120 without a separate configuration (e.g., a tank, etc.) for holding the liquid L on the transfer substrate 120. The liquid L supplied onto the transfer substrate 120 may have a convex surface upward due to a surface tension or the like. The closer to the edge of the transfer substrate 120, the lower a height H of the liquid L.

The height H of the liquid L supplied onto the transfer substrate 120 may be equal to or less than 20 times than a thickness TH of the micro-semiconductor chip 130. The height H of the liquid L supplied onto the transfer substrate 120 may be equal to or less than 10 times the thickness TH of the micro-semiconductor chip 130. The height H of the liquid L supplied onto the transfer substrate 120 may be equal to or less than 5 times the thickness TH of the micro-semiconductor chip 130. The height H of the liquid L supplied onto the transfer substrate 120 may be equal to or less than twice the thickness TH of the micro-semiconductor chip 130. Here, the height H of the liquid L may be an average height.

The liquid L may be any type of liquid as long as it does not corrode or damage the micro-semiconductor chip 130. The liquid L may include, for example, at least one from a group including water, ethanol, alcohol, polyol, ketone, halocarbon, acetone, a flux, and an organic solvent. The organic solvent may include, for example, isopropyl alcohol (IPA). The liquid L is not limited thereto, and various changes are possible.

The micro-semiconductor chip 130 may be a member having a size of a micro unit. For example, the micro-semiconductor chip 130 may be a member having a size of less than 1000 um, for example, equal to or less than 500 um, equal to or less than 200 um, or equal to or less than 100 um.

The micro-semiconductor chip 130 may be a micro-light emitting device. However, the micro-semiconductor chip 130 is not limited thereto, and may vary if it is a member having the size of the micro unit. For example, the micro-semiconductor chip 130 may be a pressure sensor, a photodiode, a thermistor, a piezoelectric device, etc.

The planar shape of the micro-semiconductor chip 130 may have a symmetrical structure.

Figure 7:
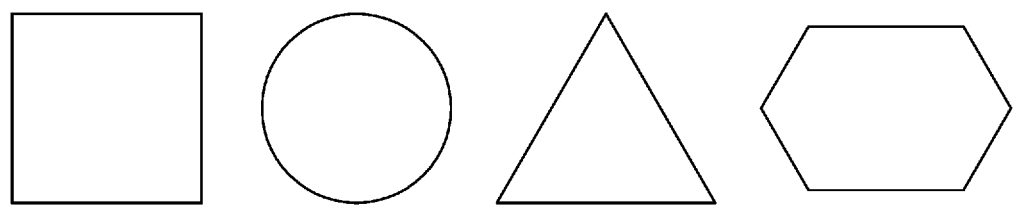
FIGS. 7 and 8 are diagrams illustrating a shape and structure of a micro semiconductor chip according to an example embodiment.

For example, the planar shape of the micro-semiconductor chip 130 may be a square, a circle, a triangle, or a hexagon shape, as shown in FIG. 7.

Figure 8:
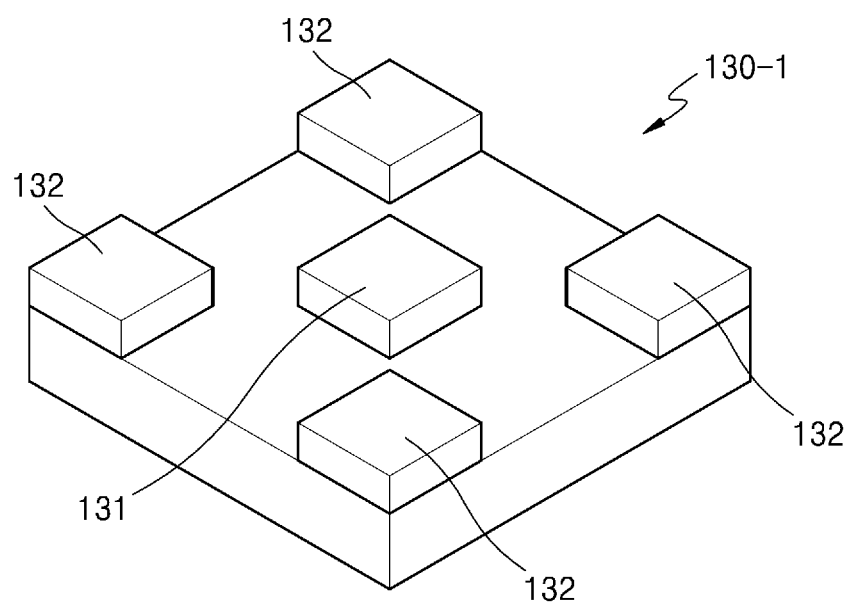

Referring to FIG. 8, electrodes 132 may be disposed on ends of a micro-semiconductor chip 130-1 according to an example embodiment. The electrodes 132 of the micro-semiconductor chip 130-1 may have a symmetrical structure, however, the disclosure is not limited thereto. For example, a first electrode 131 of the micro-semiconductor chip 130-1 may be disposed in the center, and a second electrode 132 may be spaced apart from the first electrode 131 and disposed outside the first electrode 131. As described above, even if the micro-semiconductor chip 130-1 rotates during a process of being aligned in the groove 110 in a subsequent operation, the electrodes of the micro-semiconductor chip 130-1 may be disposed on certain positions.

The semiconductor chip wet supply module 10 may supply the liquid L and the micro-semiconductor chip 130 simultaneously or sequentially. For example, the semiconductor chip wet supply module 10 may include a liquid supply module 11 and a chip supply module 12.

Figure 9:
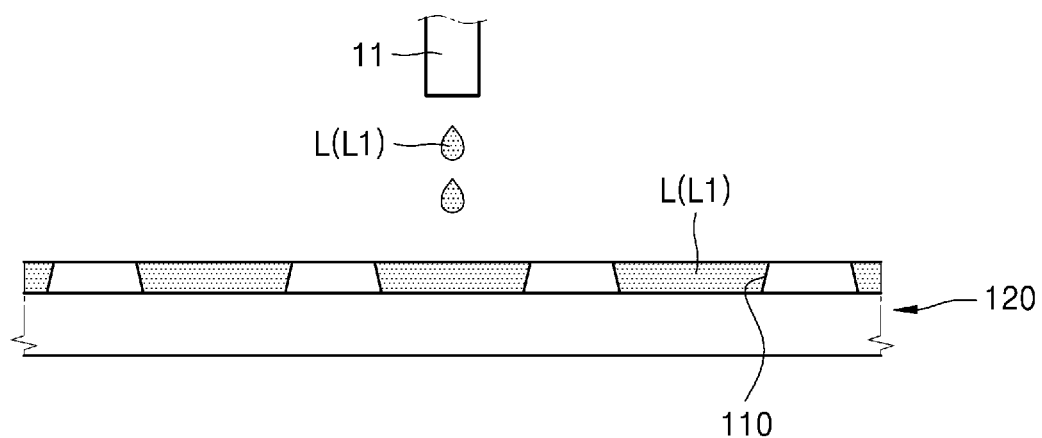
FIGS. 9 to 17 are diagrams illustrating an example of a method of supply of a liquid onto a transfer substrate by a liquid supply module according to an example embodiment.

Referring to FIGS. 5 and 9, the liquid supply module 11 may first supply the liquid L before the plurality of micro-semiconductor chips 130 are supplied onto the transfer substrate 120. According to an example embodiment, the liquid L in the liquid supply module 11 may be referred to as a first liquid L1. For example, the liquid supply module 11 may supply the liquid L to the plurality of grooves 110 of the transfer substrate 120. The amount of liquid L supplied by the liquid supply module 11 may be variously adjusted as necessary.

A method of supplying the liquid L to the plurality of grooves 110 may be variously used. For example, the method of supplying the liquid L may include a spray method, a dispensing method, an inkjet dot method, a method of making the liquid L flowing onto the transfer substrate 120, etc.

Figure 10:
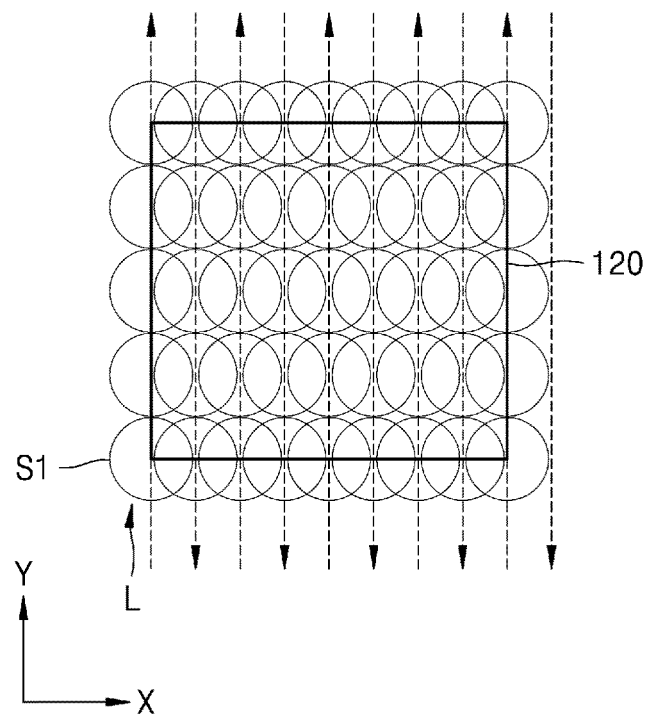
Figure 11:
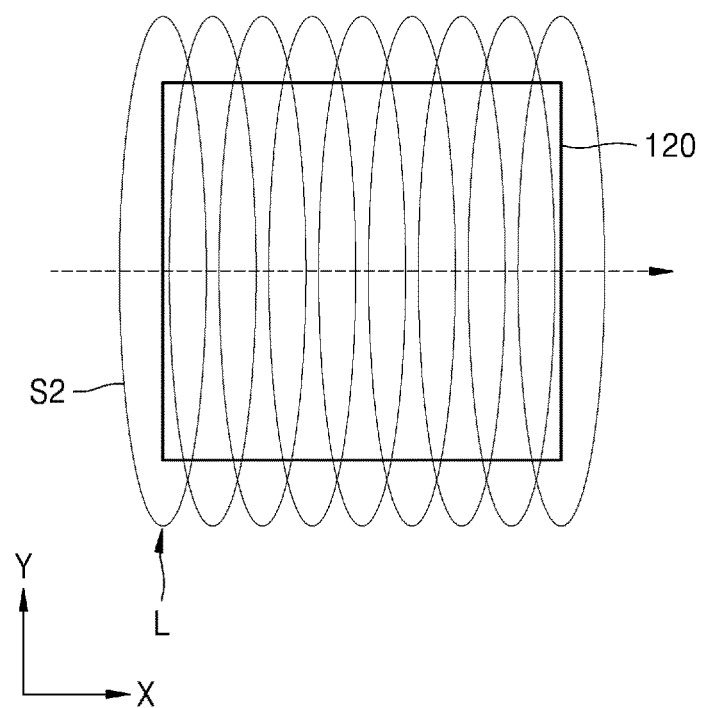
Figure 12:
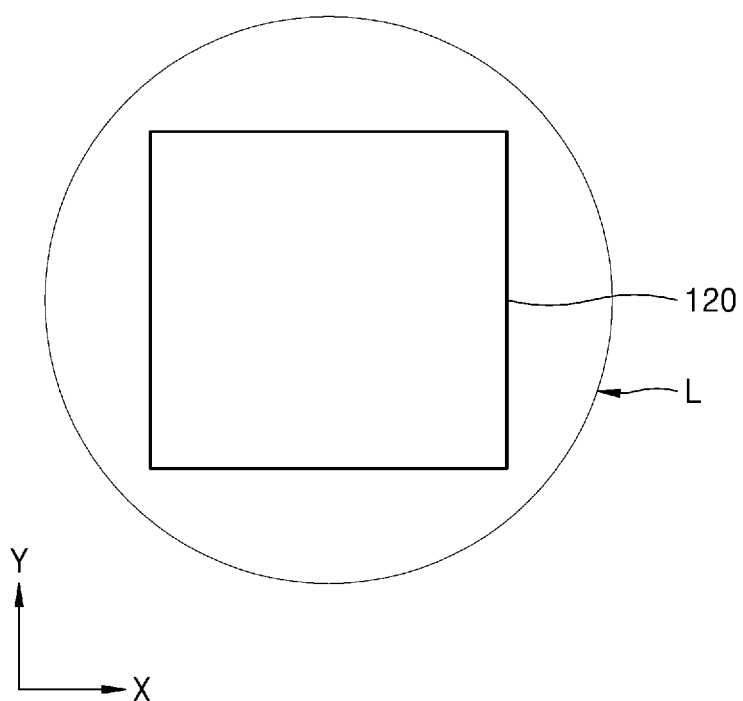
Figure 13:
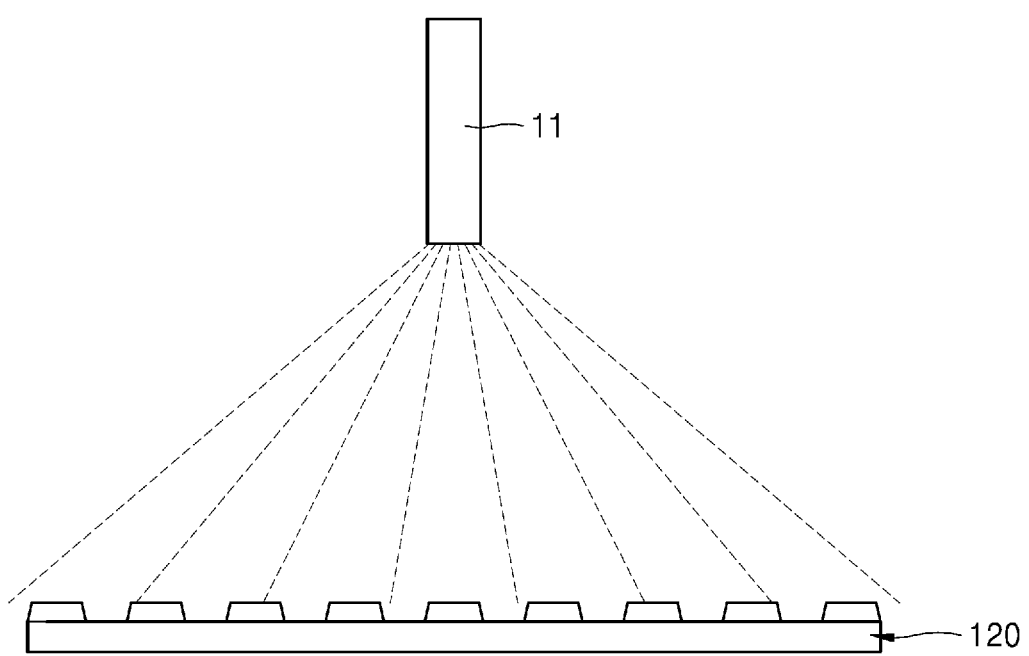

The liquid supply module 11 may supply the liquid L onto the transfer substrate 120 in various ways. The liquid supply module 11 may move the liquid supply module 11 in a horizontal direction or a vertical direction in order to evenly supply the liquid L onto the transfer substrate 120. Moreover, the liquid supply module 11 may move the liquid supply module 11 in a horizontal direction and a vertical direction in order to evenly supply the liquid L onto the transfer substrate 120. According to an example embodiment, as shown in FIG. 10, the liquid supply module 11 may supply the liquid L to a part of the transfer substrate 120 in a dot shape S1 and move in the vertical direction Y and the horizontal direction X. According to another example embodiment, as shown in FIG. 11, the liquid supply module 11 may supply the liquid L in an elongated shape S2 in the vertical direction Y and move in the horizontal direction X. As another example, as shown in FIGS. 12 and 13, the liquid supply module 11 may supply the liquid L to a larger region than the transfer substrate 120.

Figure 14:
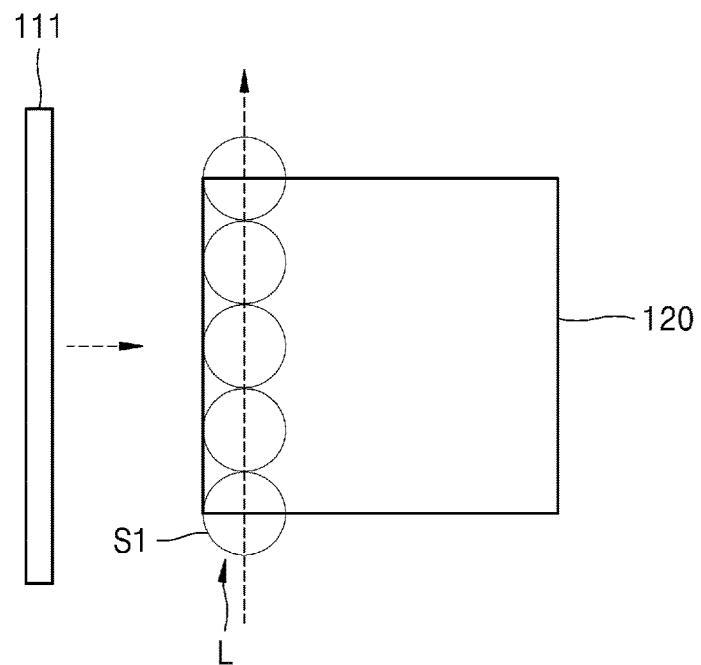
Figure 15:
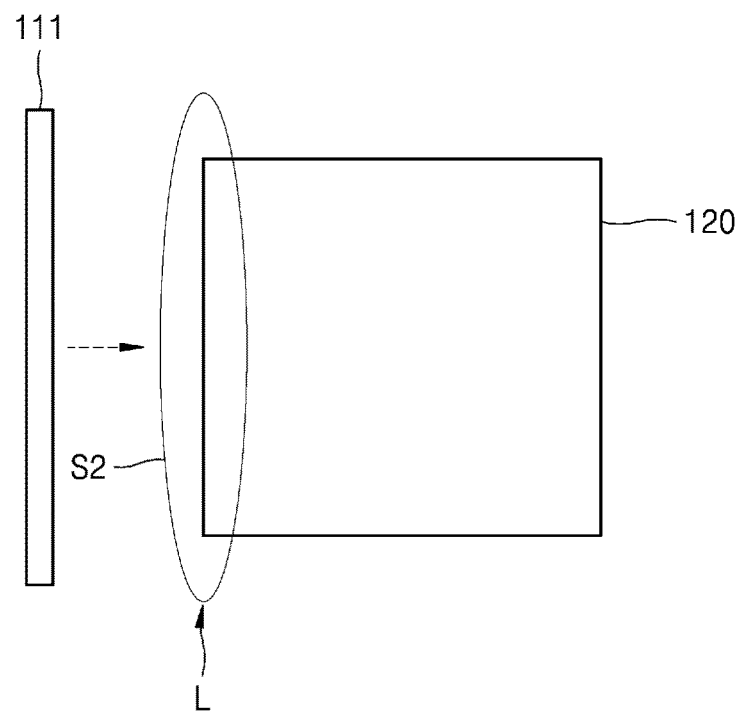
Figure 16:
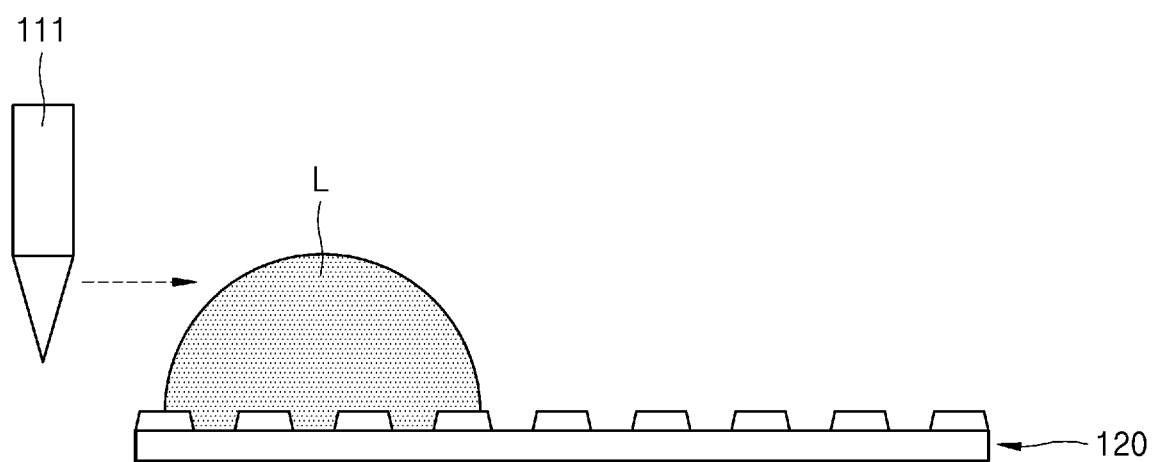
Figure 17:
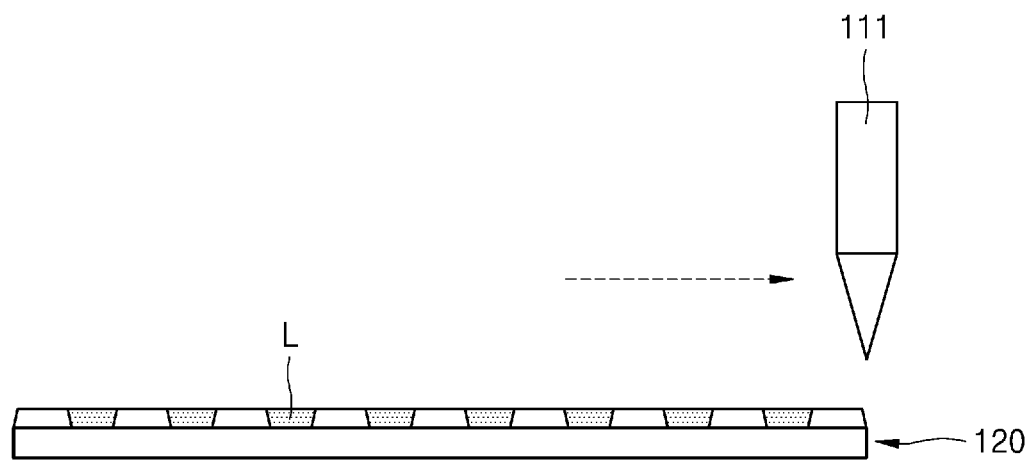

As another example, as shown in FIGS. 14 to 15, the liquid supply module 11 supplies a relatively large amount of the liquid L to a partial region of the transfer substrate 120 in the dot shape S1 or in the elongated shape S2 in the vertical direction. Thereafter, as shown in FIGS. 16 to 17, a height limiting member 111 such as a blade may be used to spread the liquid L supplied onto the transfer substrate 120 evenly, and thus a thin film may be formed on the transfer substrate 120.

The liquid supply method may be variously used, such as a method of making the liquid L flowing onto the transfer substrate 120, a spray method, a dispensing method, an inkjet dot method, etc.

Figure 18:
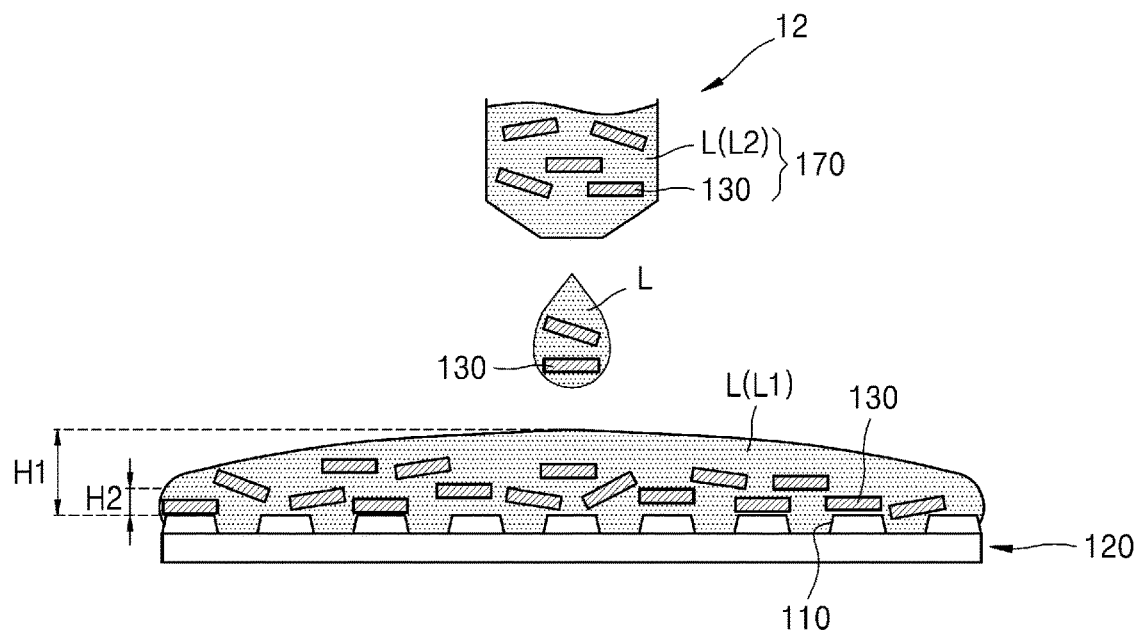
FIGS. 18, 19, 20A, 20B, 20C, 21 and 22 are diagrams illustrating an example of a structure and method for supplying a liquid and a plurality of micro-semiconductor chips onto a transfer substrate by a chip supply module according to an example embodiment.

Referring to FIGS. 5 and 18, the chip supply module 12 may supply the plurality of micro-semiconductor chips 130 onto the transfer substrate 120. In this regard, the plurality of grooves 110 of the transfer substrate 120 may be filled with the liquid L to some extent.

The chip supply module 12 may supply the plurality of micro-semiconductor chips 130 together with the liquid L. According to an example embodiment, the liquid L in the chip supply module 12 may be referred to as a second liquid L2. The chip supply module 12 may supply a suspension 170 including the plurality of micro-semiconductor chips 130. In this case, the method of supplying the micro-semiconductor chip 130 may be variously used, such as a spray method, a dispensing method, an inkjet dot method, and a method of making the suspension 170 flowing onto the transfer substrate 120.

In the suspension 170, the plurality of micro-semiconductor chips 130 have a greater specific gravity than the liquid L. The specific gravity of the micro-semiconductor chip 130 may be equal to or greater than 2 times, for example, equal to or greater than 4 times, or equal to or greater than 6 times the specific gravity of the liquid L. The specific gravity of the micro-semiconductor chip 130 may be equal to or less than 40 times the specific gravity of the liquid L.

Figure 19:
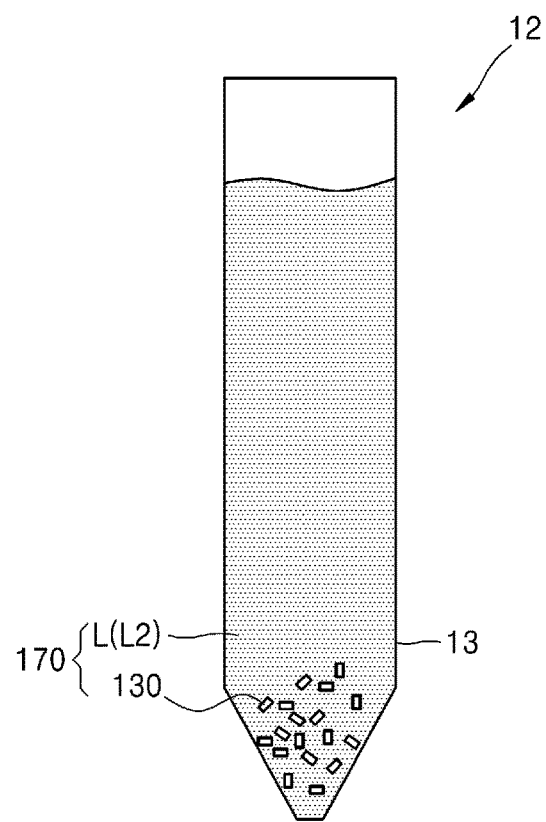

In this way, when the specific gravity of the micro-semiconductor chip 130 is greater than that of the liquid L, as shown in FIG. 19, before being discharged from the chip supply module 12, the plurality of micro-semiconductor chips 130 may be in a sinking state. For example, the plurality of micro-semiconductor chips 130 may be concentrated in an entrance of a nozzle unit 13 of the chip supply module 12. In this state, when the suspension 170 is discharged from the chip supply module 12, a large amount of micro-semiconductor chips 130 may be discharged unintentionally at a time.

To prevent this phenomenon, the chip supply module 12 may be configured such that the plurality of micro-semiconductor chips 130 included in the suspension 170 are evenly mixed.

Figure 20A:
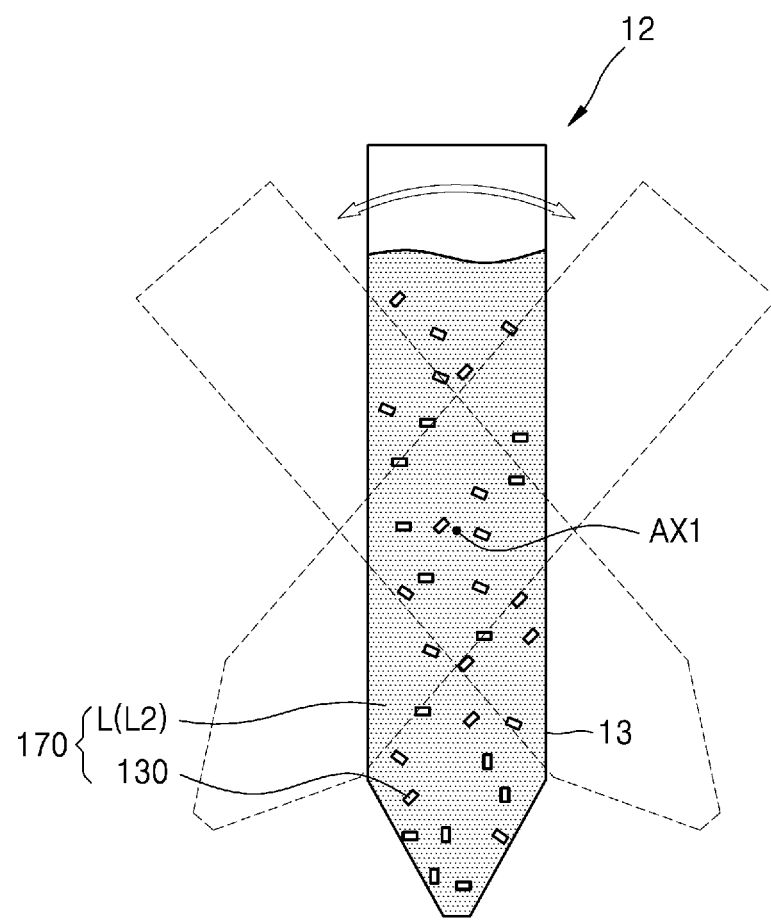
Figure 20B:
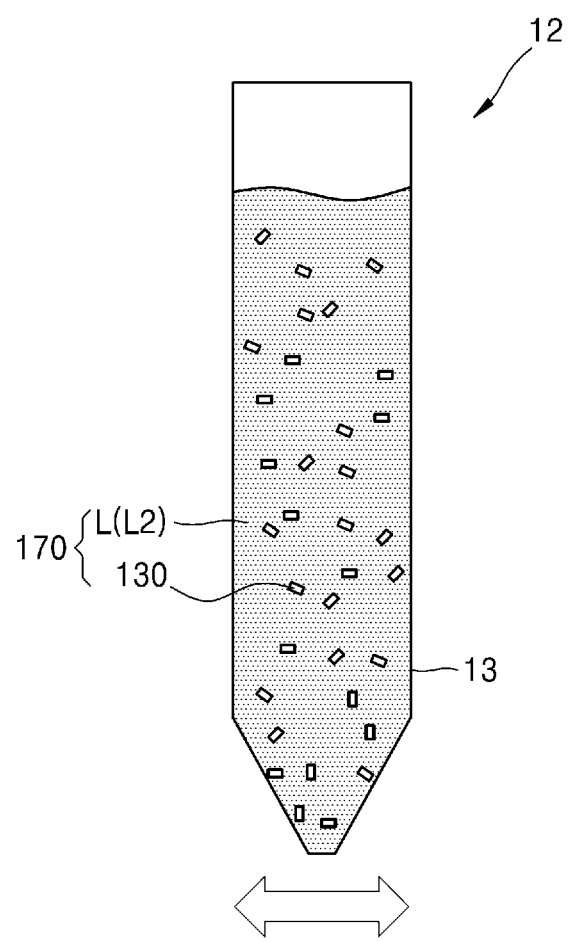
Figure 20C:
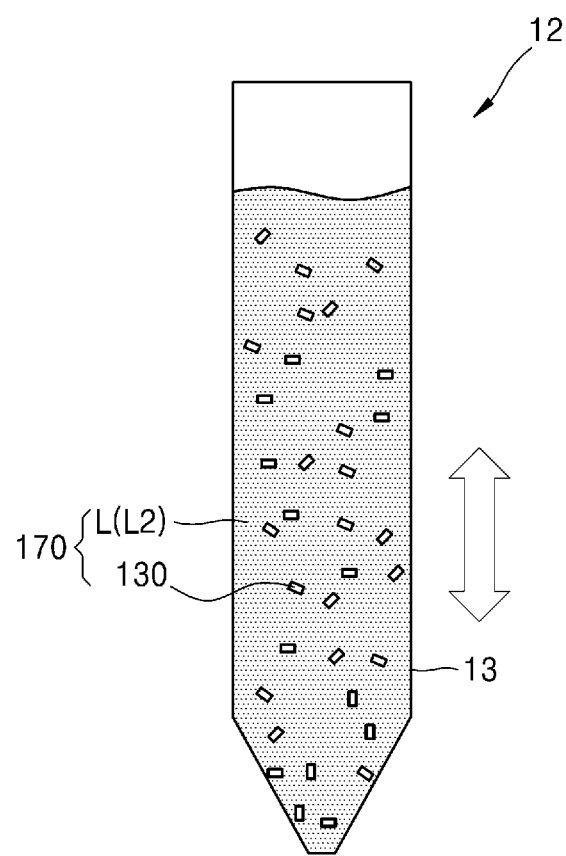
Figure 21:
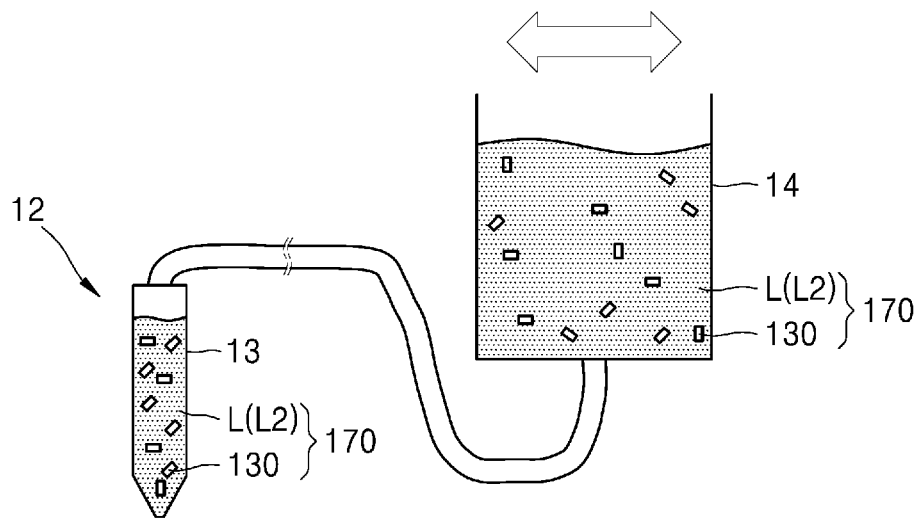
Figure 22:
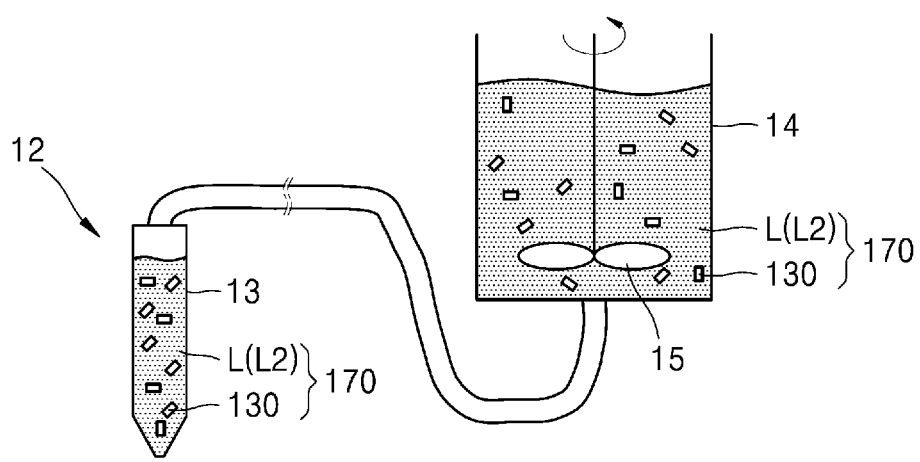

For example, the chip supply module 12 may vibrate a configuration or a component including the suspension 170. For example, the chip supply module 12 may shake the nozzle unit 13 including the suspension 170. For example, as shown in FIG. 20A, the chip supply module 12 may rotate the nozzle unit 13 with respect to a certain rotation axis AX1. For example, as shown in FIGS. 20B and 20C, the chip supply module 12 may shake the nozzle unit 13 left or right or up and down. As another example, as shown in FIG. 21, the chip supply module 12 may have a structure that vibrates the tank 14 that supplies the suspension 170 to the nozzle unit 13. As another example, as shown in FIG. 22, the chip supply module 12 may include an agitator 15 disposed inside the suspension 170 to mix the suspension 170. In this case, the agitator 15 may be configured not to damage the micro-semiconductor chip 130 in spite of a collision with the micro-semiconductor chip 130. For example, the agitator 15 may have a smaller strength or a greater elastic deformation force than the micro-semiconductor chip 130.

Referring back to FIG. 18, the liquid L (hereinafter referred to as 'second liquid L2') of the suspension 170 discharged by the chip supply module 12 may mix with the liquid L (hereinafter referred to as 'first liquid L1') supplied onto the transfer substrate 120 by the liquid supply module 11. The second liquid L2 may be dissolved in the first liquid L1.

For example, the second liquid L2 may be the same liquid as the first liquid L1. However, a material of the second liquid L2 is not limited thereto, and may be a liquid different from the first liquid L1 as long as a certain degree of solubility in the first liquid L1 may be secured.

The second liquid L2 and the first liquid L1 may mix to form the liquid L of a thin film on the transfer substrate 120. The liquid L of the thin film may be formed to slightly cover the plurality of micro-semiconductor chips 130. The liquid L may have a convex surface. The closer to the edge of the transfer substrate 120, the lower the height of the liquid L may be. The surface of the liquid L may have a height H2 lower than the height H1 of a central region of the transfer substrate 120.

According to an example embodiment, in order to evenly supply the suspension 170 onto the transfer substrate 120, the chip supply module 12 may use a method similar to a method used by the liquid supply module 11 for supplying the liquid L as shown in FIGS. 10 to 17. A description in this regard is redundant, and thus it will not be repeated.

According to an example embodiment, a method of supplying the suspension 170 to the transfer substrate 120 may include one of a method of making the suspension 170 flowing onto the transfer substrate 120, a spray method, a dispensing method, or an inkjet dot method. However, the method of supplying the suspension 170 is not limited thereto.

In the above-described example embodiment, an example in which the chip supply module 12 supplies the micro-semiconductor chip 130 in the form of the suspension 170 is described, but the example embodiment is not limited thereto. For example, the chip supply module 12 may supply the plurality of micro-semiconductor chips 130 without a liquid supply.

Meanwhile, in the above-described example embodiment, an example in which the liquid supply module 11 and the chip supply module 12 are separate configurations is described, but the example embodiment is not limited thereto, and the liquid supply module 11 and the chip supply module 12 may be one configuration. In this case, the semiconductor chip wet supply module 10 may supply the plurality of micro-semiconductor chips 130 together with the liquid L.

Figure 23:
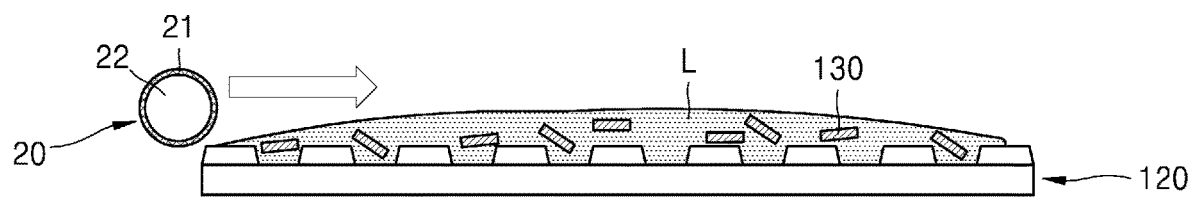
FIG. 23 is a conceptual diagram illustrating an operation of a chip alignment module according to an example embodiment.

Referring to FIG. 23, the chip alignment module 20 includes an absorber 21 that absorbs the liquid L according to an example embodiment. The transfer substrate 120 may be scanned with the absorber 21. The chip alignment module 20 may move the absorber 21 along the surface of the transfer substrate 120. The absorber 21 may move along the surface of the transfer substrate 120 while contacting the transfer substrate 120.

The absorber 21 may include, for example, fabric, tissue, polyester fiber, paper or wiper.

Figure 24:
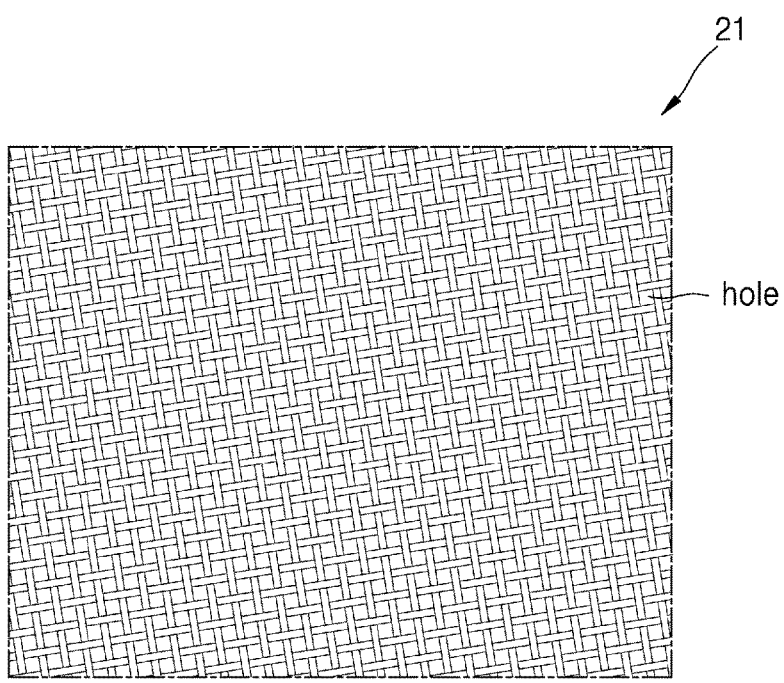
FIG. 24 is a diagram illustrating an example of an absorber according to an example embodiment.

The absorber 21 may have a structure in the form of a mesh capable of absorbing the liquid L. Referring to FIG. 24, the absorber 21 has a plurality of mesh holes, and the size of the mesh hole may be smaller than the micro-semiconductor chip 130 to prevent the micro-semiconductor chip 130 from being stuck or pinched.

The absorber 21 may be used alone without other auxiliary devices. However, the disclosure is not limited thereto, and the absorber 21 may be coupled to a supporting plate 22 to facilitate scanning of the transfer substrate 120 with the absorber 21. The supporting plate 22 may have various shapes and structures suitable for scanning the transfer substrate 120. The supporting plate 22 may include, for example, a rod, a blade, a plate, a wiper, or the like. The absorber 21 may be provided on either side of the supporting plate 22, or may have a shape in which the absorber 21 is wound around a circumference of the supporting plate 22.

Figure 25:
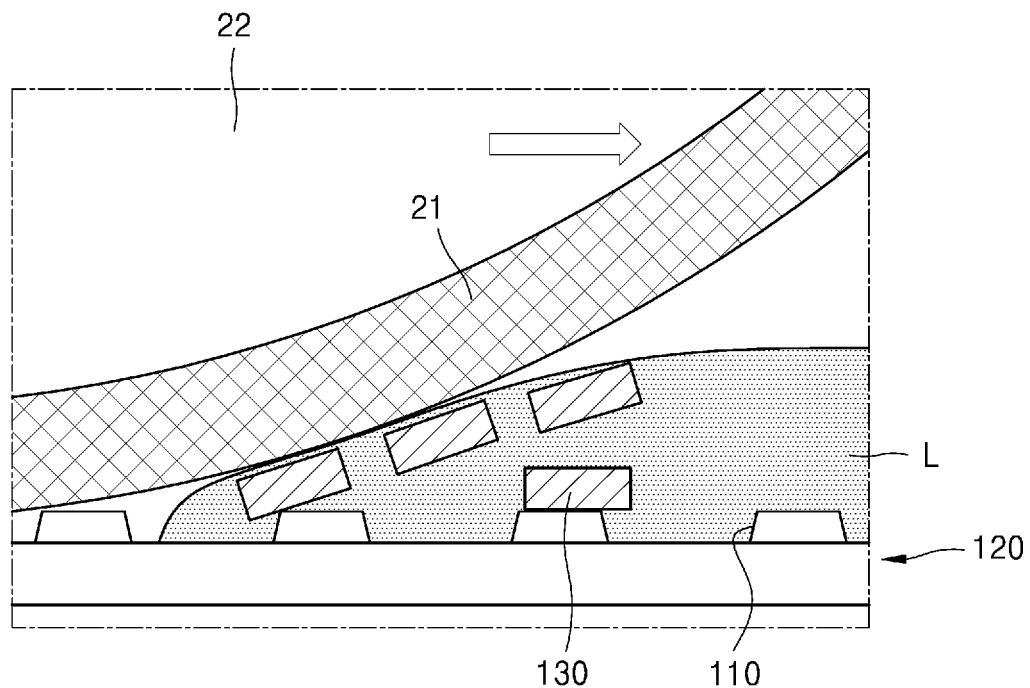
FIGS. 25 to 27 are diagrams illustrating an operation of a chip alignment module according to an example embodiment.

The chip supply module 12 may scan the transfer substrate 120 while the absorber 21 presses the transfer substrate 120 at an appropriate pressure. Referring to FIG. 25, in a scanning operation, the absorber 21 may contact the transfer substrate 120 and pass through the plurality of grooves 110. During scanning, the liquid L may be absorbed by the absorber 21.

Scanning may be performed using various methods including at least one of, for example, a sliding method, a rotating method, a translating method, a reciprocating method, a rolling method, a spinning method, or a rubbing method of the absorber 21, and may include both a regular method and an irregular method. Alternatively, scanning may include at least one of rotating, translating, rolling, and spinning of the transfer substrate 120. Alternatively, scanning may be performed in cooperation with the absorber 21 and the transfer substrate 120. For example, while the absorber 21 presses the transfer substrate 120, the transfer substrate 120 moves or rotates such that scanning may proceed.

Scanning the transfer substrate 120 with the absorber 21 may include absorbing the liquid L in the plurality of grooves 110 while the absorber 21 passes through the plurality of grooves 110. The absorber 21 may pass through the plurality of grooves 110 by contacting the transfer substrate 120.

Figure 26:
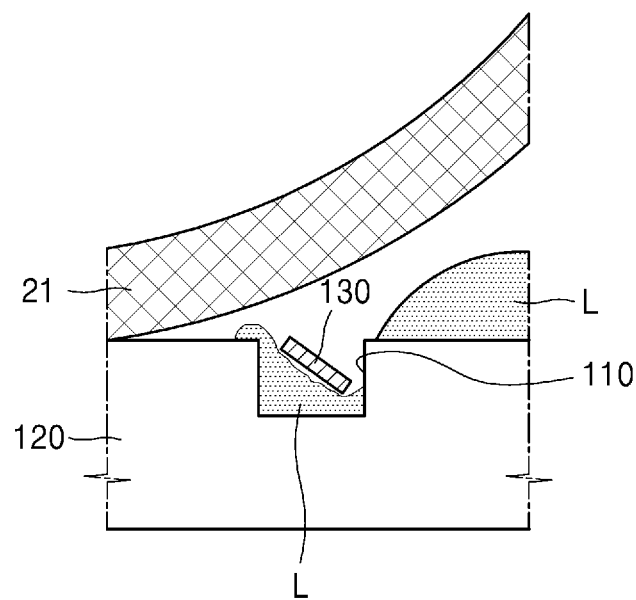

Referring to FIG. 26, during a process in which the absorber 21 passes through the groove 110, the liquid L in the groove 110 may be absorbed, and in the process, the micro-semiconductor chip 130 may be aligned inside the groove 110. According to an example embodiment, the absorber 21 may enter into the groove 110, and the liquid L in the groove 110 may be absorbed. According to an example embodiment, at least a portion of the absorber 21 may enter into the groove 110, and the liquid L in the groove 110 may be absorbed.

Figure 27:
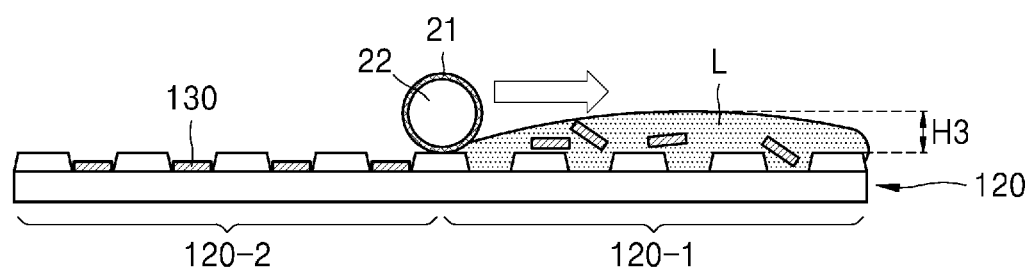

Referring to FIG. 27, during a process in which the absorber 21 moves along the surface of the transfer substrate 120, the absorber 21 absorbs the liquid L present on the transfer substrate 120. Due to absorption by the absorber 21, the amount of liquid L present on the transfer substrate 120 is changed. For example, the amount of the liquid L present in a region 120-2 of the transfer substrate 120 through which the absorber 21 has passed and the amount of the liquid L present in a region 120-1 of the transfer substrate 120 before the absorber 21 has passed through may be different. For example, the amount of the liquid L present in the region 120-2 of the transfer substrate 120 through which the absorber 21 has passed may be smaller than the amount of the liquid L present in the region 120-1 of the transfer substrate 120 before the absorber 21 has passed through. Almost no liquid L may remain in the region 120-2 of the transfer substrate 120 through which the absorber 21 has passed. According to an example embodiment, all liquid L or substantially all liquid L may be absorbed by the absorber. The height of the liquid L present in the region 120-2 of the transfer substrate 120 through which the absorber 21 has passed is lower than a height H3 of the liquid L present in the region 120-1 of the transfer substrate 120 before the absorber 21 has passed through.

According to a relationship between the micro-semiconductor chip 130 and the liquid L, an alignment state of the micro-semiconductor chip 130 may vary. For example, referring to FIG. 28, a first end 1301 of the micro-semiconductor chip 130 may have a first surface property, and a second end 1302 of the micro-semiconductor chip 130 may have a second surface property. The first surface property and the second surface property may be opposite to each other. For example, the first surface property may be liquid-repellent, and the second surface property may be lyophilic.

For example, an electrode having liquid repellency may be disposed in the first end 1301 of the micro-semiconductor chip 130, and the second end 1302 of the micro-semiconductor chip 130 may have a lyophilic property. Because the liquid L is present in the groove 110, the micro-semiconductor chip 130 may have a relatively stable posture in which the second end 1302 having the lyophilic property faces downward and the first end 1301 having the liquid repellency faces upward. Accordingly, the liquid L is absorbed in the process in which the absorber 21 passes through the groove 110 while contacting the surface of the transfer substrate 120, and the first end 1301 of the micro-semiconductor chip 130 is aligned in an upward-facing posture.

Figure 28:
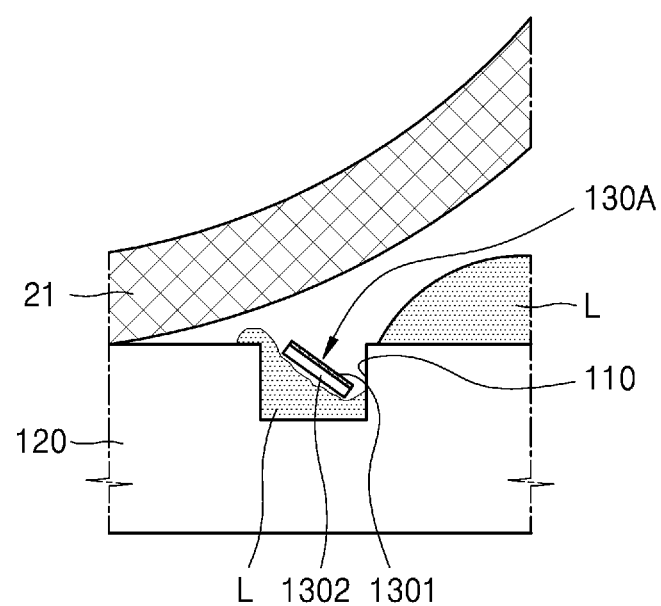
FIGS. 28 and 29 illustrate a process of aligning micro-semiconductor chips having different surface characteristics.
Figure 29:
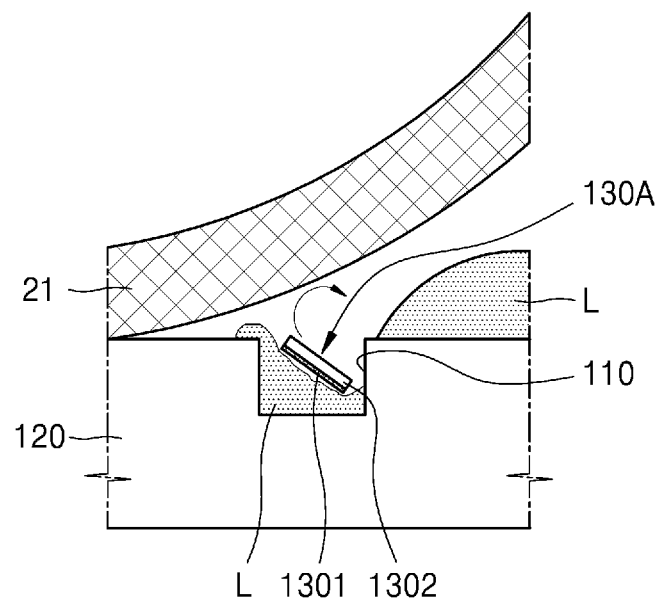

If the micro-semiconductor chip 130 is located in the groove 110 of the transfer substrate 120 so that the first end 1301 faces downward, as shown in FIG. 29, the first end 1301 having the liquid repellency of the micro-semiconductor chip 130 may be in an unstable state due to the contact with the liquid L. Accordingly, during the process in which the absorber 21 passes through the groove 110 while contacting the surface of the transfer substrate 120, the liquid L may be absorbed by the absorber 21 or during the process in which the absorber 21 presses the micro-semiconductor chip 130, the micro-semiconductor chip 130 may be turned over so that the first end 1301 is in the upward-facing posture as shown in FIG. 28.

A scanning process by the absorber 21 may be repeatedly performed. When the liquid L is absorbed during the scanning process by the absorber 21 and is insufficient, the liquid L may also be repeatedly supplied by the liquid supply module 11. During this operation, the height of the liquid L present on the transfer substrate 120 may be repeatedly increased or decreased.

The pressure applied by the absorber 21 to the transfer substrate 120 and the micro-semiconductor chip 130 may be determined in consideration of a material of the absorber 21, a moving speed of the absorber 21, a strength of the transfer substrate 120, and a support state of the transfer substrate 120. The pressure at which the absorber 21 presses the transfer substrate 120 may be determined in consideration of the material of the absorber 21, the moving speed of the absorber 21, the strength of the transfer substrate 120, and the support state of the transfer substrate 120, thereby preventing the micro-semiconductor chip 130 from being damaged, the transfer substrate 120 from being damaged, the transfer substrate 120 from being shaken, etc. by the absorber 21.

Figure 30:
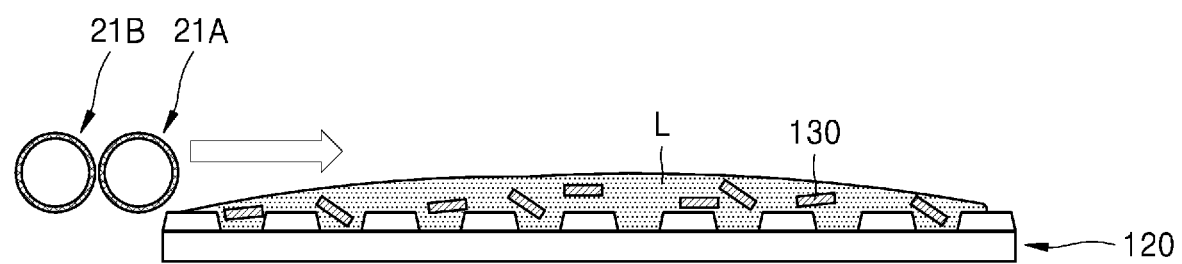
FIG. 30 is a diagram illustrating an example in which a chip alignment module according to an example embodiment includes a plurality of absorbers.

The absorber 21 may be singular, but is not limited thereto. As shown in FIG. 30, there may be a plurality of absorbers 21A and 21B.

Figure 31:
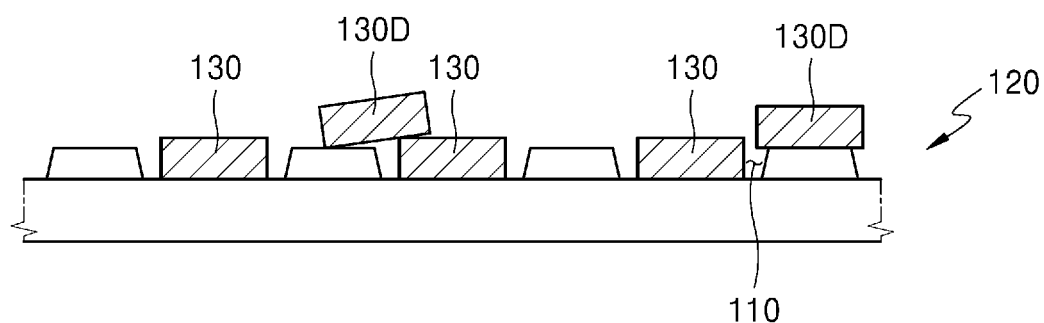
FIG. 31 is a diagram illustrating a state in which a dummy micro semiconductor chip is present on a transfer substrate.

According to an example embodiment, in the process of scanning the transfer substrate 120 by the absorber 21, as shown in FIG. 31, the plurality of micro-semiconductor chips 130 are inserted into and aligned in the grooves 110 of the transfer substrate 120. In this case, some of the micro-semiconductor chips 130 may be positioned on the surface of the transfer substrate 120 without being inserted into the grooves 110. The micro-semiconductor chip 130 may be referred to as a dummy micro-semiconductor chip 130D. Almost no liquid L may remain on the transfer substrate 120 due to evaporation or absorption. In this case, the dummy micro-semiconductor chip 130D may have poor fluidity.

The cleaning module 30 may be configured to remove the dummy micro-semiconductor chip 130D remaining on the surface of the transfer substrate 120 after the plurality of micro-semiconductor chips 130 are completely aligned in the plurality of grooves 110 by the chip alignment module 20. The cleaning module 30 may remove the dummy micro-semiconductor chip 130D using various methods.

Figure 32:
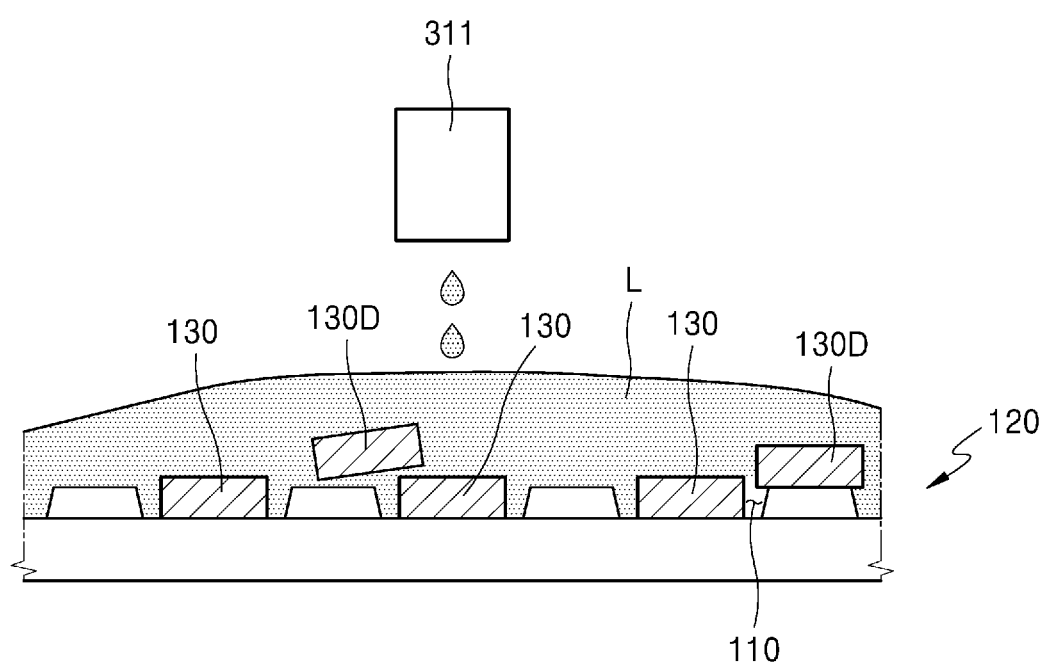
FIGS. 32 and 33 are diagrams illustrating an operation of a cleaning module according to an example embodiment.
Figure 33:
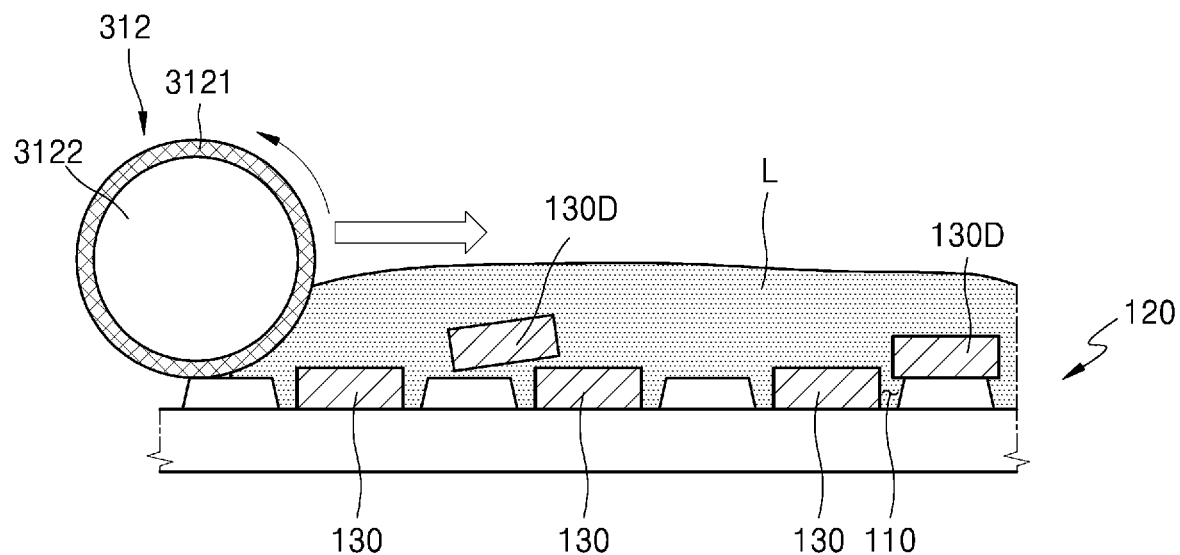

As an example, referring to FIGS. 32 and 33, the cleaning module 30 may include a second liquid supply module 311 and a pressurization module 312.

The second liquid supply module 311 may supply the liquid L onto the transfer substrate 120 in order to increase the fluidity of the dummy micro-semiconductor chip 130D.

The liquid L may be any type of liquid L as long as it does not corrode or damage the micro-semiconductor chip 130. The liquid L may be the same as the liquid L supplied by the liquid supply module 11, but is not limited thereto and may be different.

The liquid L may include, for example, at least one from a group including water, ethanol, alcohol, polyol, ketone, halocarbon, acetone, flux, and an organic solvent. The organic solvent may include, for example, isopropyl alcohol (IPA). The liquid L is not limited thereto, and various changes are possible.

In a state in which the liquid L is supplied, the pressurization module 312 may move while contacting and pressing the surface of the transfer substrate 120.

The pressure applied to the transfer substrate 120 by the pressurization module 312 may be greater than the pressure applied to the transfer substrate 120 by the absorber 21 of the chip alignment module 20. Accordingly, it is possible to easily separate the dummy micro-semiconductor chip 130D attached to the surface of the transfer substrate 120 in the scanning operation by the chip alignment module 20.

Figure 34:
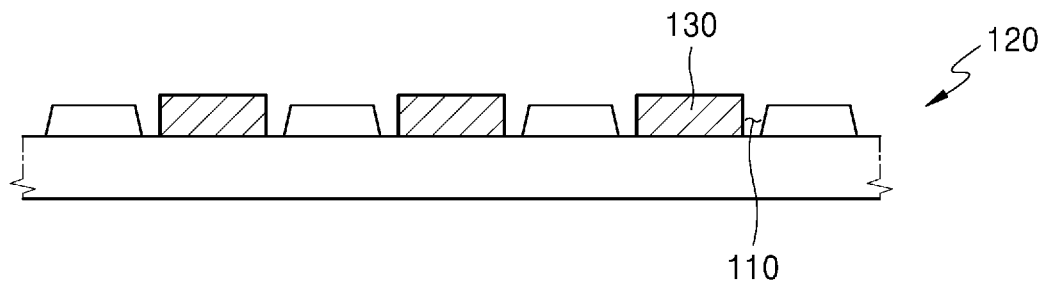
FIG. 34 is a diagram illustrating a transfer substrate in a state in which a cleaning operation is completed.

The dummy micro-semiconductor chip 130D may be separated from the surface of the transfer substrate 120 by the pressurization module 312 and may be transferred to the outside of the transfer substrate 120. Accordingly, as shown in FIG. 34, the transfer substrate 120 may be in a state in which the plurality of micro-semiconductor chips 130 are aligned in the plurality of grooves 110 and the dummy micro-semiconductor chip 130D is removed.

The pressurization module 312 may be a member capable of pressurizing the dummy micro-semiconductor chip 130D to an extent that the pressurization module 312 does not damage the dummy micro-semiconductor chip 130D.

As an example, the pressurization module 312 may include an absorber 3121 that absorbs the liquid L. The absorber 3121 may include, for example, fabric, tissue, polyester fiber, paper or wiper. The absorber 3121 may be used alone without other auxiliary devices. The pressurization module 312 may include a supporting plate 3122 supporting the absorber 3121. For example, the supporting plate 3122 may include a rod, a blade, a plate, a wiper, or the like. The absorber 3121 may be provided on either side of the supporting plate 3122 or may have a shape in which the absorber 3121 is wound around a circumference of the supporting plate 3122.

Figure 35:
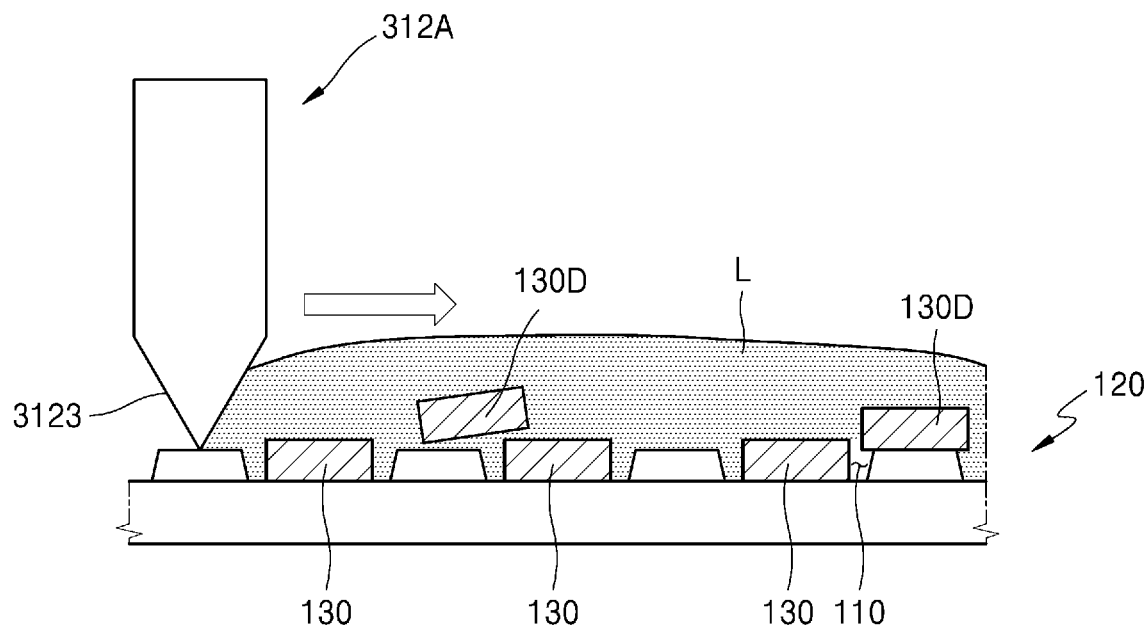
FIG. 35 is a diagram illustrating a pressurization member of a cleaning module according to another example embodiment.

As another example, as shown in FIG. 35, the pressurization module 312A may include an elastic member 3123 which is elastically deformable instead of the absorber 3121 shown in FIG. 33. For example, the elastic member 3123 may include a silicone material.

Referring back to FIG. 33, the dummy micro-semiconductor chip 130D may adhere to a surface of the absorber 3121 in the pressurization module 312 during a cleaning process. In consideration of this point, the pressurization module 312 may have a rotatable structure. For example, the absorber 3121 may rotate with respect to a rotation axis. The absorber 3121 may rotate for a period of time under a certain condition, and thus a surface of the absorber 3121 to which the dummy micro-semiconductor chip 130D adheres may be disposed at a rear end, and a clean surface of the absorber 3121 to which the dummy micro-semiconductor chip 130D does not adhere may be disposed at a front end in a moving direction of the pressurization module 312. According to an example embodiment, the period of time may be predetermined and the condition may be predetermined. Accordingly, the surface of the transfer substrate 120 may be prevented from being contaminated by the pressurization module 312.

However, the configuration of the cleaning module 30 is not limited thereto, and may be variously modified.

Figure 36:
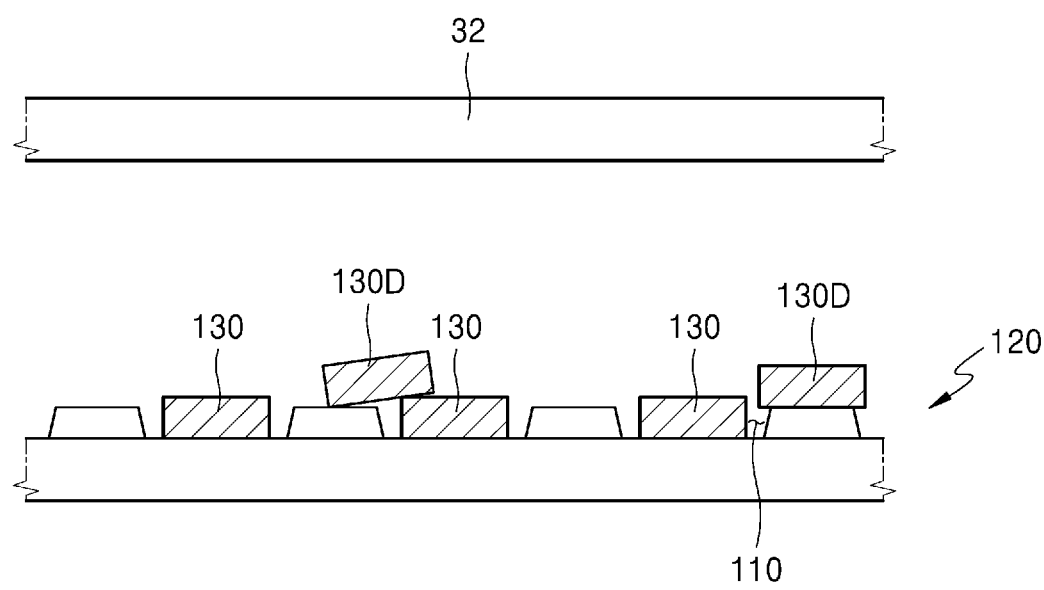
FIGS. 36 and 37 are diagrams illustrating an example of a cleaning module according to another example embodiment.
Figure 37:
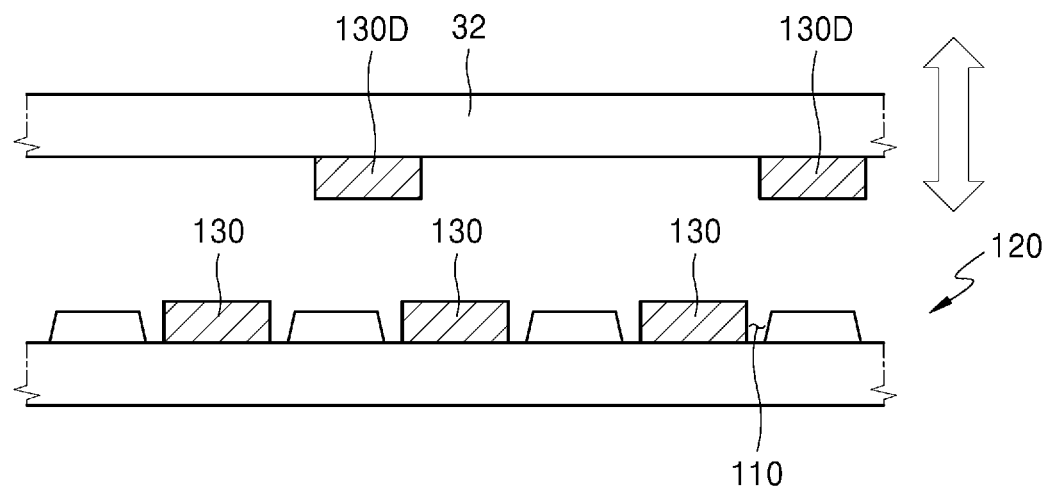

As an example, referring to FIGS. 36 and 37, the cleaning module 30 may include an adhesive member 32. The cleaning module 30 may be configured to move the adhesive member 32 to approach and be spaced apart from the transfer substrate 120. The adhesive member 32 may approach a height where only the dummy micro-semiconductor chip 130D is in contact without contacting the surface of the transfer substrate 120. In this process, only the dummy micro-semiconductor chip 130D may be selectively adhered to the adhesive member 32. Accordingly, only the dummy micro-semiconductor chip 130D may be selectively removed from the transfer substrate 120.

Figure 38:
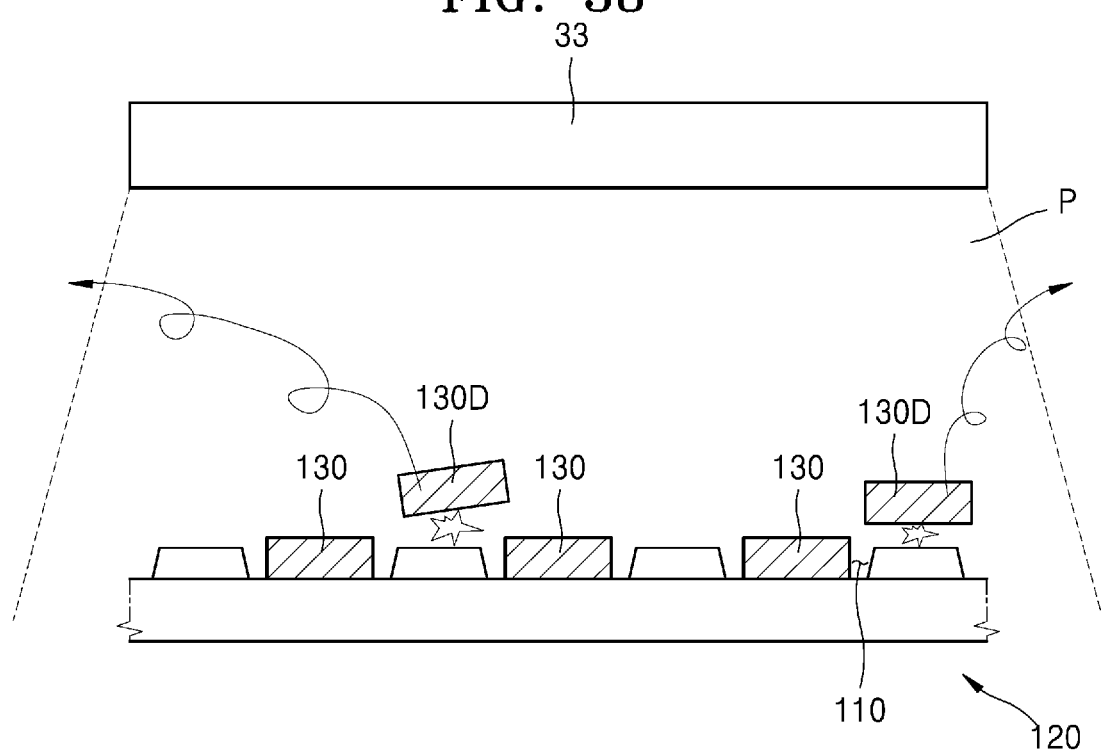
FIG. 38 is a diagram illustrating an example of a cleaning module according to another example embodiment.

As another example, referring to FIG. 38, the cleaning module 30 may include a light irradiator 33 that irradiates a pulsed light P onto the transfer substrate 120. The light irradiator 33 may be a pulse lamp. For example, the light irradiator 33 may be a Xenon lamp. The liquid L or a foreign matter expands between the surface of the transfer substrate 120 and the dummy micro-semiconductor chip 130D by the pulsed light P provided on the transfer substrate 120, and thus the dummy micro-semiconductor chip 130D may be separated from the surface of the transfer substrate 120.

Figure 39:
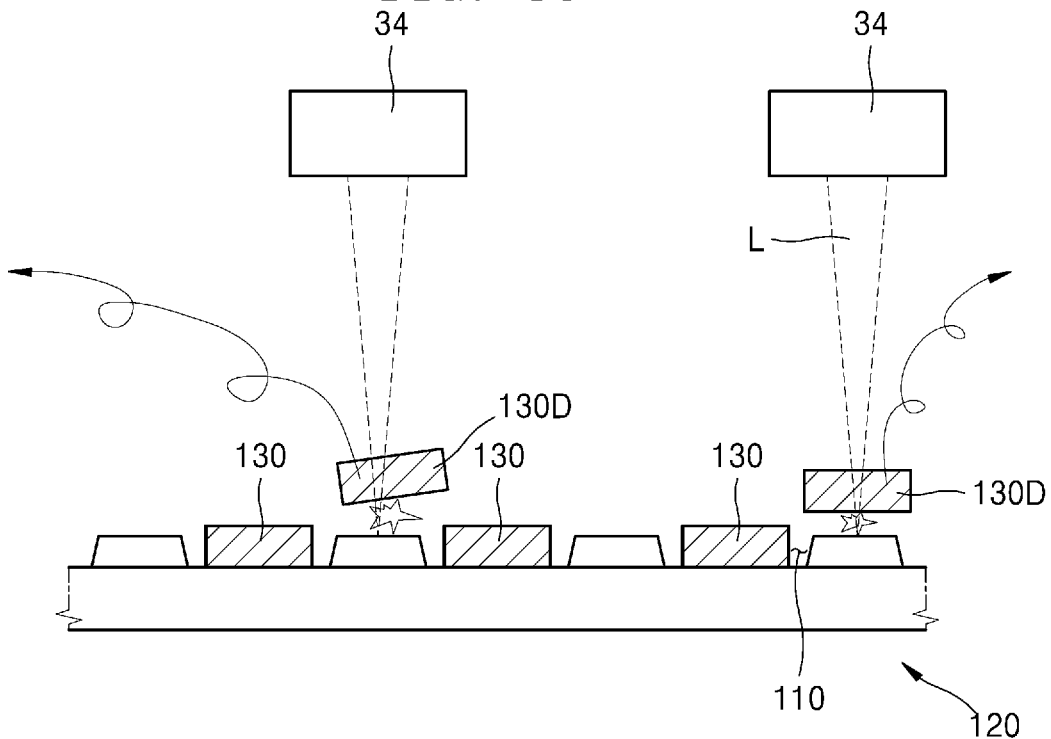
FIG. 39 is a diagram illustrating an example of a cleaning module according to another example embodiment.

As another example, referring to FIG. 39, the cleaning module 30 may include a laser irradiator 34 that locally irradiates a laser beam L on the transfer substrate 120. The laser irradiator 34 may locally irradiate the laser beam L between the dummy micro-semiconductor chip 130D and the surface of the transfer substrate 120. The laser irradiator 34 may selectively focus the laser beam L on a lower region of the dummy micro-semiconductor chip 130D to separate the dummy micro-semiconductor chip 130D from the surface of the transfer substrate 120.

Figure 40:
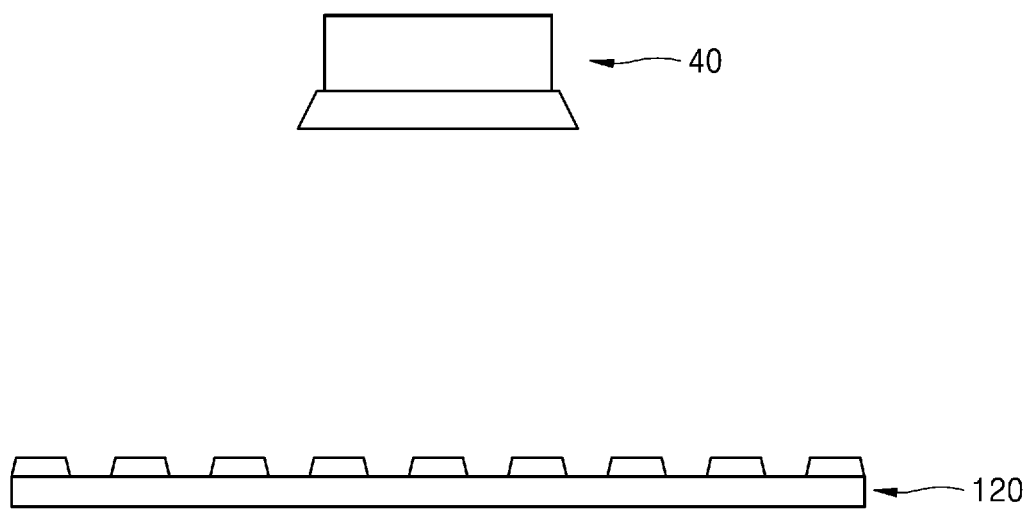
FIGS. 40 and 41 are diagrams illustrating an operation of an inspection module according to an example embodiment.

Referring to FIGS. 1 and 40, the micro-semiconductor chip wet alignment apparatus 1 according to the example embodiment may further include an inspection module 40 that inspects a state of the transfer substrate 120. The inspection module 40 may be a camera capable of analyzing a high-resolution image. The inspection module 40 may inspect the state of the transfer substrate 120 through image analysis.

As an example, the inspection module 40 may inspect an alignment state of the micro-semiconductor chip 130 on the transfer substrate 120. Based on results of inspection by the inspection module 40, the controller 70 may control at least one of the semiconductor chip wet supply module 10 and the chip alignment module 20 to operate. Accordingly, it is possible to improve an alignment accuracy of the plurality of micro-semiconductor chips 130.

Figure 41:
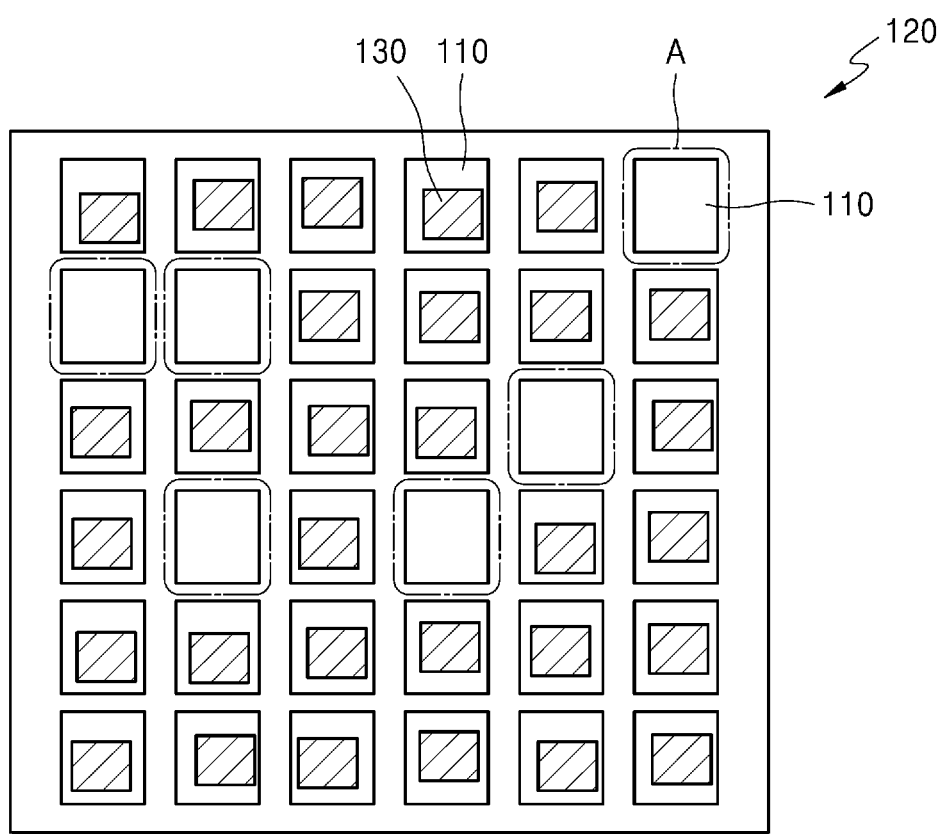

For example, as shown in FIG. 41, as a result of the inspection by the inspection module 40, a position A of the groove 110 in which the micro-semiconductor chip 130 is not aligned among the plurality of grooves 110 of the transfer substrate 120 may be identified. In this case, based on results of inspection by the inspection module 40, the controller 70 may control at least one of the semiconductor chip wet supply module 10 and the chip alignment module 20 to operate with respect to the identified position A of the groove 110.

As another example, the inspection module 40 may inspect a supply state of the plurality of micro-semiconductor chips 130 and the liquid L on the transfer substrate 120.

For example, the inspection module 40 may inspect whether the liquid L is present on the transfer substrate 120 or whether the liquid L is sufficient even if the liquid L is present. Based on results of inspection by the inspection module 40, the controller 70 may control the liquid supply module 11 to operate.

For example, the inspection module 40 may inspect whether the plurality of micro-semiconductor chips 130 are present on the transfer substrate 120, or whether the plurality of micro-semiconductor chips 130 are sufficient even if the plurality of micro-semiconductor chips 130 are present. Based on results of inspection by the inspection module 40, the controller 70 may control the chip supply module 12 to operate.

As described above, the controller 70 controls at least one of the semiconductor chip wet supply module 10 and the chip alignment module 20 to operate based on results of inspection of the inspection module 40, thereby improving the alignment accuracy of the plurality of micro-semiconductor chips 130.

Figure 42:
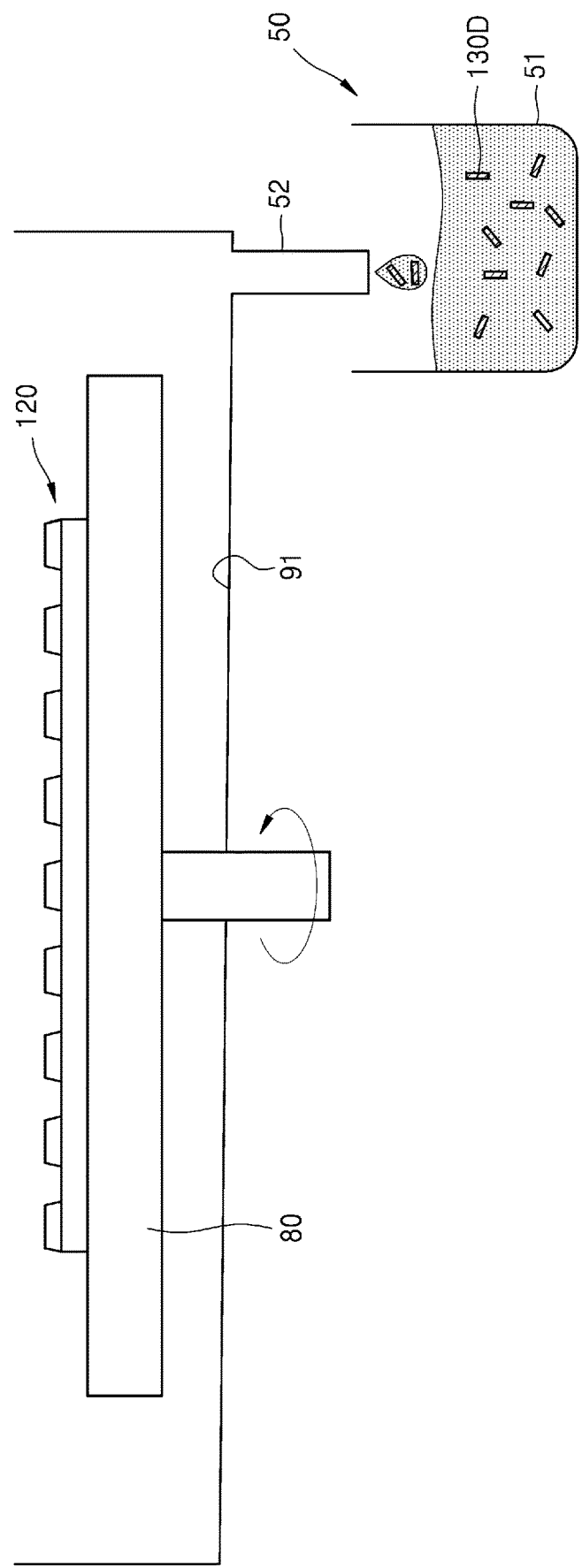
FIG. 42 is a diagram illustrating a configuration of a semiconductor chip wet alignment apparatus for supporting a transfer substrate and peripheral members thereof.

FIG. 42 is a diagram illustrating a configuration of a semiconductor chip wet alignment apparatus 1 for supporting the transfer substrate 120 and peripheral members thereof. Referring to FIG. 42, the micro-semiconductor chip wet alignment apparatus 1 according to the example embodiment may include a substrate support 80 and a recovery module 50.

The substrate support 80 may support the transfer substrate 120. The substrate support 80 supports the transfer substrate 120 so that the transfer substrate 120 does not unintentionally move during relative movement of the absorber 21 and the transfer substrate 120. The substrate support 80 may adsorb and support a lower surface of the transfer substrate 120. The substrate support 80 may be rotatable. However, a support structure and an operation of the substrate support 80 are not limited thereto, and may be variously modified.

The recovery module 50 may recover the dummy micro-semiconductor chip 130D. The recovery module 50 may include an accommodator 51 that accommodates the dummy micro-semiconductor chip 130D separated from the transfer substrate 120. The dummy micro-semiconductor chip 130D accommodated in the accommodator 51 may be recycled. The recovery module 50 may have a structure in which a fluid flows toward the accommodator 51 on a bottom surface 91 so that the micro-semiconductor chip 130 is transferred toward the accommodator 51. The bottom surface 91 may have a shape inclined downward toward a drain hole 52.

Figure 43:
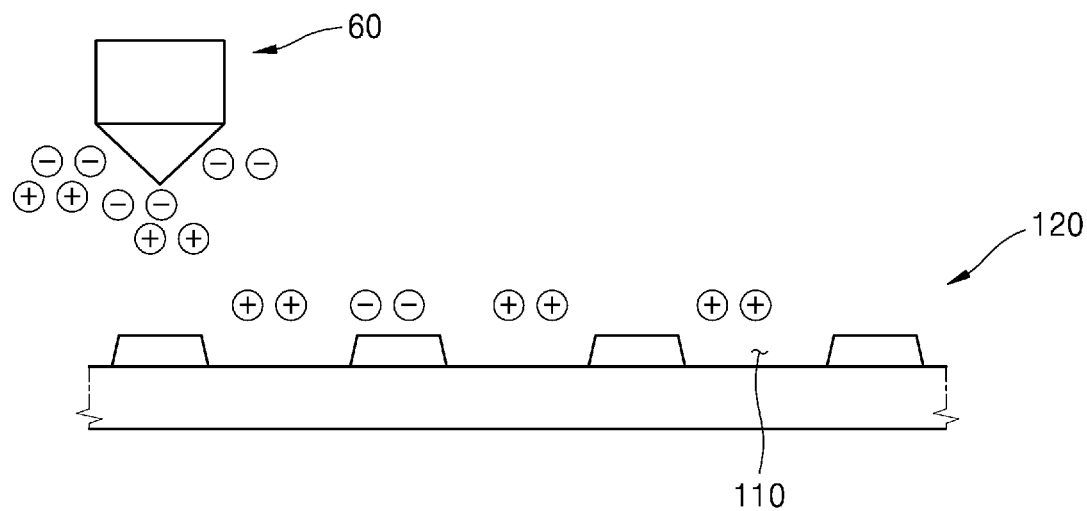
FIGS. 43 and 44 are diagrams illustrating an operation of an antistatic module according to an example embodiment.
Figure 44:
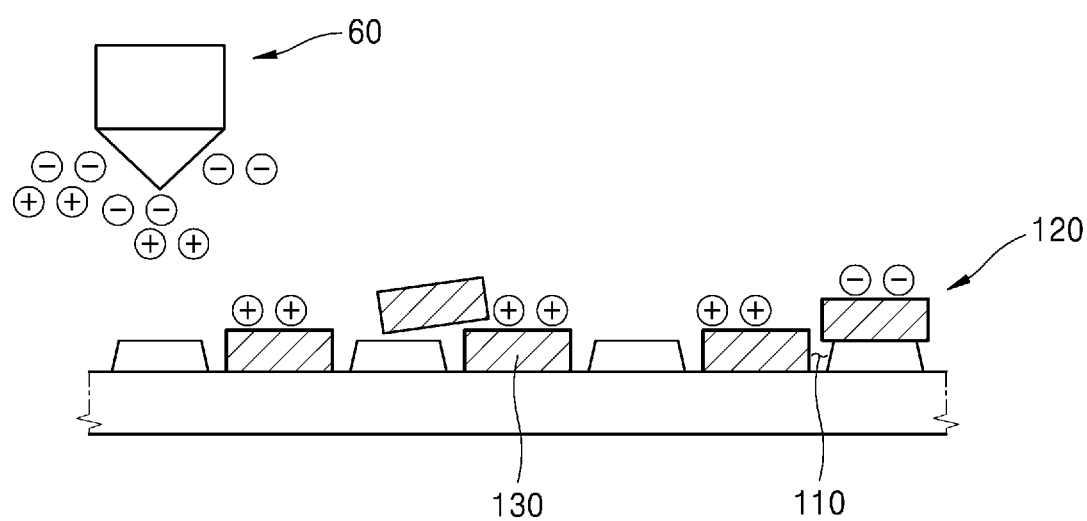

Referring to FIGS. 1, 43, and 44, the micro-semiconductor chip wet alignment apparatus 1 according to the example embodiment may further include an antistatic module 60 supplying ions onto the transfer substrate 120 to remove static electricity on the transfer substrate 120

The plurality of micro-semiconductor chips 130 have a very small size, and accordingly, the plurality of micro-semiconductor chips 130 may be damaged or may unintendedly move even due to a small static electricity. In consideration of this point, the antistatic module 60 may supply ions for preventing static electricity to the transfer substrate 120 or the plurality of micro-semiconductor chips 130.

According to an example embodiment, referring to FIG. 43, the antistatic module 60 may supply ions for preventing static electricity to the transfer substrate 120 before the plurality of micro-semiconductor chips 130 are supplied onto the transfer substrate 120. According to another example embodiment, referring to FIG. 44, the antistatic module 60 may supply ions for preventing static electricity after the plurality of micro-semiconductor chips 130 are supplied onto the transfer substrate 120 and aligned to some extent.

Figure 45A:
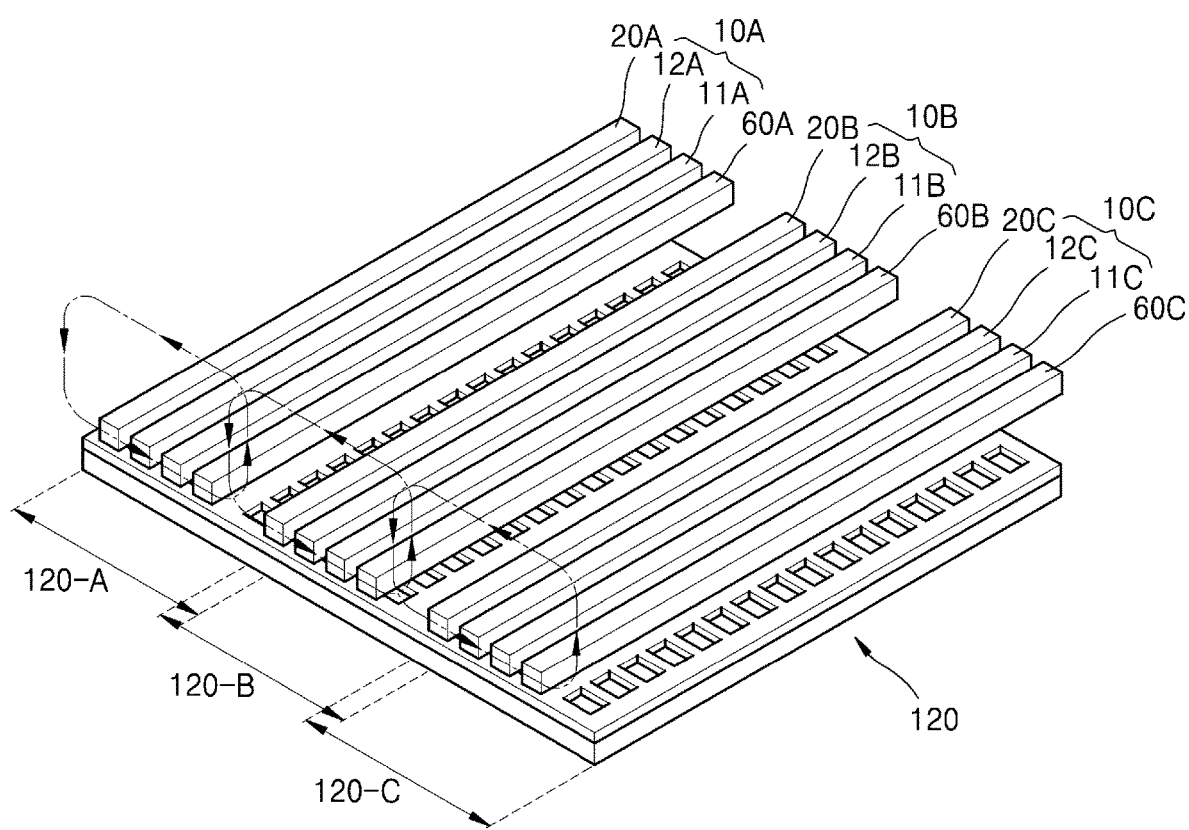
FIGS. 45A, 45B, and 45C are conceptual diagrams illustrating a micro-semiconductor chip wet alignment apparatus according to an example embodiment.
Figure 45B:
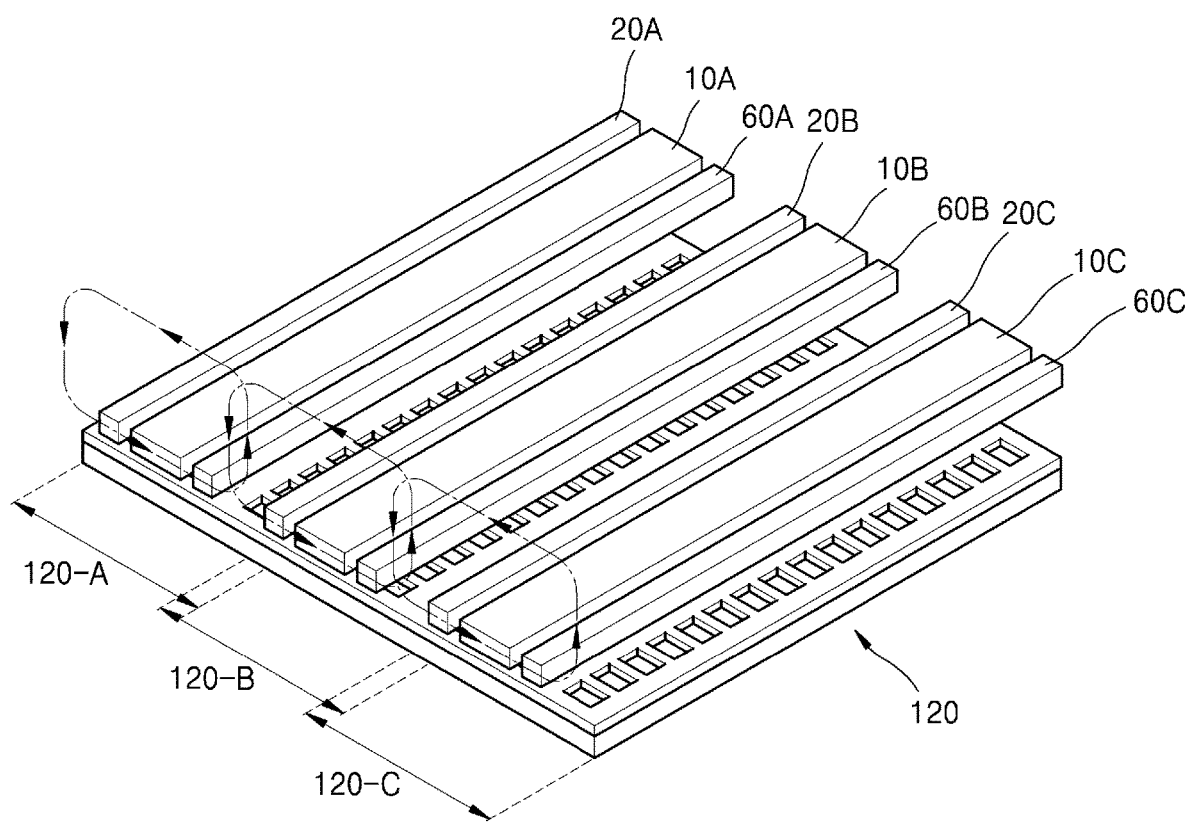
Figure 45C:
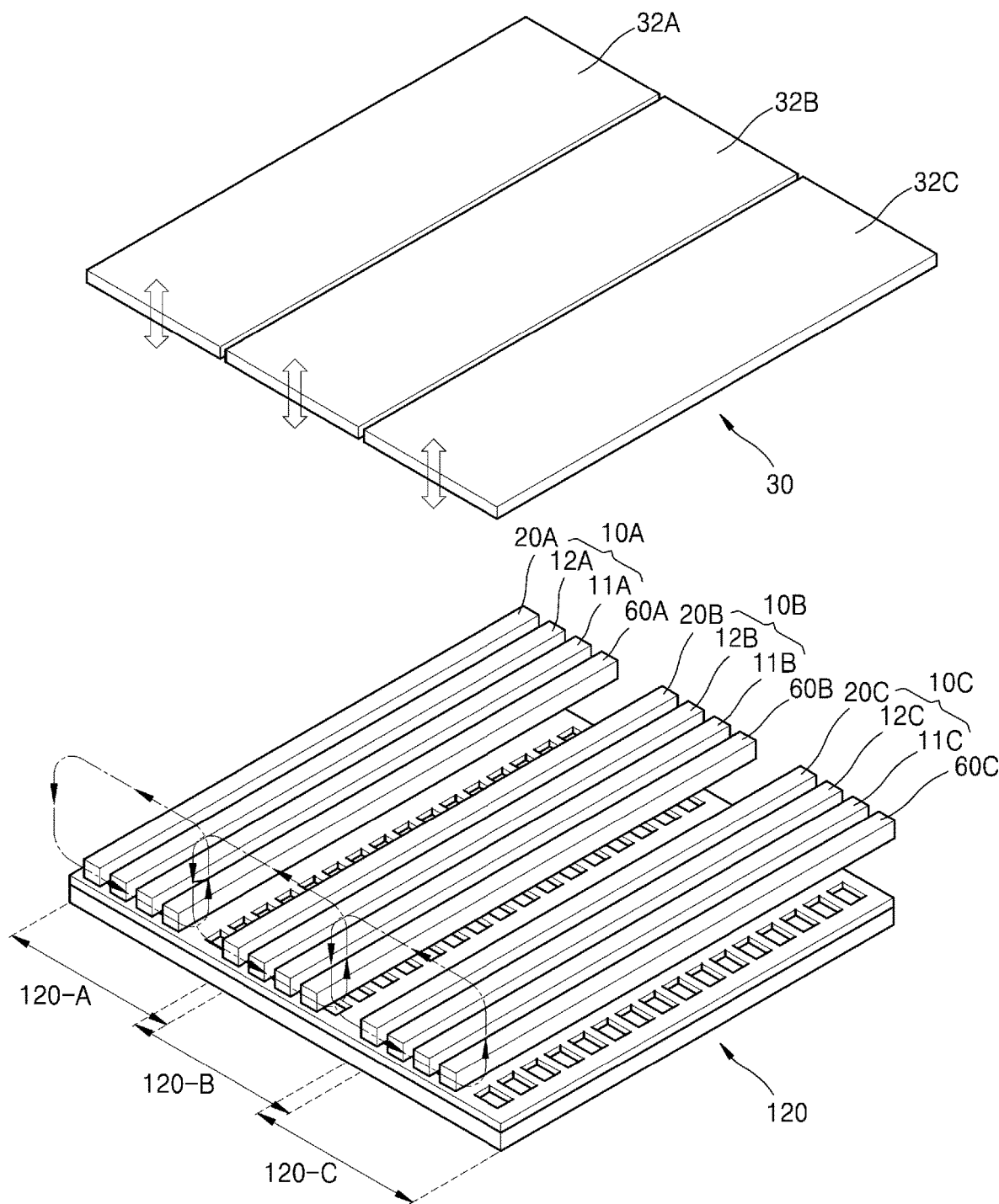

FIGS. 45A, 45B, and 45C are conceptual diagrams illustrating the micro-semiconductor chip wet alignment apparatus 1 according to an example embodiment. Referring to FIGS. 45A, 45B, and 45C, semiconductor chip wet supply modules 10A, 10B, and 100 and chip alignment modules 20A, 20B, and 20C may be each provided in plurality.

The plurality of semiconductor chip wet supply modules 10A, 10B, and 10C and the plurality of chip alignment modules 20A, 20B, and 20C divide the transfer substrate 120 into a plurality of regions to supply and align the plurality of micro-semiconductor chips 130.

The plurality of semiconductor chip wet supply modules 10A, 10B, and 10C include first, second, and third semiconductor chip wet supply modules 10A, 10B, and 10C spaced apart in a moving direction. The first, second, and third semiconductor chip wet supply modules 10A, 10B, and 100 may respectively include liquid supply modules 11A, 11B, and 11C and chip supply modules 12A, 12B, and 12C. In the example embodiment, an example in which the plurality of semiconductor chip wet supply modules 10A, 10B, and 10C and the plurality of chip alignment modules 20A, 20B, and 20C are three is described, but the example embodiment is not limited thereto, and the plurality of semiconductor chip wet supply modules 10A, 10B, and 100 and the plurality of chip alignment modules 20A, 20B, and 20C may be two or four or more.

The first semiconductor chip wet supply module 10A may sequentially or simultaneously supply the liquid L and the micro-semiconductor chip 130 onto a first region 120-A of the transfer substrate 120. The second semiconductor chip wet supply module 10B may sequentially or simultaneously supply the liquid L and the micro-semiconductor chip 130 onto a second region 120-B of the transfer substrate 120. The third semiconductor chip wet supply module 10C may sequentially or simultaneously supply the liquid L and the micro-semiconductor chip 130 onto a third region 120-C of the transfer substrate 120.

The plurality of chip alignment modules 20A, 20B, and 20C include first, second, and third chip alignment modules 20A, 20B, and 20C spaced apart in the moving direction.

The first chip alignment module 20A may align the micro-semiconductor chip 130 supplied onto the first region 120-A of the transfer substrate 120 in the groove 110 of the transfer substrate 120. The second chip alignment module 20B may align the micro-semiconductor chip 130 supplied onto the second region 120-B of the transfer substrate 120 in the groove 110 of the transfer substrate 120. The third chip alignment module 20C may align the micro-semiconductor chip 130 supplied onto the third region 120-C of the transfer substrate 120 in the groove 110 of the transfer substrate 120.

First, second, and third antistatic modules 60A, 60B, and 60C may be respectively disposed in front of the first, second, and third semiconductor chip wet supply modules 10A, 10B, and 10C in the moving direction. The first, second, and third antistatic modules 60A, 60B, and 60C may remove static electricity on the transfer substrate 120 by respectively supplying ions for preventing static electricity onto the first, second, and third regions 120-A, 120-B, and 120-C of the transfer substrate 120.

Each of the plurality of semiconductor chip wet supply modules 10A, 10B, and 100 and the plurality of chip alignment modules 20A, 20B, and 20C may supply the plurality of micro-semiconductor chips 130 and the liquid L, and then align the plurality of micro-semiconductor chips 130 in the plurality of grooves 111 while moving relative to the transfer substrate 120 in a predetermined direction. The plurality of semiconductor chip wet supply modules 10A, 10B, and 100 and the plurality of chip alignment modules 20A, 20B, and 20C may circulate in a direction indicated by an arrow in order to repeat at least one of an operation of supplying the plurality of micro-semiconductor chips 130 and the liquid L and an operation of aligning the plurality of micro-semiconductor chips 130.

The first region 120-A and the second region 120-B of the transfer substrate 120 may partially overlap, and the second region 120-B and the third region 120-C may partially overlap. As described above, the first, second, and third regions 120-A, 120-B, and 120-C partially overlap, thereby preventing the first, second, and third regions 120-A, 120-B, and 120-C from aligning in the boundary thereof discontinuously with a peripheral region.

As described above, the micro-semiconductor chip wet alignment apparatus 1 may divide the transfer substrate 120 into the plurality of regions such as the first, second, and third regions 120-A, 120-B, and 120-C and supply and align the micro-semiconductor chips 130, thereby quickly aligning the plurality of micro-semiconductor chips 130 in the plurality of grooves 110 even in the transfer substrate 120 having a large area.

In the micro-semiconductor chip wet alignment apparatus 1 according to the above-described example embodiment, an example in which the liquid L is supplied by the liquid supply modules 11A, 11B, and 11C, and the micro-semiconductor chips 130 are supplied by the chip supply modules 12A, 12B, and 12C is described, but the example embodiment is not necessarily limited thereto. For example, referring to FIG. 45B, the semiconductor chip wet supply modules 10A, 10B, and 100 may simultaneously supply the liquid L and the plurality of micro-semiconductor chips 130 in one body.

In addition, the micro-semiconductor chip wet alignment apparatus 1 may further include the cleaning module 30. The cleaning module 30 may be configured so that other adjacent regions of the transfer substrate 120 are not contaminated in a cleaning operation on a partial region of the transfer substrate 120. For example, as shown in FIG. 45C, the cleaning module 30 may selectively remove the dummy micro-semiconductor chip 130D without contamination of a peripheral region through a plurality of adhesive members 32A, 32B, and 32C. However, the cleaning module 30 is not limited thereto, and as shown in FIGS. 32 to 39, may sequentially or simultaneously remove the dummy micro-semiconductor chip 130D present on the entire region of the transfer substrate 120.

Figure 46:
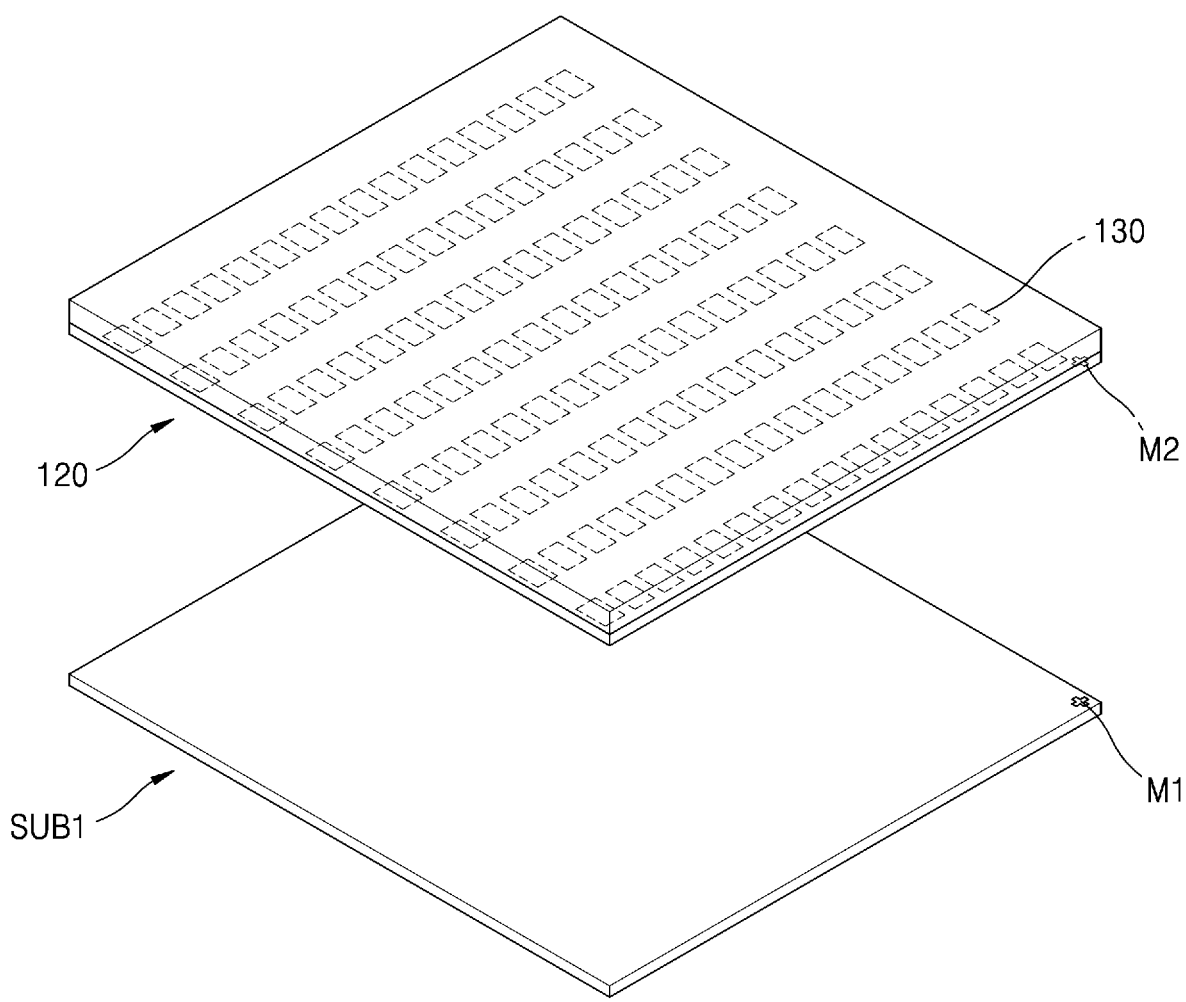
FIGS. 46 and 47 illustrate examples of a process of transferring a transfer substrate to another substrate.

Referring to FIG. 46, the plurality of micro-semiconductor chips 130 aligned in the plurality of grooves 110 of the transfer substrate 120 may be transferred onto another substrate SUB1. The size of the substrate SUB1 may correspond to the size of the transfer substrate 120. Alignment marks M1 and M2 for alignment may be formed at correct positions of the transfer substrate 120 and the substrate SUB1.

Figure 47:
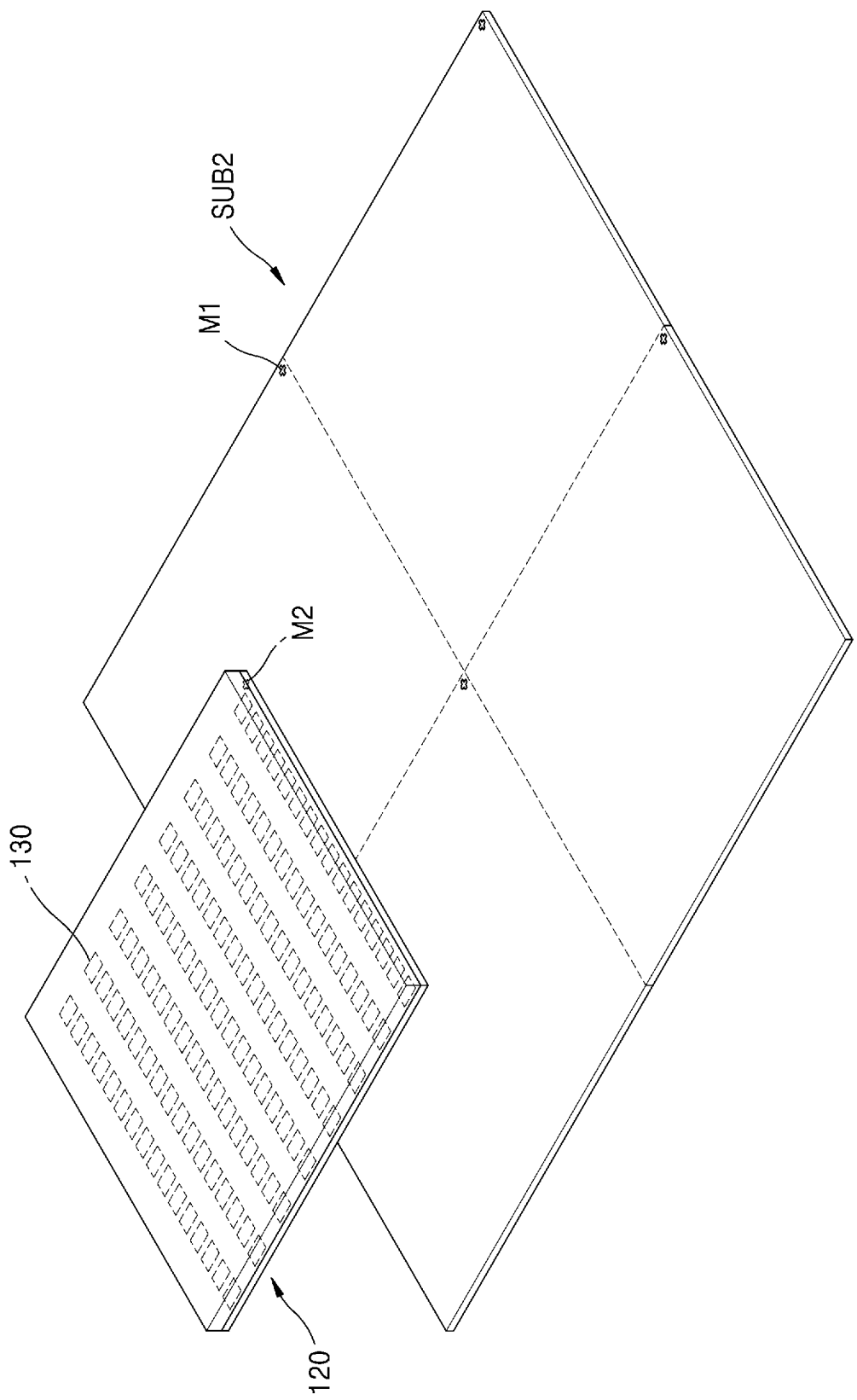

As another example, referring to FIG. 47, the size of a substrate SUB2 may be larger than the size of the transfer substrate 120. The substrate SUB2 may be equal to or greater than twice the size of the transfer substrate 120. The substrate SUB2 may be equal to or greater than four times the size of the transfer substrate 120. The substrate SUB2 may be equal to or greater than eight times the size of the transfer substrate 120.

The alignment marks M1 and M2 may be formed on the transfer substrate 120 and the substrate SUB2, respectively. Through the alignment marks M1 and M2, the transfer substrate 120 may be aligned at an exact position on the substrate SUB2.

The plurality of micro-semiconductor chips 130 are aligned on the transfer substrate 120 smaller than the substrate SUB2, and transfer is performed on the substrate SUB2 in units of the transfer substrate 120, thereby preventing a decrease in mass production that occurs when transfer is directly performed on the large substrate SUB2.

A wet alignment method of the micro-semiconductor chip 130 using the above-described micro-semiconductor chip wet alignment apparatus 1 will be described.

Figure 48:
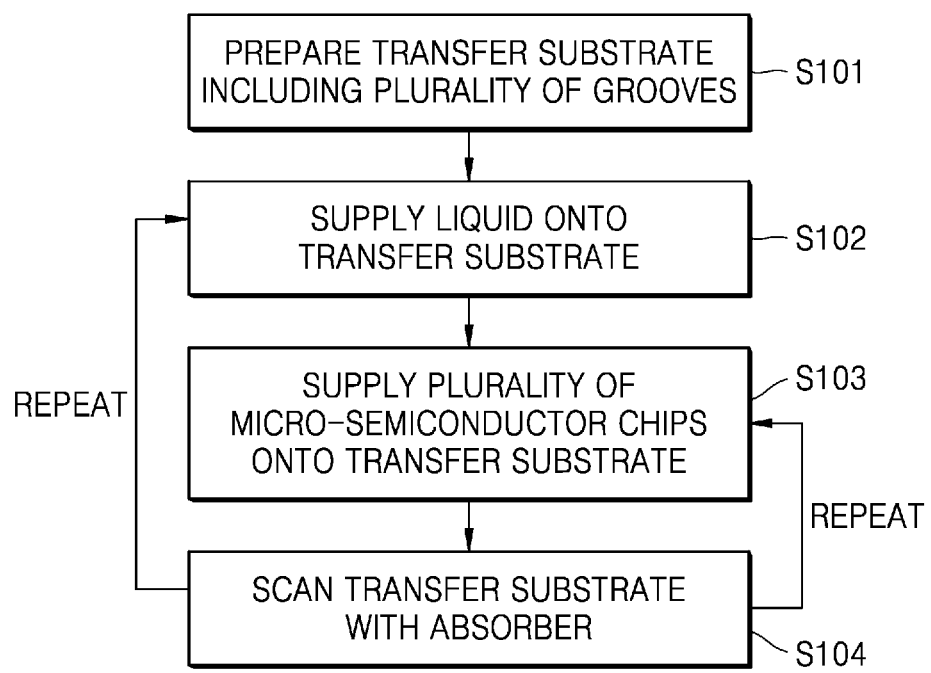
FIG. 48 is a diagram illustrating a wet alignment method of a micro-semiconductor chip according to an example embodiment.
Figure 49:
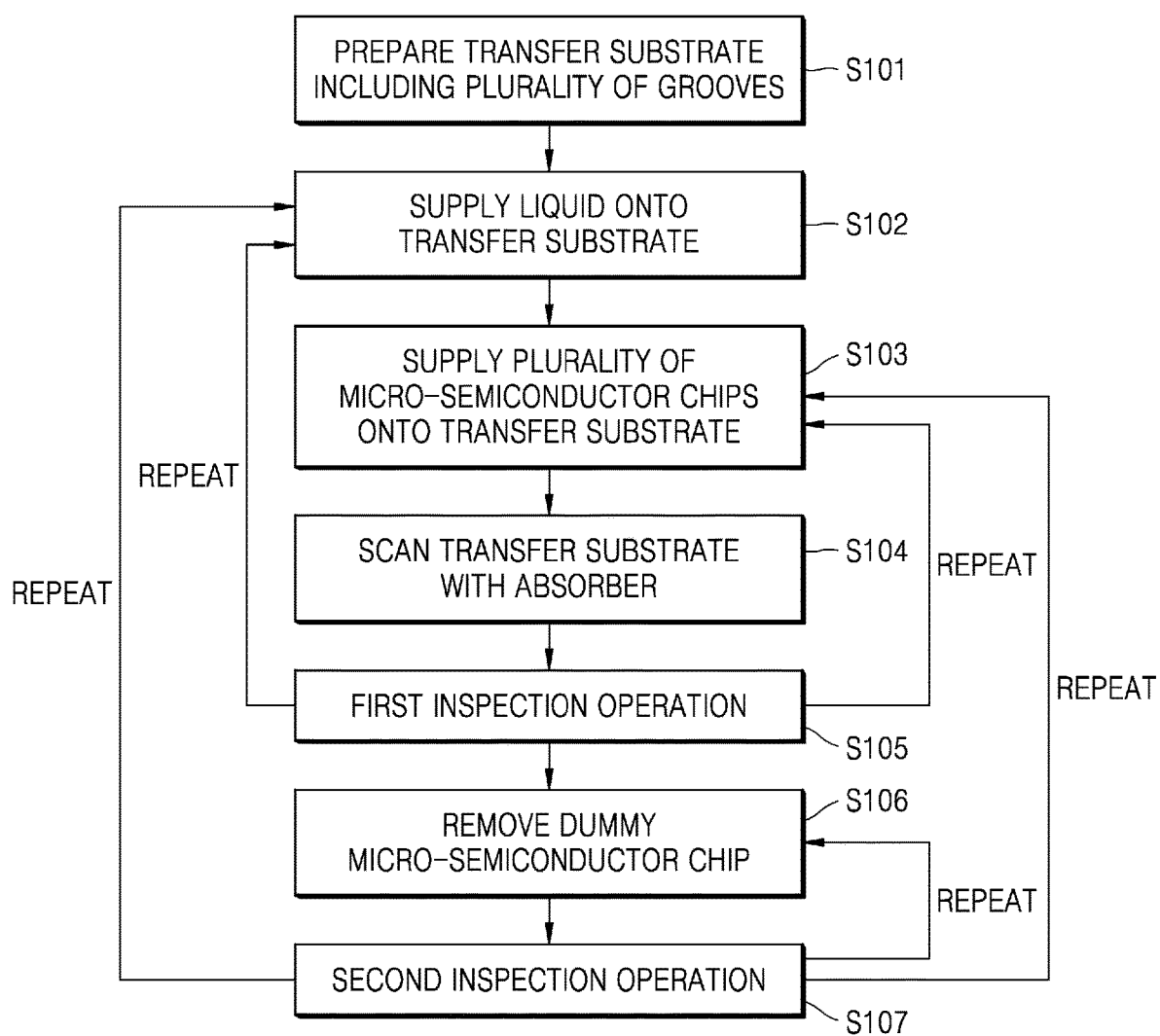
FIG. 49 is a diagram illustrating a wet alignment method of a micro-semiconductor chip according to an example embodiment.
Figure 50:
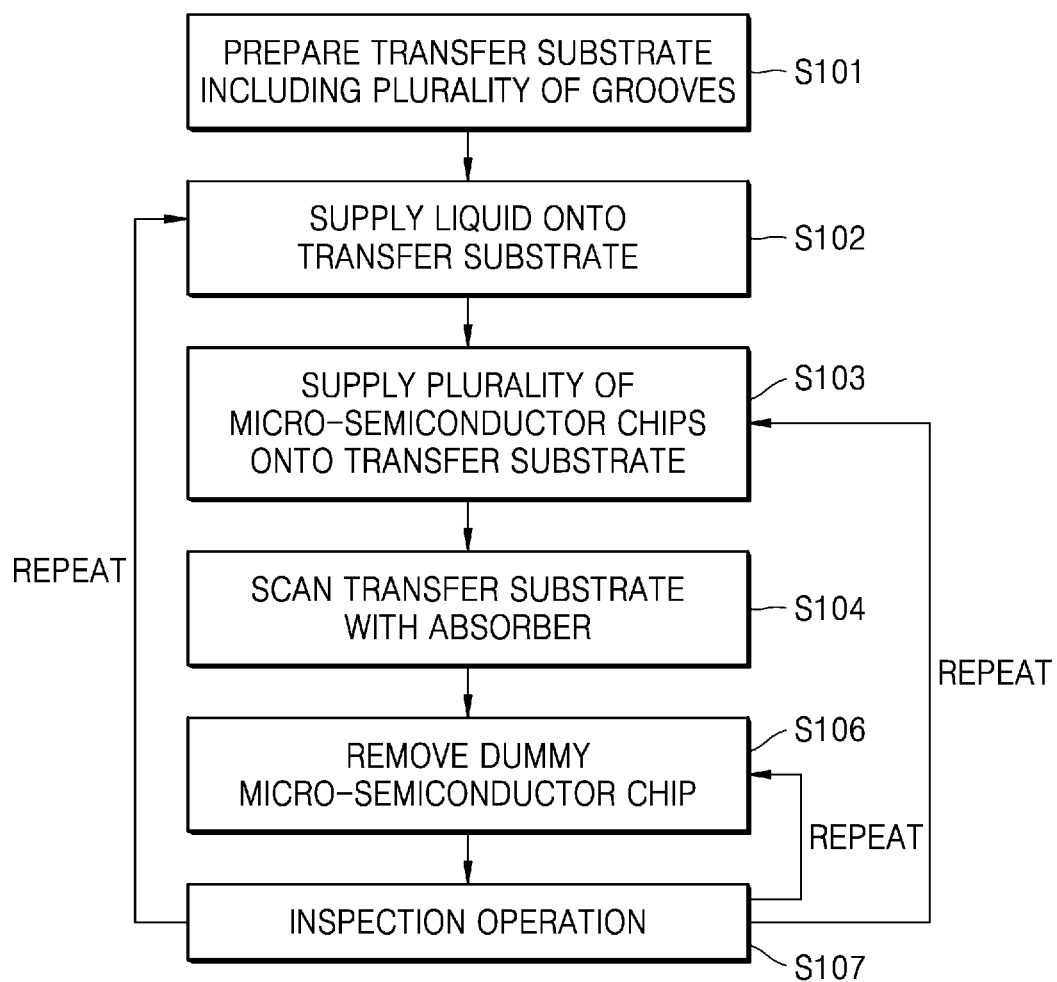
FIG. 50 is a diagram illustrating a wet alignment method of a micro-semiconductor chip according to an example embodiment.
Figure 51:
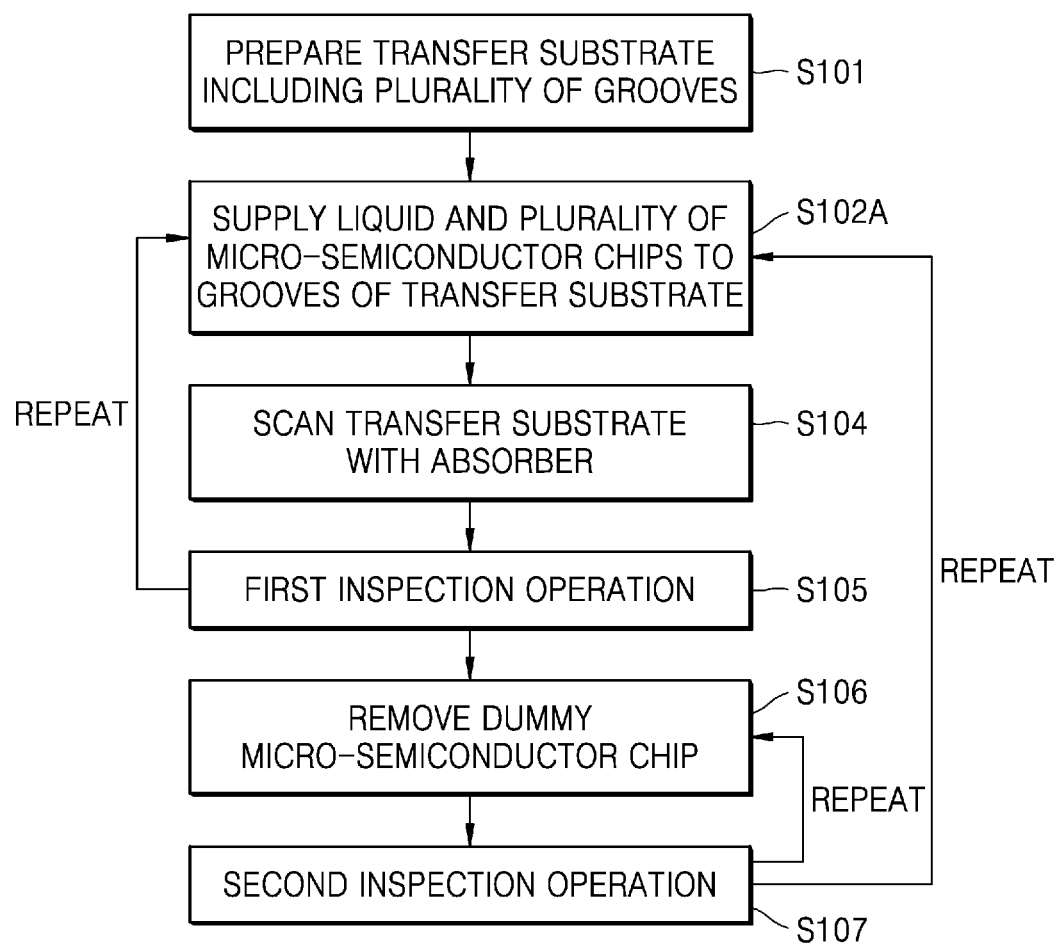
FIG. 51 is a diagram illustrating a wet alignment method of a micro-semiconductor chip according to an example embodiment.

FIG. 48 is a diagram illustrating a wet alignment method of the micro-semiconductor chip 130 according to an example embodiment. FIGS. 49 to 51 are diagrams illustrating a modified example of a wet alignment method of the micro-semiconductor chip 130 according to an example embodiment.

Referring to FIG. 48, the transfer substrate 120 including the plurality of grooves 110 is prepared (S101).

The transfer substrate 120 may be provided as a single layer or may include a plurality of layers. The plurality of grooves 110 may be provided to align the at least one micro-semiconductor chip 130.

The liquid L is supplied to the plurality of grooves 110 (S102). The liquid L may be any type of liquid L as long as it does not corrode or damage the micro-semiconductor chip 130. The liquid L may include, for example, at least one from a group including water, ethanol, alcohol, polyol, ketone, halocarbon, acetone, flux, and an organic solvent.

The organic solvent may include, for example, isopropyl alcohol (IPA). The liquid L is not limited thereto, and various changes are possible.

A method of supplying the liquid L to the plurality of grooves 110 may be variously used, such as a spray method, a dispensing method, an inkjet dot method, a method of making the liquid L flowing onto the transfer substrate 120, etc.

The plurality of micro-semiconductor chips 130 are supplied to the transfer substrate 120 (S103). The plurality of micro-semiconductor chips 130 may be directly sprayed on the transfer substrate 120 without the liquid L, or may be supplied using a material other than the liquid L. Alternatively, the micro-semiconductor chip 130 may be supplied to the transfer substrate 120 in various ways while being included in the suspension 170. In this case, the method of supplying the micro-semiconductor chip 130 may be variously used, such as a spray method, a dispensing method, an inkjet dot method, and a method of making the suspension 170 flowing onto the transfer substrate 120. The method of supplying the micro-semiconductor chip 130 to the transfer substrate 120 is not limited thereto and may be variously modified. The liquid L may be supplied to fit the groove 110, or the liquid L may be supplied so as to overflow from the groove 110. The supply amount of the liquid L may be variously adjusted.

The transfer substrate 120 is scanned with the absorber 21 capable of absorbing the liquid L (S104). The absorber 21 suffices as long as it is a material capable of absorbing the liquid L, and its shape or structure is not limited. The absorber 21 may include, for example, fabric, tissue, polyester fiber, paper or wiper. The absorber 21 may be used alone without other auxiliary devices. However, the present disclosure is not limited thereto, and the absorber 21 may be coupled to the supporting plate 22 to facilitate scanning of the transfer substrate 120 with the absorber 21. The supporting plate 22 may have various shapes and structures suitable for scanning the transfer substrate 120. The supporting plate 22 may include, for example, a rod, a blade, a plate, a wiper, or the like. The absorber 21 may be provided on either side of the supporting plate 22, or may have a shape in which the absorber 21 is wound around a circumference of the supporting plate 22.

The absorber 21 may scan the transfer substrate 120 while pressing the transfer substrate 120 at an appropriate pressure. Scanning may include an operation of allowing the absorber 21 to contact the transfer substrate 120 and to pass through the plurality of grooves 110. During scanning, the liquid L may be absorbed by the absorber 21. Scanning may be performed using various methods including at least one of, for example, a sliding method, a rotating method, a translating method, a reciprocating method, a rolling method, a spinning method, or a rubbing method of the absorber 21, and may include both a regular method and an irregular method. Alternatively, scanning may include at least one of rotating, translating, rolling, and spinning of the transfer substrate 120. Alternatively, scanning may be performed in cooperation with the absorber 21 and the transfer substrate 120.

Scanning the transfer substrate 120 with the absorber 21 may include absorbing the liquid L in the plurality of grooves 110 while the absorber 21 passes through the plurality of grooves 110. When the absorber 21 scans the transfer substrate 120, the at least one micro-semiconductor chip 130 may be attached to the absorber 21. In addition, the absorber 21 may pass through the plurality of grooves 110 by contacting the transfer substrate 120.

Referring to FIG. 49, after scanning the transfer substrate 120 with the absorber 21, a state of the transfer substrate 120 may be inspected by the inspection module 40 (S105).

Based on results of inspection by the inspection module 40, an operation of supplying the liquid L onto the transfer substrate 120 or an operation of supplying the plurality of micro-semiconductor chips 130 may be performed again.

When it is determined that the plurality of micro-semiconductor chips 130 are aligned in the grooves 110 on the transfer substrate 120 by the inspection module 40, the dummy micro-semiconductor chip 130D on the transfer substrate 120 may be removed (S106).

After removing the dummy micro-semiconductor chip 130D, a second inspection may be performed by the inspection module 40 (S107). Based on a result of the second inspection, the operation (S102) of supplying the liquid L onto the transfer substrate 120, the operation (S103) of supplying the plurality of micro-semiconductor chips 130 to the transfer substrate 120, and the operation (S106) of removing the dummy micro-semiconductor chip 130D may be performed again.

In the example embodiment of FIG. 49, an example in which the inspection operation performed by the inspection module 40 includes the first inspection operation (S105) and the second inspection operation (S107) is described, but the example embodiment is not limited thereto, and the inspection operation may be reduced or increased as shown in FIG. 50.

Referring back to FIG. 48, the operation (S102) of supplying the liquid L onto the transfer substrate 120, the operation (S103) of supplying the plurality of micro-semiconductor chips 130 to the transfer substrate 120 may be sequentially performed as separate operations or in a reverse order. In addition, as shown in FIG. 51, the operation (S102) of supplying the liquid L onto the transfer substrate 120, the operation (S103) of supplying the plurality of micro-semiconductor chips 130 to the transfer substrate 120 may also be performed simultaneously in one operation (S102A).

Figure 52:
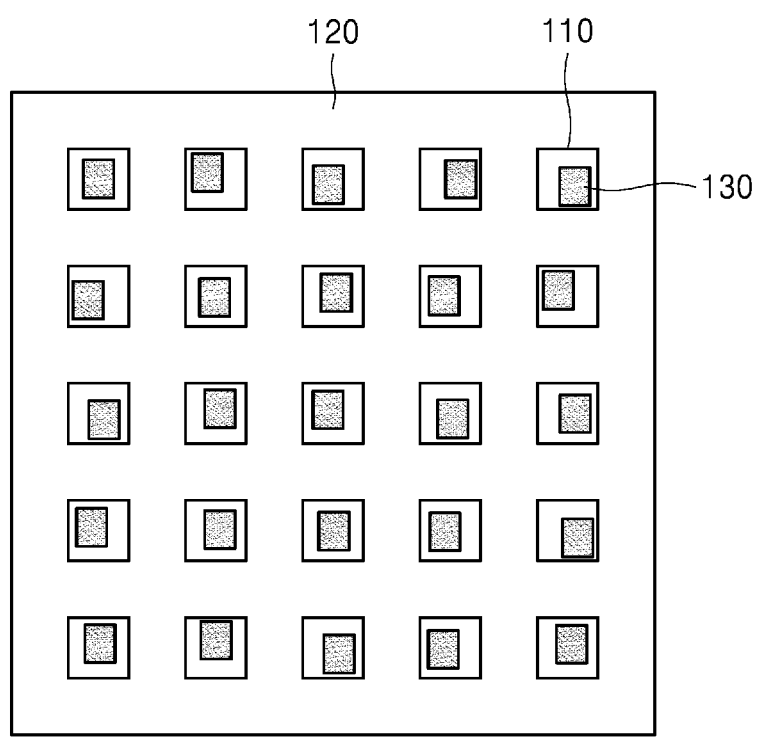
FIG. 52 is a plan view illustrating a display transfer structure according to an example embodiment.

FIG. 52 illustrates an example of a state in which the micro-semiconductor chips 130 are aligned on a transfer substrate. Referring to FIG. 52, according to a micro-semiconductor chip wet alignment method according to an example embodiment, the micro-semiconductor chips 130 may be irregularly and randomly aligned in the grooves 110 of the transfer substrate 120. According to the stamping method of the related art, positions where micro-semiconductor chips are disposed in grooves of a transfer substrate are regular, but according to the micro-semiconductor chip wet alignment method according to an example embodiment, positions where the micro-semiconductor chips 130 are aligned in the grooves 110 of the transfer substrate 120 may be irregular.

Meanwhile, after the transfer of the micro-semiconductor chips 130 is completed and the dummy micro-semiconductor chip 130D is removed, the transfer substrate 120 may be scanned at least once with the clean absorber 21, and thus the irregularity of the micro-semiconductor chips 130 which are irregularly aligned may be reduced.

Figure 53:
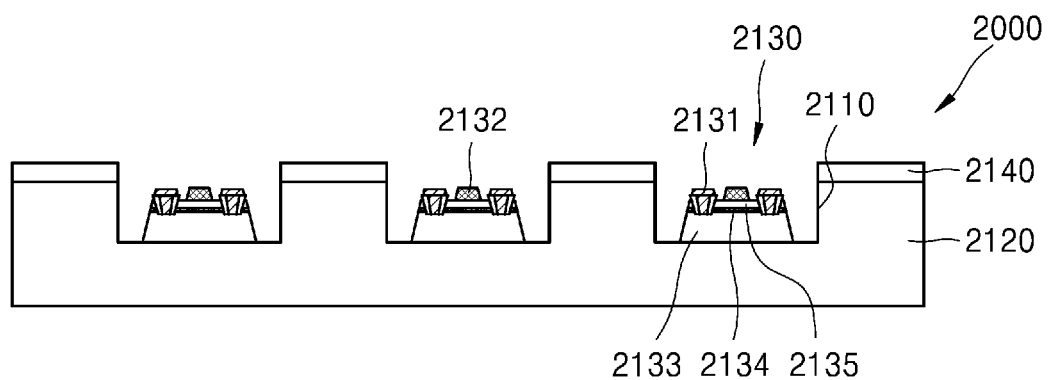
FIG. 53 is a cross-sectional view of a display transfer structure according to another example embodiment.

FIG. 53 schematically shows a display transfer structure 2000 according to an example embodiment.

The display transfer structure 2000 may include a transfer substrate 2120 including a plurality of grooves 2110 and at least one micro-semiconductor chip 2130 provided in the plurality of grooves 2110.

The micro-semiconductor chip 2130 may include at least one electrode on a surface facing upper openings of the plurality of grooves 2110. In addition, the micro-semiconductor chip 2130 does not include an electrode on a surface facing the bottom of the plurality of grooves 2110. The at least one electrode may include, for example, a first electrode 2131 and a second electrode 2132. The first electrode 2131 and the second electrode 2132 may be positioned toward the upper opening of the grooves 2110. The first electrode 2131 may be, for example, a negative electrode, and the second electrode 2132 may be a positive electrode.

The micro-semiconductor chip 2130 may include, for example, an n-type semiconductor layer 2133, an active layer 2134, and a p-type semiconductor layer 2135. The n-type semiconductor layer 2133 may be, for example, an n-type GaN layer, and the p-type semiconductor layer 2135 may be a p-type GaN layer. The active layer 2134 may have, for example, a quantum well structure or a multiple quantum well structure. However, the micro-semiconductor chip 2130 is not limited thereto.

A metal layer 2140 may be further provided on an upper surface of the transfer substrate 2120. The metal layer 2140 may include at least one of Ag, Au, Pt, Ni, Cr, or Al. The metal layer 2140 may allow the micro-semiconductor chip to be easily separated from the transfer substrate 2120 when removing the micro-semiconductor chip remaining on the transfer substrate 2120.

FIG. 53 illustrates an example in which the transfer substrate 2120 is formed as a single body, but various other configurations are possible. Various examples of the transfer substrate 2120 are the same as those described with reference to FIGS. 2 and 3A, and thus detailed descriptions thereof will be omitted.

Figure 54:
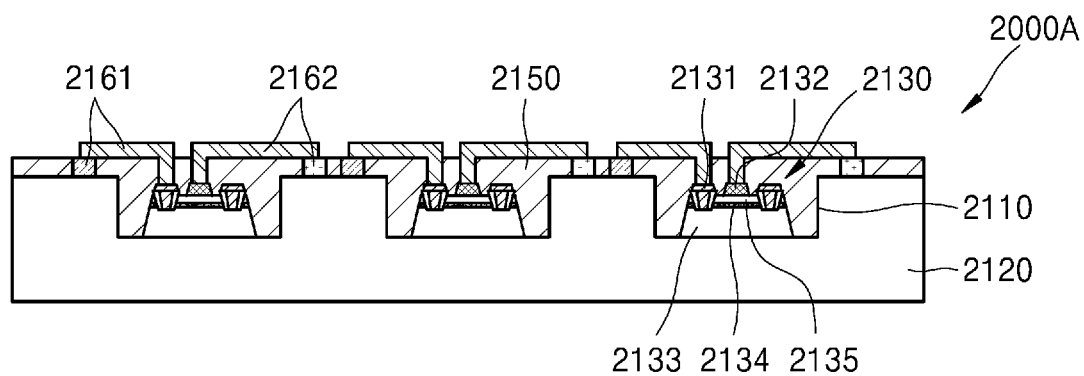
FIG. 54 is a cross-sectional view of a display transfer structure according to another example embodiment.

FIG. 54 illustrates an example in which the display transfer structure illustrated in FIG. 53 further includes another layer. Detailed descriptions of the same components as those of the display transfer structure 2000 shown in FIG. 53 will be omitted.

A display transfer structure 2000A may further include an insulating layer 2150 on the transfer substrate 2120. The insulating layer 2150 may include driving circuits 2161 and 2162 respectively connected to a first electrode 2131 and a second electrode 2132. FIG. 54 illustrates an example in which the driving circuits 2161 and 2162 are provided on an upper portion of the transfer substrate 2120, but the configuration of the driving circuits 2161 and 2162 are not limited thereto. The driving circuits 2161 and 2162 are provided in a lower portion of the transfer substrate 2120. When the driving circuits 2161 and 2162 are provided in the lower portion of the transfer substrate 2120, a structure connected to the first electrode 2131 and the second electrode 2132 of the micro-semiconductor chip 2130 may be changed.

In the display transfer structure 2000A, three micro-semiconductor chips 2130 may emit different color light. For example, the three micro-semiconductor chips 2130 may emit red light (R), green light (G), and blue light (B), respectively. In this case, the display transfer structure 2000A may be applied to an RGB self-luminous micro LED TV.

In the example embodiment, the display transfer structure 2000A may be employed in a display apparatus as it is. In this case, a micro LED display apparatus including the display transfer structure 2000A may be implemented. However, a micro-semiconductor chip may be transferred from the display transfer structure 2000A to another driving circuit board, and the driving circuit board may be employed in a display apparatus.

Figure 55:
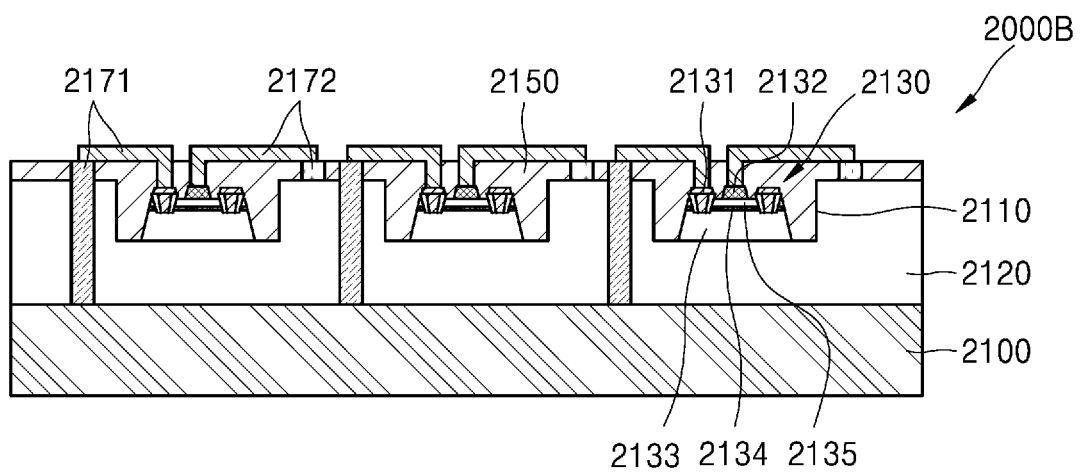
FIG. 55 is a cross-sectional view of a display transfer structure according to another example embodiment.

FIG. 55 illustrates an example in which the display transfer structure of FIG. 54 further includes a driving circuit board 2100.

In FIG. 55, components using the same reference numerals as those of FIG. 54 have substantially the same functions and configurations as those described in FIG. 54, and thus detailed descriptions thereof will be omitted.

In a display transfer structure 2000B illustrated according to an example embodiment in FIG. 55, the driving circuit board 2100 may be provided in a lower portion of the transfer substrate 2120. The driving circuit board 2100 may include, for example, at least one transistor and at least one capacitor. The at least one transistor may include, for example, a driving transistor and a switch transistor. The driving circuit board 2100 may include driving circuits 2171 and 2172 respectively connected to a first electrode 2131 and a second electrode 2132. For example, the driving circuit 2171 may be connected to the driving circuit board 2100.

Figure 56:
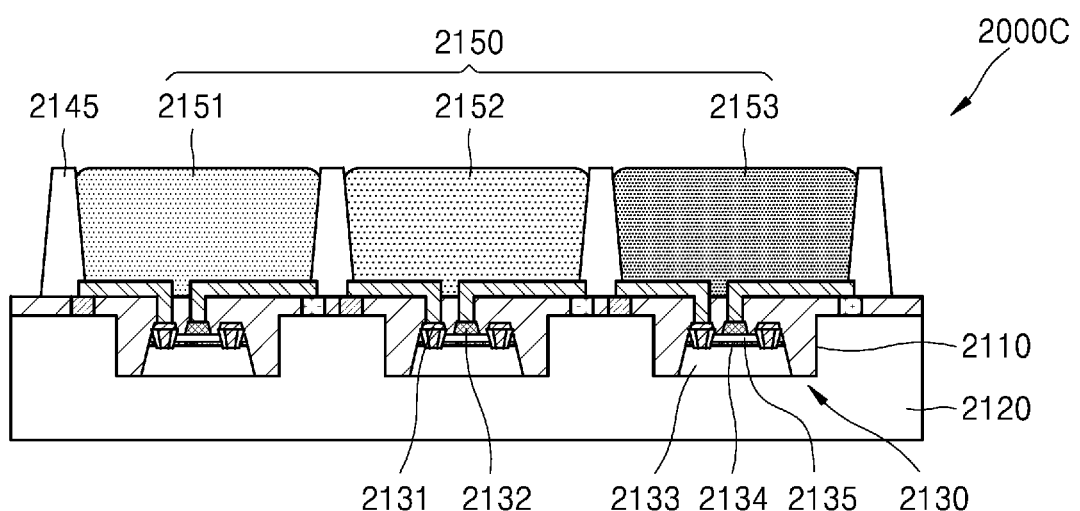
FIG. 56 shows an example in which the display transfer structure of FIG. 54 further includes a color conversion layer.

FIG. 56 shows an example in which the display transfer structure of FIG. 54 further includes a color conversion layer 2150. In FIG. 56, components using the same reference numerals as those of FIG. 54 have substantially the same functions and configurations as those described in FIG. 54, and thus detailed descriptions thereof will be omitted.

A display transfer structure 2000C may include partition walls 2145 provided on the insulating layer 2150 to be apart from each other, and a color conversion layer 2150 provided between the partition walls 2145. The color conversion layer 2150 may convert a color of the light emitted from the micro-semiconductor chip 2130. The micro-semiconductor chip 2130 may emit first color light, for example, blue light. However, it is only an example. The micro-semiconductor chip 2130 may emit light of other wavelength ranges that may excite the color conversion layer 2150.

The color conversion layer 2150 may include a first color conversion layer 2151 configured to convert the light from the micro-semiconductor chip 2130 into first color light, a second color conversion layer 2152 configured to convert the light from the micro-semiconductor chip 2130 into second color light, and a third color conversion layer 2153 configured to convert the light from the micro-semiconductor chip 2130 into third color light. The second color light may be, for example, green light, and the third color light may be, for example, red light.

The first color conversion layer 2151 may include, for example, a resin that transmits light from the micro-semiconductor chip 2130. The second color conversion layer 2152 may emit green light by blue light emitted from the micro-semiconductor chip 2130. The second color conversion layer 2152 may include quantum dots (QDs) of a predetermined size that are excited by blue light to emit green light. The QDs may have a core-shell structure including a core and a shell, and may also include a particle structure without a shell. The core-shell structure may include a single-shell or multi-shell. The multi-shell may be, for example, a double-shell.

The QDs may include, for example, at least one of Groups II-VI-based semiconductors, Groups III-V-based semiconductors, Groups IV-VI-based semiconductors, Groups IV-based semiconductors, and graphene QDs. The QDs may include, for example, at least one of Cd, Se, Zn, S, and InP, but are not limited thereto. Each QD may have a diameter equal to or less than dozens of nm, for example, a diameter equal to or less than 10 nm.

The second color conversion layer 2152 may include a phosphor excited by the blue light emitted from the micro-semiconductor chip 2130 and emitting the green light.

The third color conversion layer 2153 may emit red light by changing the blue light emitted from the micro-semiconductor chip 2130 into the red light. The third color conversion layer 2153 may include QDs having a predetermined size, the QDs being excited by the blue light and emitting the red light. Alternatively, the third color conversion layer 2153 may include a phosphor excited by the blue light emitted from the micro-semiconductor chip 2130 and emitting the red light. For example, a micro LED display apparatus including the display transfer structure 2000C according to the example embodiment may be implemented.

Figure 57:
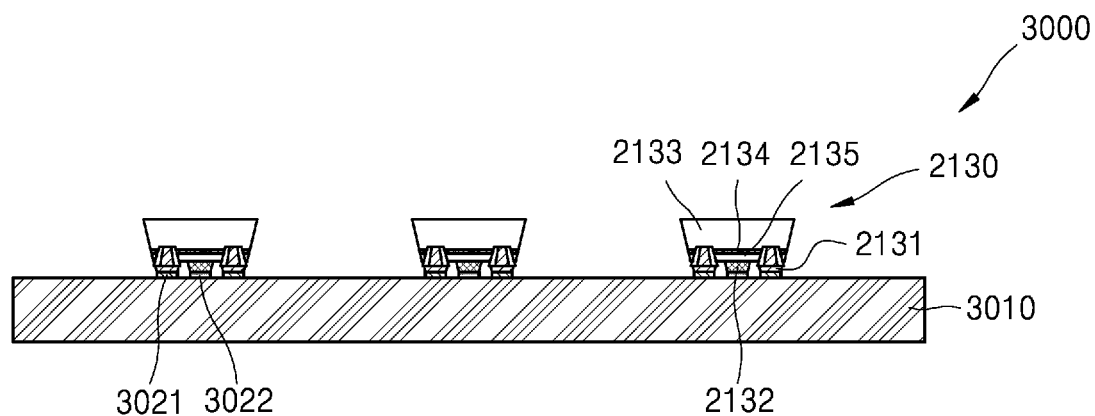
FIG. 57 is a cross-sectional view of a display transfer structure according to another example embodiment.

FIG. 57 illustrates a display transfer structure 3000 according to another example embodiment.

Referring to FIG. 57, the display transfer structure 3000 may include a driving circuit board 3010. The micro-semiconductor chip 2130 aligned on the transfer substrate 2120 illustrated in FIG. 53 may be transferred and bonded to the driving circuit board 3010. The driving circuit board 3010 may include a first circuit 3021 and a second circuit 3022. When the micro-semiconductor chip 2130 is transferred to the driving circuit board 3010, the first electrode 2131 may be connected to the first circuit 3021 and the second electrode 2132 may be connected to the second circuit 3022. The driving circuit board 3010 may include, for example, at least one transistor and at least one capacitor.

Figure 58:
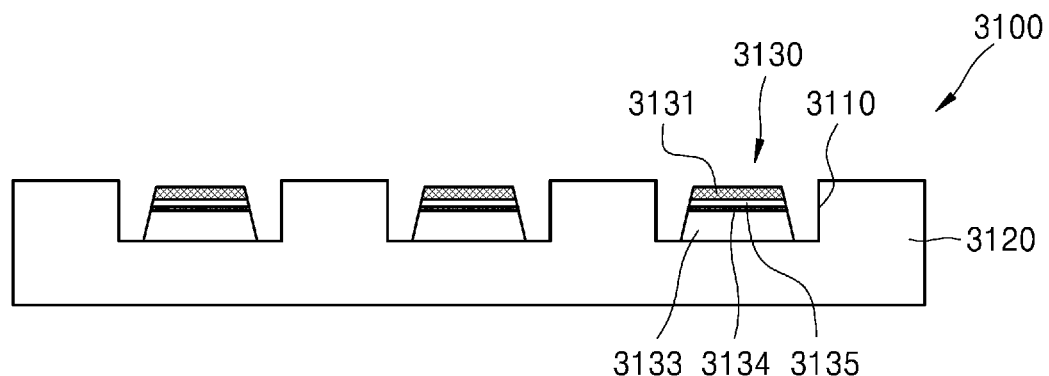
FIGS. 58 to 60 are cross-sectional views of display transfer structures according to another example embodiment.

FIG. 58 illustrates a display transfer structure 3100 according to another example embodiment.

The display transfer structure 3100 may include a transfer substrate 3120 including a plurality of grooves 3110 and a micro-semiconductor chip 3130 positioned in the plurality of grooves 3110. The micro-semiconductor chip 3130 may include at least one electrode 3131 on a surface facing upper openings of the plurality of grooves 3110. In addition, the micro-semiconductor chip 3130 does not include an electrode on a surface facing the bottom of the plurality of grooves 3110.

The at least one electrode 3131 may be, for example, a negative electrode. Alternatively, the at least one electrode 3131 may be, for example, a positive electrode. The at least one electrode 3131 may be positioned toward the upper opening of the groove 3110.

The micro-semiconductor chip 3130 may include, for example, an n-type semiconductor layer 3133, an active layer 3134, and a p-type semiconductor layer 3135. The n-type semiconductor layer 3133 may be, for example, an n-type GaN layer, and the p-type semiconductor layer 3135 may be a p-type GaN layer. The active layer 3134 may have, for example, a quantum well structure or a multiple quantum well structure. However, the micro-semiconductor chip 3130 is not limited thereto.

Figure 59:
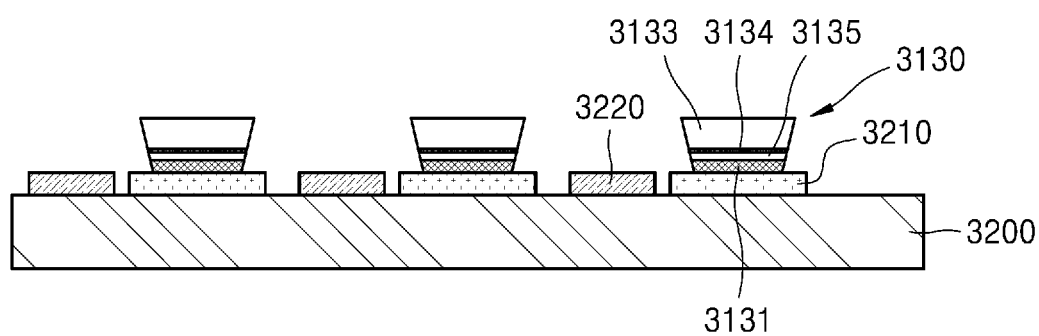

Referring to FIG. 59, the micro-semiconductor chip 3130 aligned on the transfer substrate 3120 illustrated in FIG. 58 may be transferred to a driving circuit board 3200. The driving circuit board 3200 may include a first circuit 3210 and a second circuit 3220. When the micro-semiconductor chip 3130 is transferred to the driving circuit board 3200, the first electrode 3131 may be connected to the first circuit 3210.

Figure 60:
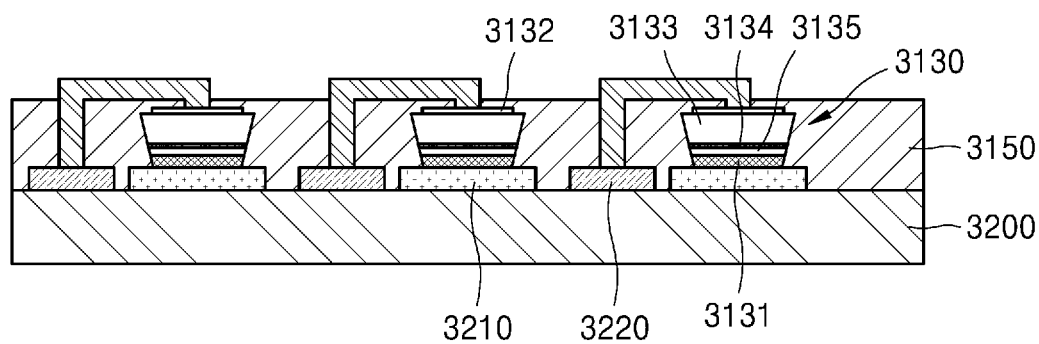

Referring to FIG. 60, an insulating layer 3150 may be provided on a structure shown in FIG. 59. In addition, the insulating layer 3150 may be patterned to form a second electrode 3132 on the micro-semiconductor chip 3130. In addition, the second electrode 3132 and the second circuit 3220 may be connected.

Meanwhile, in the display transfer structure according to an example embodiment, one groove may be provided in a region corresponding to one pixel on a transfer substrate, or a plurality of grooves may be provided in the region corresponding to one pixel.

Figure 61:
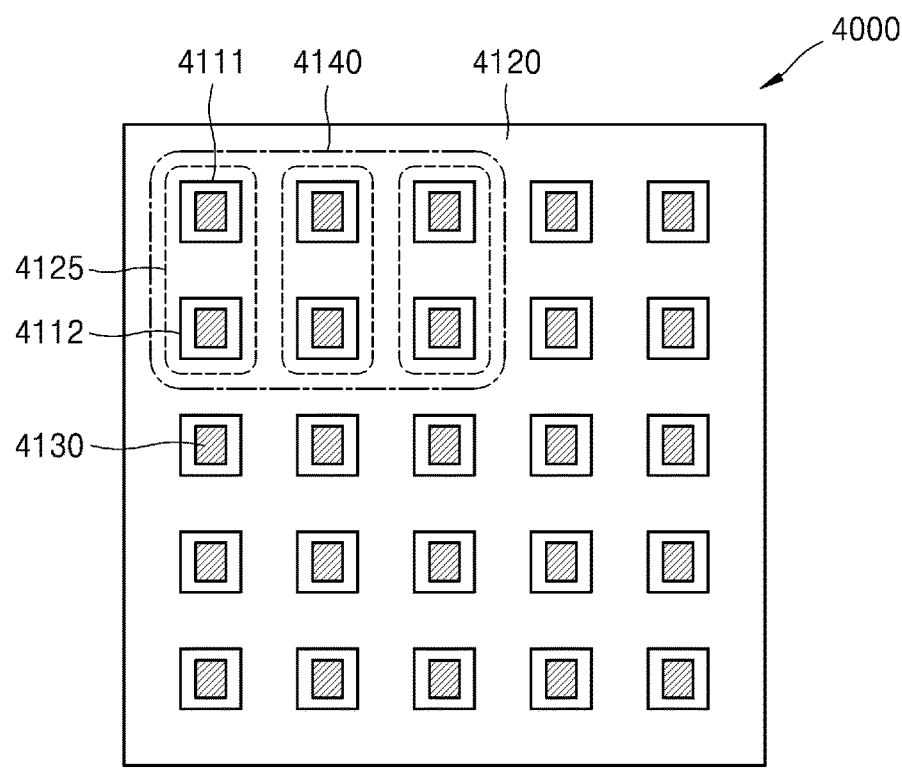
FIGS. 61 to 65 are diagrams illustrating alignment structures of various micro-semiconductor chips of a display transfer structure according to an example embodiment.

FIG. 61 illustrates a display transfer structure 4000 according to another example embodiment.

The display transfer structure 4000 may include a transfer substrate 4120 including a plurality of grooves and micro-semiconductor chips 4130 respectively provided in the plurality of grooves. In the example embodiment, the transfer substrate 4120 may include a plurality of regions 4125 respectively corresponding to sub-pixels, and may respectively include a plurality of grooves in the plurality of regions 4125. A pixel may represent a basic unit for displaying a color in a display apparatus. Reference numeral 4140 denotes a region corresponding to a pixel. For example, one pixel may include a first color light, a second color light, and a third color light. For example, the first color light may include red light, the second color light may include green light, and the third color light may include blue light. The pixel may include a plurality of sub-pixels emitting each color light. For example, the pixel may include a first sub-pixel that emits the first color light, a second sub-pixel that emits the second color light, and a third sub-pixel that emits the third color light. A region 4125 corresponding to each sub-pixel may include one or more micro-semiconductor chips 4130.

For example, each of the plurality of regions 4125 may include a first groove 4111 and a second groove 4112. The micro-semiconductor chip 4130 may be provided in each of the first groove 4111 and the second groove 4112. However, the micro-semiconductor chip 413 may be missing from the region 4125 corresponding to each sub-pixel. For example, the micro-semiconductor chip 4130 may be provided in the first groove 4111 and the micro-semiconductor chip 4130 may be missing from the second groove 4112. In this case, because the micro-semiconductor chip 4130 is provided in the first groove 4111, there is no problem in a pixel operation.

As described above, when the plurality of grooves 4111 and 4112 are provided in the region 4125 corresponding to each sub-pixel, even if the micro-semiconductor chip 4130 is missing from any one of the plurality of grooves 4111 and 4112, the micro-semiconductor chip 4130 may be provided in the remaining groove, and thus an error rate may be reduced, and a repair process may be omitted.

For example, the micro-semiconductor chip 4130 may have a size equal to or less than 200 µm. Here, the size may indicate the maximum diameter of a cross-section of the micro-semiconductor chip 4130. The cross-section may indicate a cross-section perpendicular to a direction in which light from the micro-semiconductor chip 4130 is emitted. The micro-semiconductor chip 4130 may have various shapes such as a triangular cross-section, a square cross-section, a circular cross-section, etc. The grooves 4111 and 4112 may have, for example, a size by which the micro-semiconductor chip 4130 may be accommodated, and may have a size corresponding to the number of micro-semiconductor chips 4130, if necessary. The grooves 4111 and 4112 may have various shapes such as a triangular cross-section, a square cross-section, a circular cross-section, etc.

Figure 62:
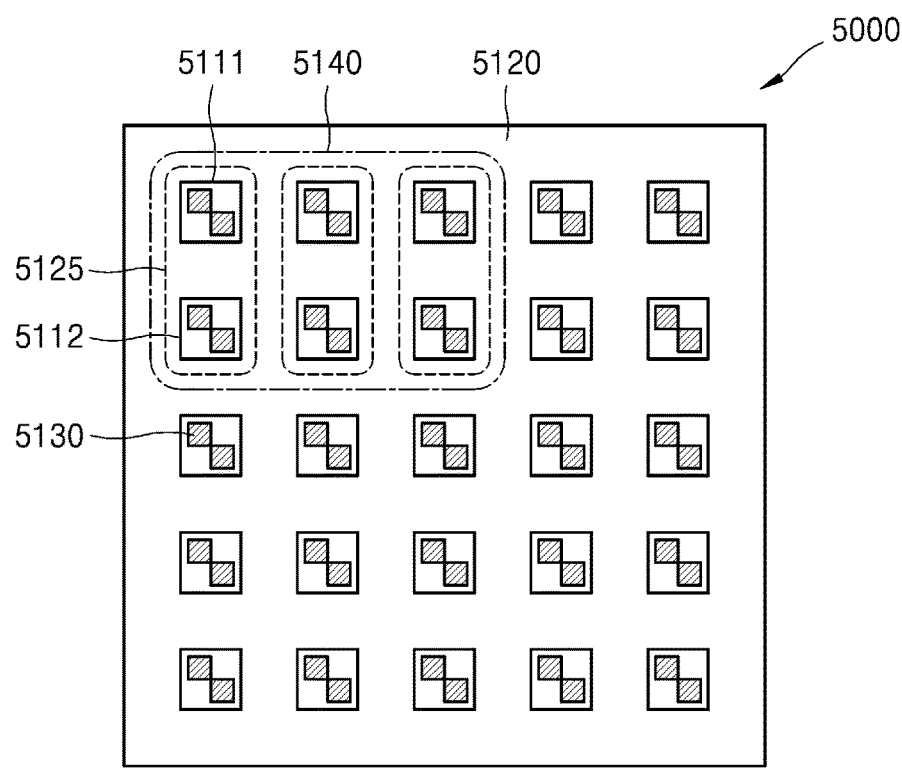

FIG. 62 illustrates a display transfer structure 5000 according to another example embodiment.

The display transfer structure 5000 may include a transfer substrate 5120 including a plurality of grooves, and micro-semiconductor chips 5130 respectively provided in the plurality of grooves. In the example embodiment, the transfer substrate 5120 may include a plurality of regions 5125 corresponding to the sub-pixels, and may include a plurality of grooves 5111 and 5112, respectively, in the plurality of regions 5125.

The plurality of grooves 5111 and 5112 may have a size by which the plurality of micro-semiconductor chips 5130 may be accommodated. Here, the size may indicated a cross-sectional area of a groove.

For example, a first groove 5111 and a second groove 5112 may be included in each of the plurality of regions 5125. The first groove 5111 and the second groove 5112 may have a size by which the two or more micro-semiconductor chips 5130 may be accommodated. For example, the two micro-semiconductor chips 5130 may be accommodated in the first groove 5111 and the two micro-semiconductor chips 5130 may be accommodated in the second groove 5112. As described above, a possibility of defect with respect to each pixel due to missing of a micro-semiconductor chip may be reduced, and a repair process may be omitted. Reference numeral 5140 denotes a region corresponding to a pixel.

Figure 63:
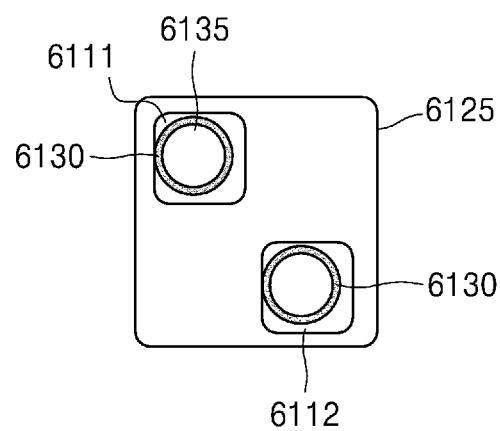
Figure 64:
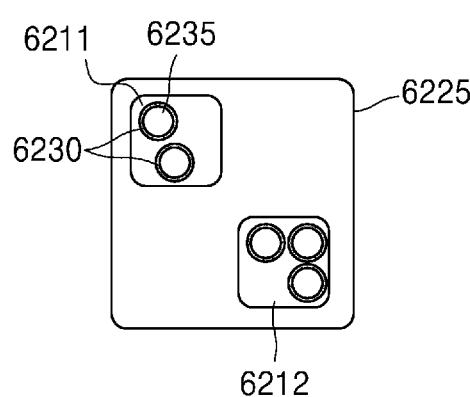
Figure 65:
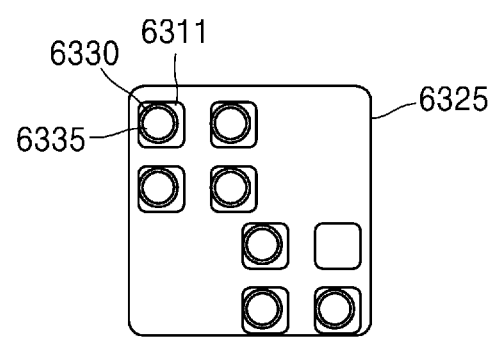

FIGS. 63 to 65 are enlarged views illustrating various examples in which micro-semiconductor chips are aligned in a region corresponding to one sub-pixel on a transfer substrate.

Referring to FIG. 63, first and second grooves 6111 and 6112 may be provided in a region 6125 corresponding to a sub-pixel, and a micro-semiconductor chip 6130 may be provided in each of the first and second grooves 6111 and 6112. The micro-semiconductor chip 6130 may have a circular cross-section, and at least one electrode 6135 may be positioned toward upper openings of the first and second grooves 6111 and 6112.

In the example embodiment, the first and second grooves 6111 and 6112 may be disposed in the region 6125 in a diagonal direction. When the first and second grooves 6111 and 6112 are arranged in the diagonal direction, a probability of missing of the micro-semiconductor chip 6130 may be reduced when the micro-semiconductor chips 6130 are aligned, compared to a case where the first and second 6111 and 6112 are arranged in a line.

Referring to FIG. 64, first and second grooves 6211 and 6212 may be provided in a region 6225 corresponding to a sub-pixel, and a plurality of micro-semiconductor chips 6230 may be provided in each of the first and second grooves 6211 and 6212. The first and second grooves 6211 and 6212 may have a size by which the plurality of micro-semiconductor chips 6230 may be accommodated. At least one electrode 6235 may be positioned toward upper openings of the first and second grooves 6211 and 6212. Here, the first and second grooves 6211 and 6212 may be disposed in a region 6225 in a diagonal direction. However, positions of the first and second grooves 6211 and 6212 are not limited thereto and may be variously modified.

Referring to FIG. 65, eight grooves 6311 may be provided in a region 6325 corresponding to a sub-pixel. A micro-semiconductor chip 6330 may be provided in each of the eight grooves 6311. At least one electrode 6335 may be positioned toward an upper opening of each groove 6311. As described above, when the number of grooves 6311 included in the region 6325 corresponding to a sub-pixel is increased, even when a micro-semiconductor chip is missing from one or more grooves, a pixel operation may not be affected, and thus, a defect rate of the pixel may be reduced and a repair process may be reduced.

Figure 66:
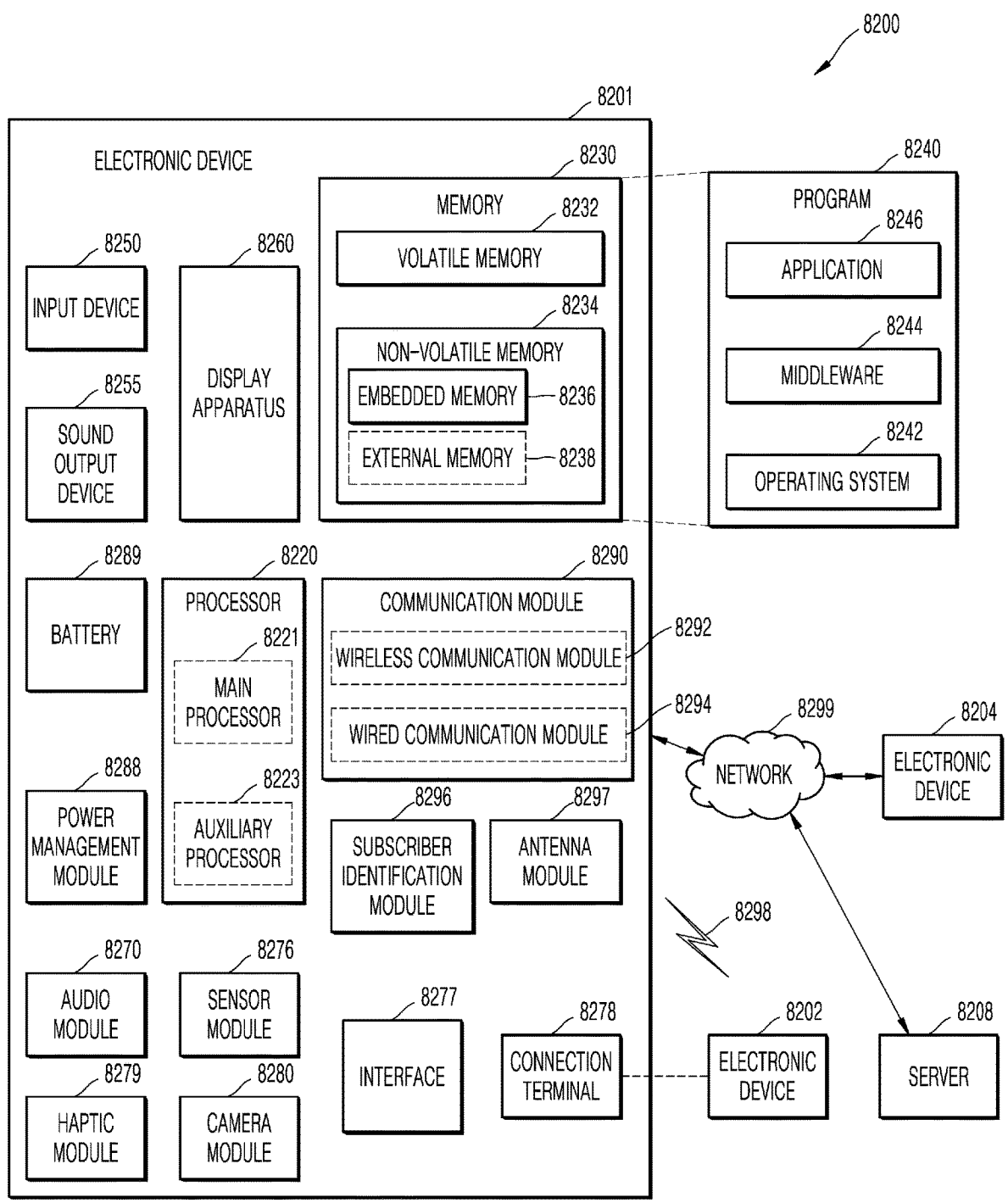
FIG. 66 is a schematic block diagram of an electronic device according to an example embodiment.

FIG. 66 is a block diagram of an electronic device 8201 including a display apparatus 8260 according to an example embodiment.

Referring to FIG. 66, the electronic device 8201 may be provided in a network environment 8200. In the network environment 8200, the electronic device 8201 may communicate with another electronic device 8202 through a first network 8298 (a short-range wireless communication network, etc.) or communicate with another electronic device 8204 and/or a server 8208 through a second network 8299 (a remote wireless communication network, etc.). The electronic device 8201 may communicate with the electronic device 8204 through the server 8208. The electronic device 8201 may include a processor 8220, a memory 8230, an input device 8250, a sound output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. The electronic device 8201 may omit one or more of the components or may further include other components. One or more of the components may be implemented as an integrated circuit. For example, the sensor module 8276 (a fingerprint sensor, an iris sensor, an illumination sensor, etc.) may be embedded in the display apparatus 8269 (a display, etc.).

The processor 8220 may be configured to execute software (a program 8240, etc.) to control one or more components (hardware or software components) of the electronic device 8201, the components being connected to the processor 8220, and to perform various data processing or calculations. As part of the data processing or calculations, the processor 8220 may be configured to load a command and/or data received from other components (the sensor module 8276, the communication module 8290, etc.) into the volatile memory 8232, process the command and/or the data stored in a volatile memory 8232, and store resultant data in a nonvolatile memory 8234. The processor 8220 may include a main processor 8221 (a central processing unit (CPU), an application processor (AP), etc.) and an auxiliary processor 8223 (a graphics processing unit (GPU), an image signal processor, a sensor hub processor, a communication processor, etc.) which may independently operate or operate with the main processor 8221. The auxiliary processor 8223 may use less power than the main processor 821 and may perform specialized functions.

When the main processor 8221 is in an inactive state (a sleep state), the auxiliary processor 8223 may take charge of an operation of controlling functions and/or states related to one or more components (the display apparatus 8260, the sensor module 8276, the communication module 8290, etc.) from among the components of the electronic device 8201, or when the main processor 8221 is in an active state (an application execution state), the auxiliary processor 8223 may perform the same operation along with the main processor 8221. The auxiliary processor 8223 (the image signal processor, the communication processor, etc.) may be realized as part of other functionally-related components (the camera module 8280, the communication module 8290, etc.).

The memory 2230 may store various data required by the components (the processor 8220, the sensor module 8276, etc.) of the electronic device 8201. The data may include, for example, software (the program 8240, etc.), input data and/or output data of a command related to the software. The memory 8230 may include the volatile memory 8232 and/or the nonvolatile memory 8234.

The program 8240 may be stored in the memory 8230 as software, and may include an operating system 8242, middleware 8244, and/or an application 8246.

The input device 8250 may receive a command and/or data to be used by the components (the processor 8220, etc.) of the electronic device 8201 from the outside of the electronic device 8201. The input device 8250 may include a remote controller, a microphone, a mouse, a keyboard, and/or a digital pen (a stylus pen, etc.).

The sound output device 8255 may output a sound signal to the outside of the electronic device 8201. The sound output device 8255 may include a speaker and/or a receiver. The speaker may be used for a general purpose, such as multimedia playing or recording playing, and the receiver may be used to receive an incoming call. The receiver may be coupled to the speaker as part of the speaker or may be realized as a separate device.

The display apparatus 8260 may visually provide information to the outside of the electronic device 8201. The display apparatus 8260 may include a display, a hologram device, or a controlling circuit for controlling a projector and a corresponding device. The display apparatus 8260 may be manufactured using the manufacturing method and the semiconductor chip wet alignment apparatus described with reference to FIGS. 1 to 51, and the display apparatus 8260 may include the display transfer structures described with reference to FIGS. 52 to 60. The display apparatus 8260 may include touch circuitry configured to sense a touch operation and/or sensor circuitry (a pressure sensor, etc.) configured to measure an intensity of a force generated by the touch operation.

The audio module 8270 may convert sound into an electrical signal or an electrical signal into sound. The audio module 8270 may obtain sound via the input device 8250 or may output sound via the sound output device 8255 and/or a speaker and/or a headphone of an electronic device (the electronic device 8202, etc.) directly or wirelessly connected to the electronic device 8201.

The sensor module 8276 may sense an operation state (power, temperature, etc.) of the electronic device 8201 or an external environmental state (a user state, etc.) and generate electrical signals and/or data values corresponding to the sensed state. The sensor module 8276 may include a gesture sensor, a gyro-sensor, an atmospheric sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 8277 may support one or more designated protocols to be used for the electronic device 8201 to be directly or wirelessly connected to another electronic device (the electronic device 8202, etc.). The interface 8277 may include a high-definition multimedia interface (HDMI) interface, a universal serial bus (USB) interface, an SD card interface, and/or an audio interface.

A connection terminal 8278 may include a connector, through which the electronic device 8201 may be physically connected to another electronic device (the electronic device 8202, etc.). The connection terminal 8278 may include an HDMI connector, a USB connector, an SD card connector, and/or an audio connector (a headphone connector, etc.).

A haptic module 8279 may convert an electrical signal into a mechanical stimulus (vibration, motion, etc.) or an electrical stimulus which is recognizable to a user via haptic or motion sensation. The haptic module 8279 may include a motor, a piezoelectric device, and/or an electrical stimulus device.

The camera module 8280 may capture a still image and a video. The camera module 8280 may include a lens assembly including one or more lenses, image sensors, image signal processors, and/or flashes. The lens assemblies included in the camera module 8280 may collect light emitted from an object, an image of which is to be captured.

The power management module 8288 may manage power supplied to the electronic device 8201. The power management module 8388 may be realized as part of a power management integrated circuit (PMIC).

The battery 8289 may supply power to the components of the electronic device 8201. The battery 8289 may include a non-rechargeable primary battery, rechargeable secondary battery, and/or a fuel battery.

The communication module 8290 may support establishment of direct (wired) communication channels and/or wireless communication channels between the electronic device 8201 and other electronic devices (the electronic device 8202, the electronic device 8204, the server 8208, etc.) and communication performance through the established communication channels. The communication module 8290 may include one or more communication processors separately operating from the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module, and/or a wired communication module 8294 (a local area network (LAN) communication module, a power line communication module, etc.). From these communication modules, a corresponding communication module may communicate with other electronic devices through a first network 8298 (a short-range wireless communication network, such as Bluetooth, Wifi direct, or infrared data association (IrDa)) or a second network 8299 (a remote communication network, such as a cellular network, the Internet, or a computer network (LAN, WAN, etc.)). Various types of communication modules described above may be integrated as a single component (a single chip, etc.) or realized as a plurality of components (a plurality of chips). The wireless communication module 8292 may identify and authenticate the electronic device 8201 within the first network 8298 and/or the second network 8299 by using subscriber information (international mobile subscriber identification (IMSI), etc.) stored in the subscriber identification module 8296.

The antenna module 8297 may transmit a signal and/or power to the outside (other electronic devices, etc.) or receive the same from the outside. The antenna may include an emitter including a conductive pattern formed on a substrate (a printed circuit board (PCB), etc.). The antenna module 8297 may include an antenna or a plurality of antennas. When the antenna module 8297 includes a plurality of antennas, an appropriate antenna which is suitable for a communication method used in the communication networks, such as the first network 8298 and/or the second network 8299, may be selected. Through the selected antenna, signals and/or power may be transmitted or received between the communication module 8290 and other electronic devices. In addition to the antenna, another component (a radio frequency integrated circuit (RFIC), etc.) may be included in the antenna module 8297.

One or more of the components of the electronic device 8201 may be connected to one another and exchange signals (commands, data, etc.) with one another, through communication methods performed among peripheral devices (a bus, general purpose input and output (GPIO), a serial peripheral interface (SPI), a mobile industry processor interface (MIPI), etc.).

The command or the data may be transmitted or received between the electronic device 8201 and another external electronic device 8204 through the server 8108 connected to the second network 8299. Other electronic devices 8202 and 8204 may be electronic devices that are homogeneous or heterogeneous types with respect to the electronic device 8201. All or part of operations performed in the electronic device 8201 may be performed by one or more of the other electronic devices 8202, 8204, and 8208. For example, when the electronic device 8201 has to perform a function or a service, instead of directly performing the function or the service, the one or more other electronic devices may be requested to perform part or all of the function or the service. The one or more other electronic devices receiving the request may perform an additional function or service related to the request and may transmit a result of the execution to the electronic device 8201. To this end, cloud computing, distribution computing, and/or client-server computing techniques may be used.

Figure 67:
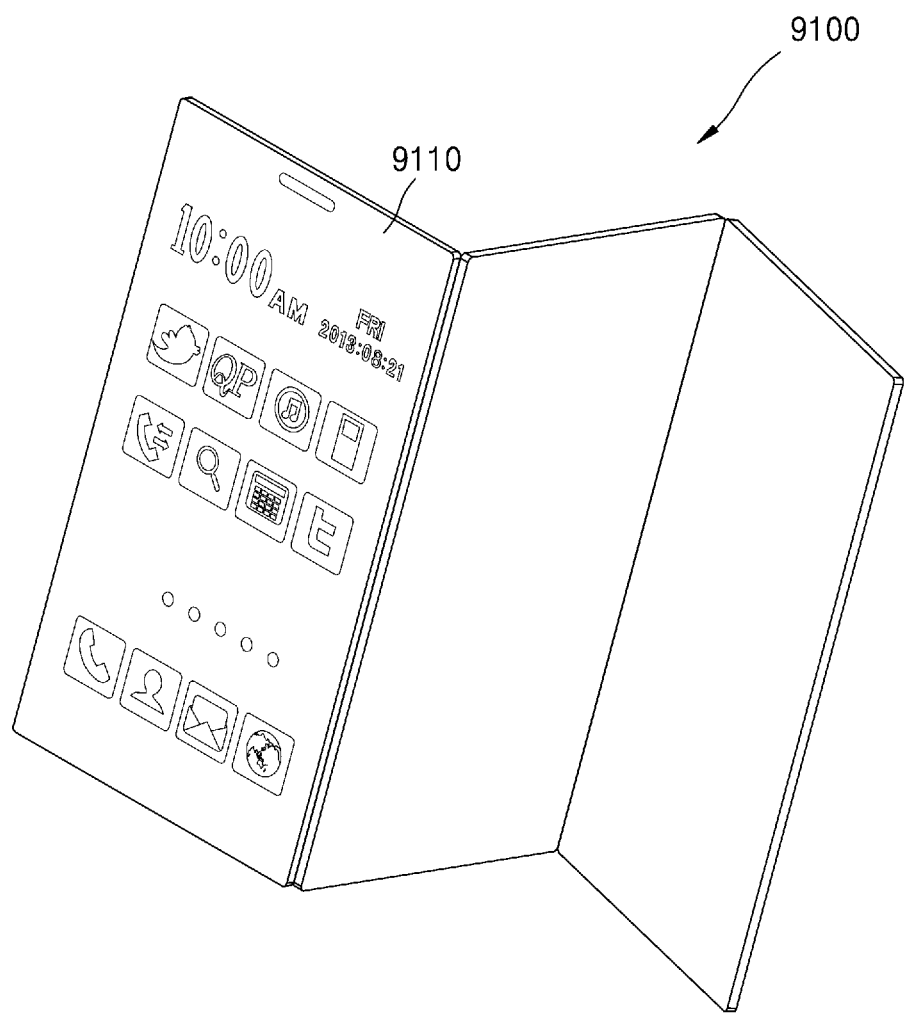
FIG. 67 illustrates an example in which an electronic device according to an example embodiment is applied to a mobile device.

FIG. 67 illustrates an example in which an electronic device according to an example embodiment is applied to a mobile device 9100. The mobile device 9100 may include the display apparatus 9110 according to an example embodiment. The display apparatus 9110 may include the display transfer structures described with reference to FIGS. 52 to 66. The display apparatus 9110 may have a foldable structure, and may be applied to, for example, a multi-folder display. Here, the display apparatus 9110 is illustrated as a folder type display, but may be applied to a general flat panel display.

Figure 68:
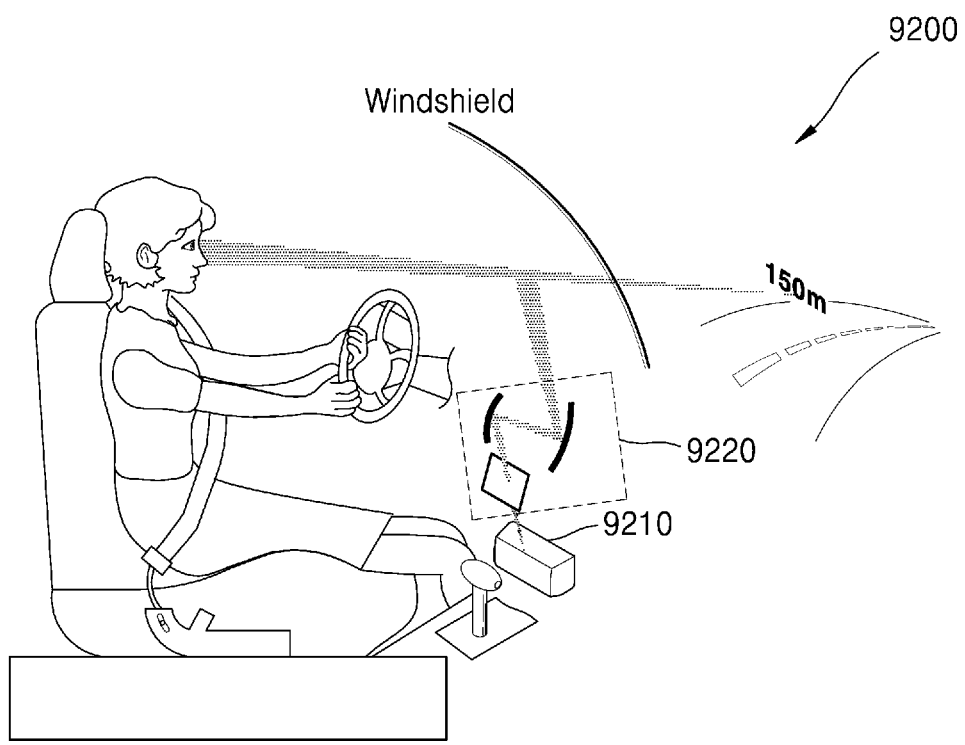
FIG. 68 illustrates an example in which a display apparatus according to an example embodiment is applied to a vehicle.

FIG. 68 illustrates an example in which a display apparatus according to an example embodiment is applied to a vehicle. The display apparatus may correspond to a head up display apparatus 9200 for vehicle. The head-up display apparatus 9200 may include a display 9210 provided in a region of the vehicle and an optical path-change member 9220 configured to convert an optical path for a driver to watch an image generated by the display 9210.

Figure 69:
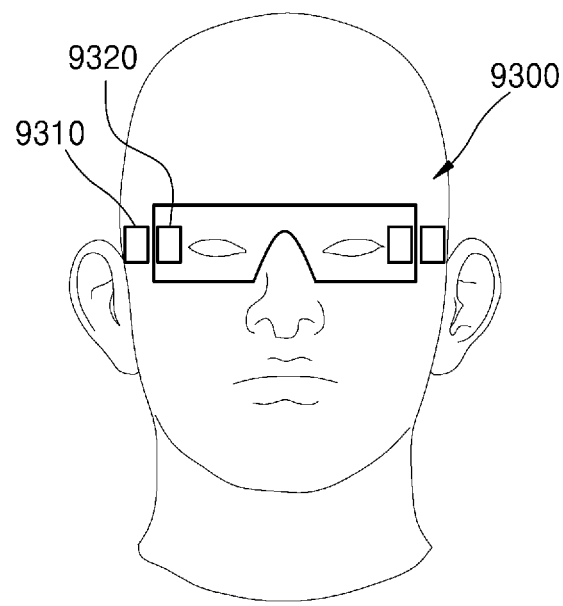
FIG. 69 illustrates an example in which a display apparatus according to an example embodiment is applied to augmented reality (AR) glasses or virtual reality (VR) glasses.

FIG. 69 illustrates an example in which a display apparatus according to an example embodiment is applied to augmented reality (AR) glasses 9300 or virtual reality (VR) glasses. The AR glasses 9300 may include a projection system 9310 configured to form an image and a component 9320 configured to guide an image from the projection system 9310 to the eye of a user. The projection system 9310 may include the display transfer structures described with reference to FIGS. 52 through 66.

Figure 70:
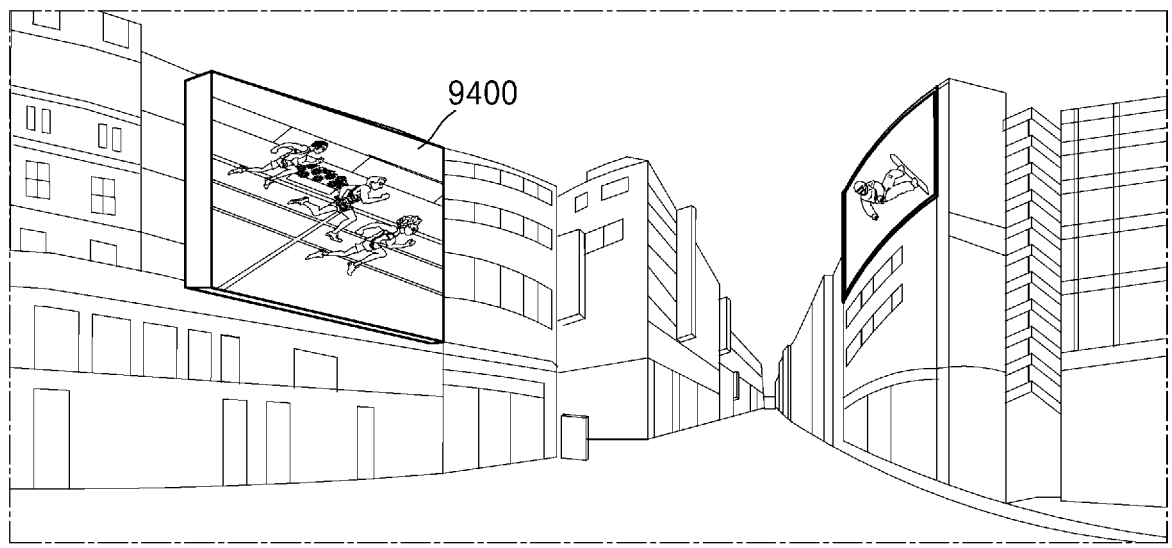
FIG. 70 is a diagram illustrating an example in which a display apparatus according to an example embodiment is applied to large signage.
Figure 71:
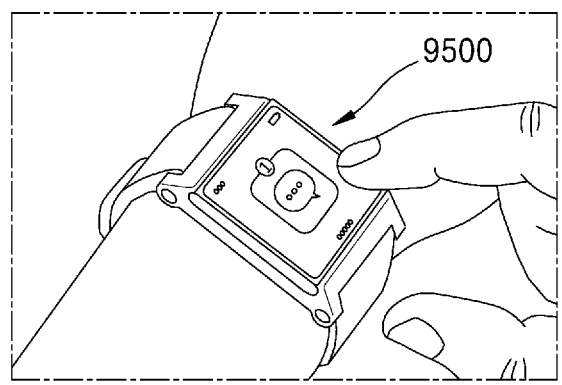
FIG. 71 is a diagram illustrating an example in which a display apparatus according to an example embodiment is applied to a wearable display.

FIG. 70 is a diagram illustrating an example in which a display apparatus according to an example embodiment is applied to a large signage 9400. The signage 9400 may be used for outdoor advertisement using a digital information display, and may control advertisement content and the like through a communication network. The signage 9400 may be implemented, for example, through the electronic device 8200 described with reference to FIG. 66.

FIG. 70 is a diagram illustrating an example in which a display apparatus according to an example embodiment is applied to a wearable display 9500. The wearable display 9500 may include the display transfer structures described with reference to FIGS. 52 to 66, and may be implemented through the electronic device 8200 described with reference to FIG. 66.

Also, the display apparatus according to an example embodiment may be applied to various devices, such as a rollable TV, a stretchable display, etc.

The example embodiments described above are only examples. One of ordinary skill in the art may understand that various modifications and equivalent example embodiments are possible based on the example embodiments. Thus, the true technical protection range according to the example embodiments shall be defined by the technical concept of the disclosure stated in the claims below.

The micro-semiconductor chip wet alignment apparatus according to an example embodiment may efficiently align the micro-semiconductor chips to a large area using a wet method. The micro-semiconductor chip wet alignment apparatus may quickly transfer the micro-semiconductor chips to the large area, and thus the micro-semiconductor chip wet alignment apparatus may be applied to a large display apparatus, and the cost of transferring the micro-semiconductor chips to the large area may be reduced, and thus the unit cost of the display apparatus may be reduced.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A micro-semiconductor chip wet alignment apparatus comprising:
   a semiconductor chip wet supply module configured to supply a plurality of micro-semiconductor chips and a liquid onto a transfer substrate so that the plurality of micro-semiconductor chips are movable along with the liquid on the transfer substrate; and
   a chip alignment module comprising an absorber configured to:
      contact a surface of the transfer substrate and move along the surface of the transfer substrate to align the plurality of micro-semiconductor chips in a plurality of grooves of the transfer substrate, and
      absorb the liquid on the transfer substrate while in contact with the surface of the transfer substrate,
   wherein the absorber comprises a porous material configured to absorb and retain the liquid from the transfer substrate.

2. The micro-semiconductor chip wet alignment apparatus of claim 1, wherein the liquid supplied onto the transfer substrate by the semiconductor chip wet supply module has a convex upper surface.

3. The micro-semiconductor chip wet alignment apparatus of claim 2, wherein a first height of the liquid at an edge of the transfer substrate is lower than a second height of the liquid at a center of the transfer substrate.

4. The micro-semiconductor chip wet alignment apparatus of claim 1, wherein the absorber is further configured to contact the transfer substrate as the absorber moves along the surface of the transfer substrate to pass through the plurality of grooves.

5. The micro-semiconductor chip wet alignment apparatus of claim 4, wherein as the absorber moves along the surface of the transfer substrate, a first amount of the liquid present in a first region of the transfer substrate through which the absorber has passed and a second amount of the liquid present in a second region of the transfer substrate before the absorber passes through are different.

6. The micro-semiconductor chip wet alignment apparatus of claim 1, wherein the semiconductor chip wet supply module comprises:
   a liquid supply module configured to supply the liquid; and
   a chip supply module configured to supply the plurality of micro-semiconductor chips.

7. The micro-semiconductor chip wet alignment apparatus of claim 6, wherein the chip supply module is configured to supply a suspension comprising the plurality of micro-semiconductor chips and the liquid.

8. The micro-semiconductor chip wet alignment apparatus of claim 7, wherein the liquid supplied by the liquid supply module and the liquid supplied by the chip supply module are a same material.

9. The micro-semiconductor chip wet alignment apparatus of claim 7, wherein the chip supply module is further configured to cause the suspension to flow so that the plurality of micro-semiconductor chips are dispersed from the suspension.

10. The micro-semiconductor chip wet alignment apparatus of claim 1, further comprising:
    an inspection module configured to inspect a state of the transfer substrate.

11. The micro-semiconductor chip wet alignment apparatus of claim 10, further comprising:
    a controller configured to control operations of the semiconductor chip wet supply module and the chip alignment module based on a result of the inspection by the inspection module.

12. The micro-semiconductor chip wet alignment apparatus of claim 1, further comprising:
    a cleaning module configured to remove a dummy micro-semiconductor chip remaining on the surface of the transfer substrate.

13. The micro-semiconductor chip wet alignment apparatus of claim 12, wherein the cleaning module comprises a second liquid supply module configured to supply another liquid onto the transfer substrate, and a pressurization module configured to contact and press the transfer substrate and move along the surface of the transfer substrate.

14. The micro-semiconductor chip wet alignment apparatus of claim 13, wherein a first pressure applied by the pressurization module to the transfer substrate is greater than a second pressure applied by the absorber to the transfer substrate.

15. The micro-semiconductor chip wet alignment apparatus of claim 1, further comprising:
    a recovery module configured to recover one or more of the plurality of micro-semiconductor chips separated from the transfer substrate.

16. The micro-semiconductor chip wet alignment apparatus of claim 1, further comprising:
    an antistatic module configured to supply ions onto the transfer substrate to reduce static electricity.

17. The micro-semiconductor chip wet alignment apparatus of claim 1, wherein the chip alignment module comprises a plurality of absorbers arranged along a movement direction of the absorber and the transfer substrate.

18. The micro-semiconductor chip wet alignment apparatus of claim 1,
    wherein the semiconductor chip wet supply module comprises a plurality of semiconductor chip wet supply modules,
    wherein the chip alignment module comprises a plurality of chip alignment modules, and
    wherein the plurality of semiconductor chip wet supply modules and the plurality of chip alignment modules are configured to divide the transfer substrate into a plurality of regions and supply and align the plurality of micro-semiconductor chips.

19. The micro-semiconductor chip wet alignment apparatus of claim 1, wherein the transfer substrate is configured to transfer the plurality of micro-semiconductor chips onto another substrate.

20. The micro-semiconductor chip wet alignment apparatus of claim 19, wherein each of the transfer substrate and the other substrate comprises an alignment mark for aligning the transfer substrate and the other substrate.

21. The micro-semiconductor chip wet alignment apparatus of claim 1, wherein the chip alignment module comprises a support structure, and
    wherein the porous material is provided on the support structure.

22. The micro-semiconductor chip wet alignment apparatus of claim 1, wherein the absorber comprises a material having a plurality of mesh holes, each of the plurality of mesh holes having a size smaller than a size of each of the plurality of micro-semiconductor chips.

23. The micro-semiconductor chip wet alignment apparatus of claim 1, wherein the absorber comprises one of fabric, tissue, polyester fiber, paper or wiper.

24. A micro-semiconductor chip alignment apparatus comprising:
    a controller; and
    an aligner including a supporting plate and an absorber coupled to the supporting plate,
    wherein the controller is configured to control the aligner to move the absorber along a surface of a transfer substrate provided with a plurality of micro-semiconductor chips and a liquid,
    wherein the absorber is configured to:
        contact the surface of the transfer substrate,
        align the plurality of micro-semiconductor chips into a plurality of grooves in the transfer substrate, and
        absorb the liquid on the transfer substrate while in contact with the surface of the transfer substrate, and
    wherein the absorber comprises a porous material configured to absorb and retain the liquid from the transfer substrate.

25. The micro-semiconductor chip alignment apparatus of claim 24, wherein the absorber has a mesh type structure capable of absorbing the liquid.

26. The micro-semiconductor chip alignment apparatus of claim 24, wherein the absorber has a plurality of mesh holes, each of the plurality of mesh holes having a size smaller than a size of each of the plurality of micro-semiconductor chips.

27. The micro-semiconductor chip alignment apparatus of claim 24, wherein the absorber is further configured to, while contacting the surface of the transfer substrate, turn over a micro-semiconductor chip in a groove so that a first surface of the micro-semiconductor chip having liquid repellency is in an upward-facing posture.

* * * * *